US00RE39510E

(19) United States
(12) Reissued Patent
Agrawal et al.

(10) Patent Number: US RE39,510 E
(45) Date of Reissued Patent: Mar. 13, 2007

(54) FPGA INTEGRATED CIRCUIT HAVING EMBEDDED SRAM MEMORY BLOCKS WITH REGISTERED ADDRESS AND DATA INPUT SECTIONS

(75) Inventors: Om P. Agrawal, Los Altos, CA (US); Herman M. Chang, Cupertino, CA (US); Bradley A. Sharpe-Geisler, San Jose, CA (US); Bai Nguyen, San Jose, CA (US)

(73) Assignee: Lattice Semiconductor Corporation, Hillsboro, OR (US)

(21) Appl. No.: 10/392,751

(22) Filed: Mar. 20, 2003

Related U.S. Patent Documents

Reissue of:
(64) Patent No.: 6,211,695
Issued: Apr. 3, 2001
Appl. No.: 09/235,615
Filed: Jan. 21, 1999

(51) Int. Cl.
*G06F 7/38* (2006.01)
*H03K 19/177* (2006.01)

(52) U.S. Cl. ..... 326/40; 326/38
(58) Field of Classification Search ..... 326/40, 326/41, 38, 46, 47
See application file for complete search history.

(56) References Cited

U.S. PATENT DOCUMENTS 5,689,195 A * 11/1997 Cliff et al. ..... 326/41
5,744,980 A * 4/1998 McGowan et al. ..... 326/40
5,787,007 A * 7/1998 Bauer ..... 716/16
5,828,229 A * 10/1998 Cliff et al. ..... 326/40
6,127,843 A * 10/2000 Agrawal et al. ..... 326/40

FOREIGN PATENT DOCUMENTS

WO WO 98/10517 * 3/1998

* cited by examiner

*Primary Examiner*—Daniel D. Chang

(57) ABSTRACT

A field-programmable gate array device (FPGA) having plural rows and columns of logic function units (VGB's) further includes a plurality of embedded memory blocks, where each memory block is embedded in a corresponding row of logic function units. Each embedded memory block has a registered address port for capturing received address signals in response to further-received, address-validating clock signals. Interconnect resources are provided for conveying the address-validating clock signals to address-changing circuitry so that a next address can be generated safely in conjunction with the capturing by the registered address port of a previous address signal.

71 Claims, 16 Drawing Sheets

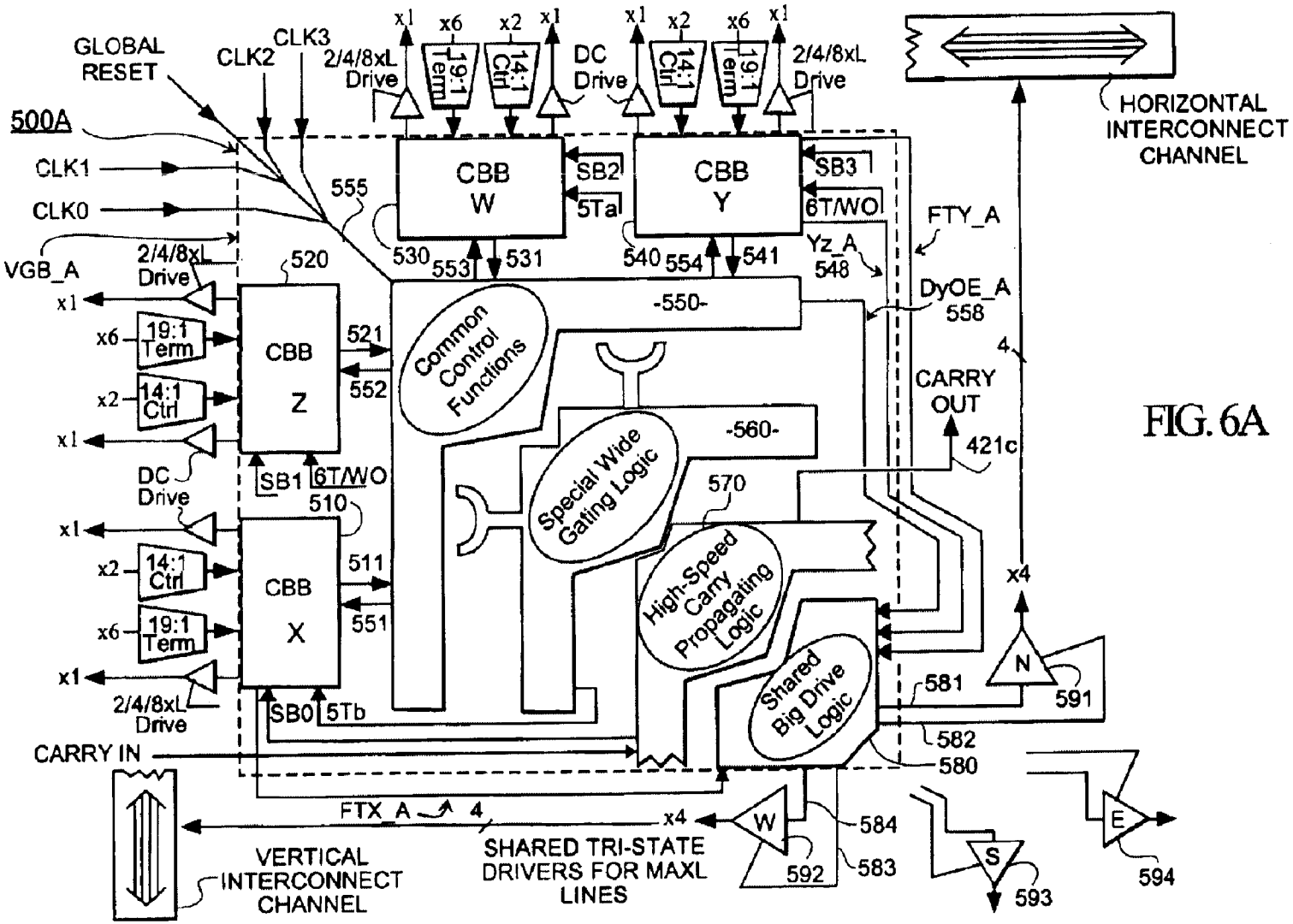
HORIZONTAL INTERCONNECT CHANNEL
FIG. 6A
FTY_A
DyOE_A
558
CARRY OUT
421c
x4
4
N
591
E
594
S
593
W
592
581
582
580
584
583
Shared Big Drive Logic
High-Speed Carry Propagating Logic
570
Special Wide Gating Logic
Common Control Functions
-550-
-560-
CBB Y
CBB W
CBB Z
CBB X
SB3
6T/WO
Yz_A
548
541
540
554
SB2
5Ta
531
530
553
555
521
552
520
510
511
551
SB1
SB0
5Tb
2/4/8xL Drive
19:1 Term
14:1 Ctrl
DC Drive
x1
x2
x6
CLK3
CLK2
CLK1
CLK0
GLOBAL RESET
500A
VGB_A
FTX_A
SHARED TRI-STATE DRIVERS FOR MAXL LINES
VERTICAL INTERCONNECT CHANNEL
CARRY IN

FPGA INTEGRATED CIRCUIT HAVING EMBEDDED SRAM MEMORY BLOCKS WITH REGISTERED ADDRESS AND DATA INPUT SECTIONS

Matter enclosed in heavy brackets [ ] appears in the original patent but forms no part of this reissue specification; matter printed in italics indicates the additions made by reissue.

CROSS REFERENCE TO RELATED APPLICATIONS

The following copending U.S. patent applications are owned by the owner of the present application, and their disclosures are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) (A) Ser. No. 08/996,049 filed Dec. 22, 1997 by Om P. Agrawal et al and originally entitled, DUAL PORT SRAM MEMORY FOR RUN-TIME USE IN FPGA INTEGRATED CIRCUITS;

(C) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(D) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(E) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(F) Ser. No. 08/995,612 filed Dec. 22, 1997, by Om Agrawal et al. and originally entitled, "FLEXIBLE DIRECT CONNECTIONS BETWEEN INPUT/OUTPUT BLOCKs (IOBS) AND VARIABLE GRAIN BLOCKs (VGBS) IN FPGA INTEGRATED CIRCUITS";

(G) Ser. No. 08/997,221 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS";

(H) Ser. No. 09/191,444 filed Nov. 12, 1998 by inventors Bai Nguyen et al and originally entitled, MULTI-PORT SRAM CELL ARRAY HAVING ISOLATION BUFFER IN EACH SRAM CELL FOR PROTECTING SRAM CELL FROM READ NOISE;

(I) Ser. No. 09/235,536 filed concurrently herewith by inventors Bai Nguyen et al and entitled, MULTI-PORT SRAM CELL ARRAY HAVING PLURAL WRITE PATHS INCLUDING FOR WRITING THROUGH ADDRESSABLE PORT AND THROUGH SERIAL BOUNDARY SCAN; and (J) Ser. No. 09/008,762 filed Jan. 19, 1998 by inventors Om Agrawal et al and entitled, SYNTHESIS-FRIENDLY FPGA ARCHITECTURE WITH VARIABLE LENGTH AND VARIABLE TIMING INTERCONNECT.

CROSS REFERENCE TO RELATED PATENTS

The disclosures of the following U.S. patent are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

BACKGROUND

1. Field of the Invention

The invention is generally directed to integrated circuits, more specifically to on-chip memory provided for run-time use with on-chip logic circuits. The invention is yet more specifically directed to on-chip memory provided for run-time use within Programmable Logic Devices (PLD's), and even more specifically to a subclass of PLD's known as Field Programmable Gate Arrays (FPGA's).

2. Description of Related Art

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions.

One evolutionary branch of FPLD's has grown along a paradigm known as Complex PLD's or CPLD's. This paradigm is characterized by devices such as the Advanced Micro Devices MACH™ family. Examples of CPLD circuitry are seen in U.S. Pat. Nos. 5,015,884 (issued May 14, 1991 to Om P. Agrawal et al.) and 5,151,623 (issued Sep. 29, 1992 to Om P. Agrawal et al.).

Another evolutionary chain in the art of field programmable logic has branched out along a paradigm known as Field Programmable Gate Arrays or FPGA's. Examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOB's) are provided for interconnecting other internal circuit components of the FPGA device with external circuitry. The IOB's may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means. Typically, each of the many CLB's of an FPGA has at least one lookup table (LUT) that is user-configurable to define any desired truth table, —to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means. Another part of the interconnect network may be hard wired or nonconfigurable such that it does not allow for programmed definition of the path to be taken by respective signals traveling along such hard wired interconnect. A version of hard wired interconnect wherein a given conductor is dedicatedly connected to be always driven by a particular output driver, is sometimes referred to as 'direct connect'.

In addition to the above-mentioned basic components, it is sometimes desirable to include on-chip reprogrammable memory that is embedded between CLB's and available for run-time use by the CLB's and/or resources of the FPGA for temporarily holding storage data. This embedded run-time memory is to be distinguished from the configuration memory because the latter configuration memory is generally not reprogrammed while the FPGA device is operating in a run-time mode. The embedded run-time memory may be used in speed-critical paths of the implemented design to implement, for example, FIFO or LIFO elements that buffer data words on a first-in/first-out or last-in/first-out basis. Read/write speed, data validating speed, and appropriate interconnecting of such on-chip embedded memory to other resources of the FPGA can limit the ability of a given FPGA architecture to implement certain speed-critical designs.

Modern FPGA's tend to be fairly complex. They typically offer a large spectrum of user-configurable options with respect to how each of many CLB's should be configured, how each of many interconnect resources should be configured, and how each of many IOB's should be configured. Rather than determining with pencil and paper how each of the configurable resources of an FPGA device should be programmed, it is common practice to employ a computer and appropriate FPGA-configuring software to automatically generate the configuration instruction signals that will be supplied to, and that will cause an unprogrammed FPGA to implement a specific design.

FPGA-configuring software typically cycles through a series of phases, referred to commonly as 'partitioning', 'placement', and 'routing'. This software is sometimes referred to as a 'place and route' program. Alternate names may include, 'synthesis, mapping and optimization tools'.

In the partitioning phase, an original circuit design (which is usually relatively large and complex) is divided into smaller chunks, where each chunk is made sufficiently small to be implemented by a single CLB, the single CLB being a yet-unspecified one of the many CLB's that are available in the yet-unprogrammed FPGA device. Differently designed FPGA's can have differently designed CLB's with respective logic-implementing resources. As such, the maximum size of a partitioned chunk can vary in accordance with the specific FPGA device that is designated to implement the original circuit design. The original circuit design can be specified in terms of a gate level description, or in Hardware Descriptor Language (HDL) form or in other suitable form.

After the partitioning phase is carried out, each resulting chunk is virtually positioned into a specific, chunk-implementing CLB of the designated FPGA during a subsequent placement phase.

In the ensuing routing phase, an attempt is made to algorithmically establish connections between the various chunk-implementing CLB's of the FPGA device, using the interconnect resources of the designated FPGA device. The goal is to reconstruct the original circuit design by reconnecting all the partitioned and placed chunks.

If all goes well in the partitioning, placement, and routing phases, the FPGA configuring software will find a workable 'solution' comprised of a specific partitioning of the original circuit, a specific set of CLB placements and a specific set of interconnect usage decisions (routings). It can then deem its mission to be complete and it can use the placement and routing results to generate the configuring code that will be used to correspondingly configure the designated FPGA.

In various instances, however, the FPGA configuring software may find that it cannot complete its mission successfully on a first try. It may find, for example that the initially-chosen placement strategy prevents the routing phase from completing successfully. This might occur because signal routing resources have been exhausted in one or more congested parts of the designated FPGA device. Some necessary interconnections may have not been completed through those congested parts. Alternatively, all necessary interconnections may have been completed, but the FPGA configuring software may find that simulation-predicted performance of the resulting circuit (the so-configured FPGA) is below an acceptable threshold. For example, signal propagation time may be too large in a speed-critical part of the FPGA-implemented circuit. More specifically, certain synchronization signals may need to propagate from one section of the FPGA to another according to a particular sequence and architectural constraints of the FPGA device may impede this from happening in an efficient manner in so far as resource utilization is concerned.

Given this, if the initial partitioning, placement and routing phases do not provide an acceptable solution, the FPGA configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the FPGA-implemented circuit to a near-optimum point. The latter step is at times referred to as 'optimization'. Modifications attempted by the software may include re-partitionings of the original circuit design as well as repeated iterations of the place and route phases.

There are usually a very large number of possible choices in each of the partitioning, placement, and routing phases. FPGA configuring programs typically try to explore a multitude of promising avenues within a finite amount of time to see what effects each partitioning, placement, and routing move may have on the ultimate outcome. This in a way is analogous to how chess-playing machines explore ramifications of each move to each chess piece on the end-game. Even when relatively powerful, high-speed computers are used, it may take the FPGA configuring software a significant amount of time to find a workable solution. Turn around time can take more than 8 hours.

In some instances, even after having spent a large amount of time trying to find a solution for a given FPGA-implementation problem, the FPGA configuring software may fail to come up with a workable solution and the time spent becomes lost turn-around time. It may be that, because of packing inefficiencies, the user has chosen too small an FPGA device for implementing too large of an original circuit.

Another possibility is that the internal architecture of the designated FPGA device does not mesh well with the organization and/or timing requirements of the original circuit design.

Organizations of original circuit designs can include portions that may be described as 'random logic' (because they have no generally repeating pattern). The organizations can additionally or alternatively include portions that may be described as 'bus oriented' (because they carry out nibble-wide, byte-wide, or word-wide, parallel operations). The organizations can yet further include portions that may be described as 'matrix oriented' (because they carry out matrix-like operations such as multiplying two, multidimensional vectors). These are just examples of taxonomical descriptions that may be applied to various design organizations. Another example is 'control logic' which is less random than fully 'random logic' but less regular than 'bus oriented' designs. There may be many more taxonomical descriptions. The point being made here is that some FPGA structures may be better suited for implementing random logic while others may be better suited for implementing bus oriented designs or other kinds of designs. In cases where embedded memory is present, the architecture of the embedded memory can play an important role in determining how well a given taxonomically-distinct design is accommodated. Compatibility between the embedded memory architecture and the architecture of intertwined CLB's and interconnect can also play an important role in determining how well a given taxonomically-distinct design is accommodated.

If after a number of tries, the FPGA configuring software fails to find a workable solution, the user may choose to try again with a differently-structured FPGA device. The user may alternatively choose to spread the problem out over a larger number of FPGA devices, or even to switch to another circuit implementing strategy such as CPLD or ASIC (where the latter is an Application Specific hardwired design of an IC). Each of these options invariably consumes extra time and can incur more costs than originally planned for.

FPGA device users usually do not want to suffer through such problems. Instead, they typically want to see a fast turnaround time of no more than, say 4 hours, between the time they complete their original circuit design and the time a first-run FPGA is available to implement and physically test that design. More preferably, they would want to see a fast turnaround time of no more than, say 30 minutes, for successful completion of the FPGA configuring software when executing on a 80486-80686 PC platform (that is, a socommercially specified, IBM compatible personal computer) and implementing a 25000 gate or less, design in a target FPGA device.

FPGA users also usually want the circuit implemented by the FPGA to provide an optimal emulation of the original design in terms of function packing density, cost, speed, power usage, and so forth irrespective of whether the original design is taxonomically describable generally as 'random logic', or as 'bus oriented', 'memory oriented', or as a combination of these, or otherwise.

When multiple FPGA's are required to implement a very large original design, high function packing density and efficient use of FPGA internal resources are desired so that implementation costs can be minimized in terms of both the number of FPGA's that will have to be purchased and the amount of printed circuit board space that will be consumed.

Even when only one FPGA is needed to implement a given design, a relatively high function packing density is still desirable because it usually means that performance speed is being optimized due to reduced wire length. It also usually means that a lower cost member of a family of differently sized FPGA's can be selected or that unused resources of the one FPGA can be reserved for future expansion needs.

In summary, end users want the FPGA configuring software to complete its task quickly and to provide an efficiently-packed, high-speed compilation of the functionalities provided by an original circuit design irrespective of the taxonomic organization of the original design.

In the past, it was thought that attainment of these goals was primarily the responsibility of the computer programmers who designed the FPGA configuring software. It has been shown however, that the architecture or topology of the unprogrammed FPGA can play a significant role in determining how well and how quickly the FPGA configuring software completes the partitioning, placement, and routing tasks.

As indicated above, the architectural layout, implementation, and use of on-chip embedded memory can also play a role in how well the FPGA configuring software is able to complete the partitioning, placement and routing tasks with respect to using embedded memory; and also how well the FPGA-implemented circuit performs in terms of propagating signals into, through and out of the on-chip embedded memory.

SUMMARY OF THE INVENTION

An improved FPGA device in accordance with the invention includes one or more columns of multi-ported SRAM blocks for holding run-time storage data.

In each such SRAM block, at least a first of the multiple ports is a read/write port (Port_1) which can receive first address signals and respond by directing the writing of further-received first data to an address-defined first area of the SRAM block and which can alternatively respond by directing the reading of stored data from an address-defined area of the SRAM block. A second of the multiple ports (Port_2) has at least an independent read-capability such that the second port can receive respective second address signals and can respond independently of the first port by reading stored second data from a respective address-defined area of the SRAM block.

The address signals that drive the multiple ports of each SRAM block generally come from respective signal sources that have changing output states. In accordance with the invention, one or more address-capturing registers are provided for a respective one or more of the multiple ports of each SRAM block for capturing a respective address signal for that port in response to an address-validating strobe signal. The address-validating strobe signal is routable to the respective signal source of the address signal so that the address-validating strobe signal may be used to enable a changing of the output state of the signal source once the respective address signal has been captured by the address-capturing register.

In one embodiment, an address-validating strobe signal of each SRAM block may be coupled by userconfiguration from a special SRAM control bus (SVIC) to crossing bidirectional interconnect lines (e.g., tri-stated horizontal longlines) for providing timingsynchronization to the respective signal source of the address signal so that the address-validating strobe signal may be used to enable a changing of the output state of the signal source once the respective address signal has been captured by the address-capturing register.

Further in accordance with the invention, one or more data-capturing registers are provided for a respective one or more of the multiple ports of each SRAM block for capturing a respective data signal for that port in response to a data-validating strobe signal.

When data writing is taking place, the data-validating strobe signal is routable to the respective signal source of the data signal so that the data-validating strobe signal may be used to enable a changing of the output state of the signal source once the respective data write signal has been captured by the data-capturing register.

When data reading is taking place, the data-validating strobe signal is routable to respective logic of the data signal destination so that the data-validating strobe signal may be used to indicate to that logic that a valid data output state is present for the respective to-be read data signal which has now been captured by the data-capturing register.

In one embodiment, special, vertical interconnect channels are provided adjacent to embedded SRAM columns for supplying the address-validating strobe signals and data-validating strobe signals to the SRAM blocks as well as additional control signals. The control signals (which include the address-validating and data-validating strobe signals) may be broadcast via special longlines (SMaxL lines) to all SRAM blocks of a given column or localized to groups of SRAM blocks in a given column by using shorter special vertical lines (S4xL lines).

One of the features of embodiments that include the address-capturing registers is that read operations can be performed simultaneously at the multiple ports of each SRAM block using respective, and typically different, address signals for each such port, as well as different interconnect lines for transferring the output data. The data output (data reading) bandwidth of the embedded memory can be thereby maximized, if such maximize bandwidth is desired. Logic circuits can engage in generating a next, new address signals even while the SRAM blocks are busy responding to register-captured, old address signals. Such pipelining of operations can help to increase overall system bandwidth.

Another of the features of embodiments that include the data-capturing registers is that the SRAM blocks can begin responding to new address signals even while the destination logic blocks of old data are busy responding to register-captured, old data signals. Such pipelining of operations can help to increase overall system bandwidth.

Other aspects of the invention will become apparent from the below detailed description.

BRIEF DESCRIPTION OF THE DRAWINGS

The below detailed description makes reference to the accompanying drawings, in which:

[FIG. 1 illustrates]

[FIG. 3 illustrates]

FIG. 6A shows one embodiment of a VGB;

DETAILED DESCRIPTION

Figure 1A:
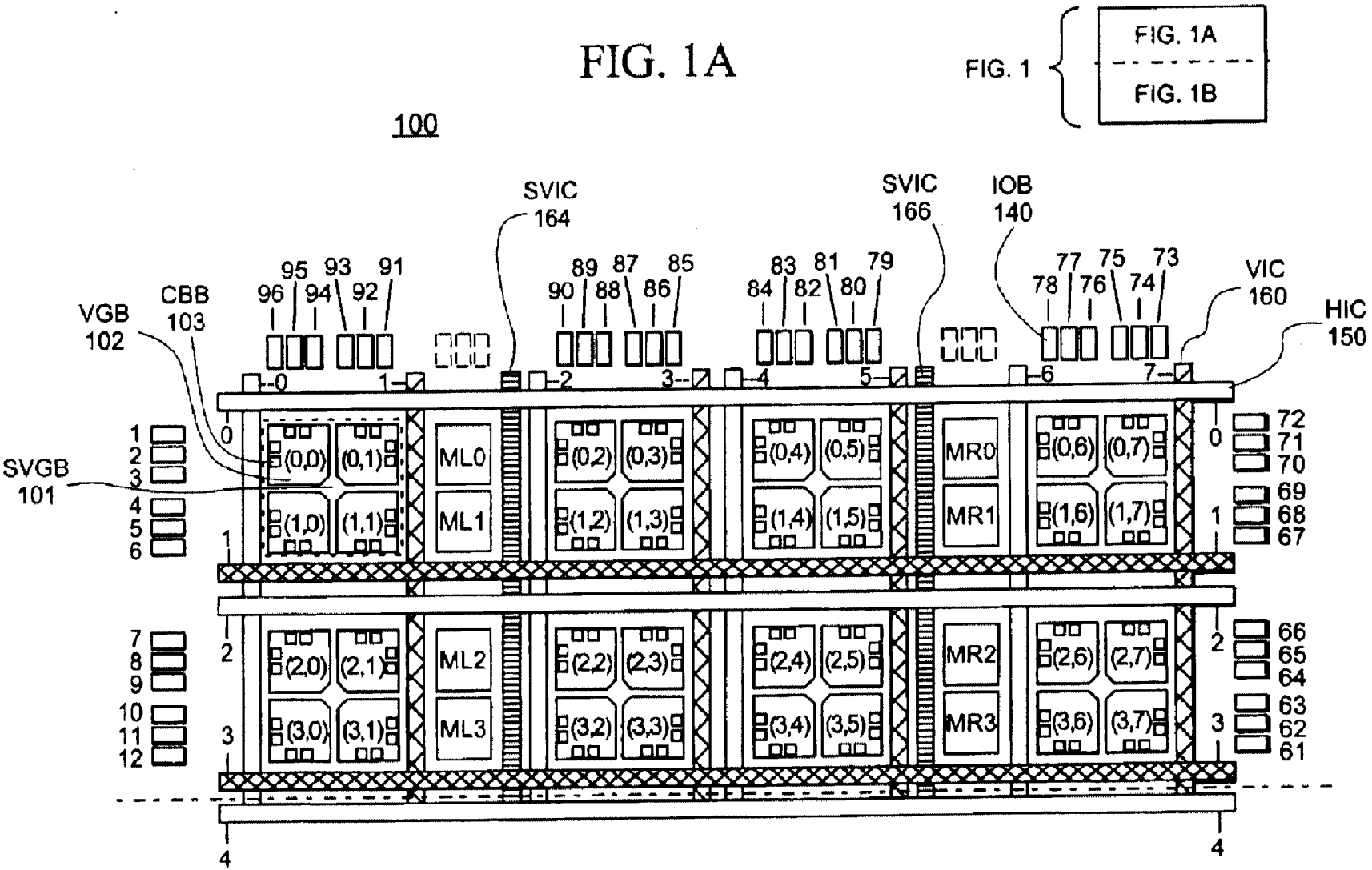
*FIGS. 1A and 1B illustrate* a first FPGA having an 8×8 matrix of VGB's (Variable Grain Blocks) with an embedded left memory column (LMC) and an embedded right memory column (RMC) in accordance with the invention.
Figure 1B:
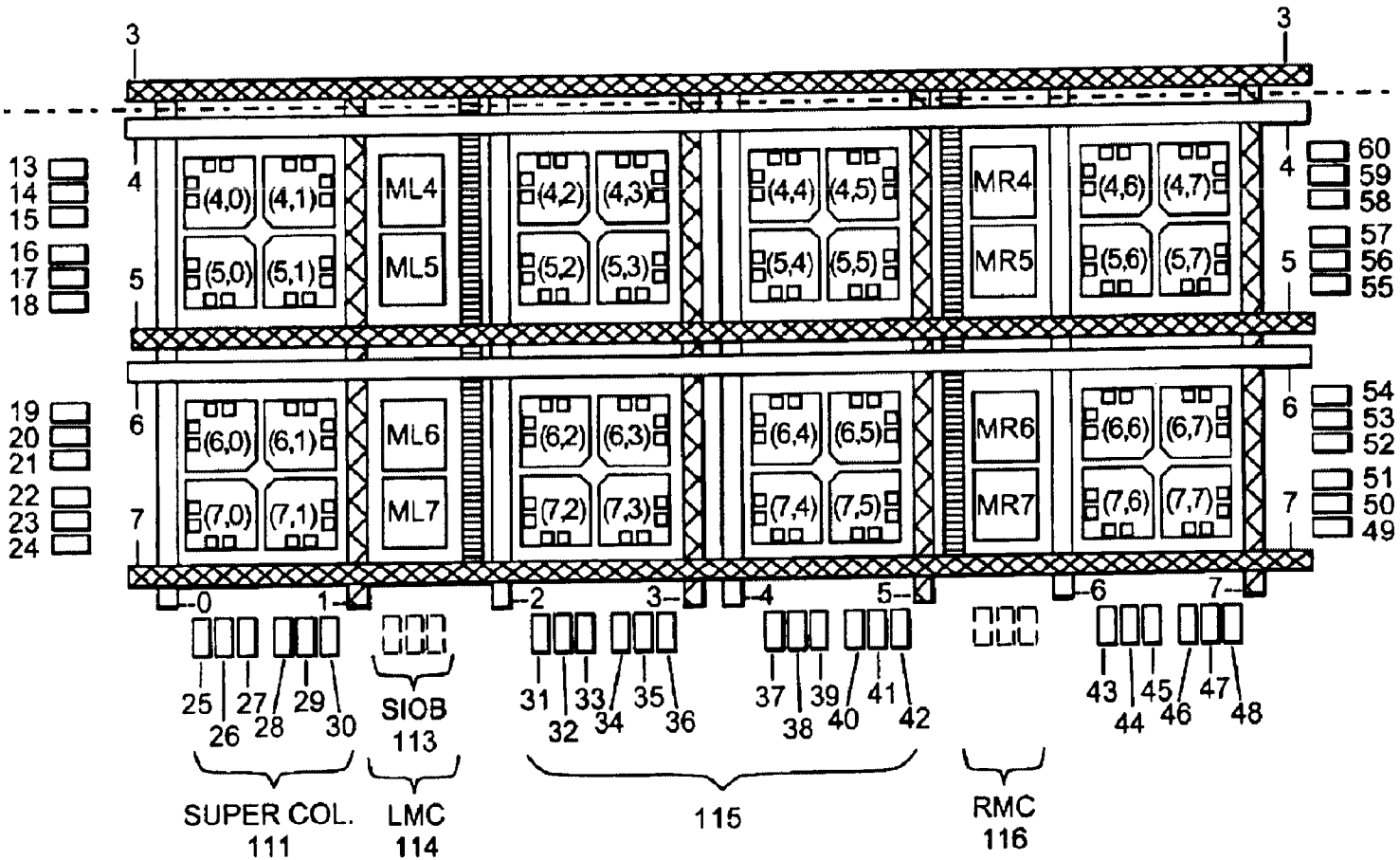

FIG. 1 shows a macroscopic view of an FPGA device 100 in accordance with the invention. The illustrated structure is preferably formed as a monolithic integrated circuit.

The macroscopic view of FIG. 1 is to be understood as being taken at a magnification level that is lower than later-provided, microscopic views. The more microscopic views may reveal greater levels of detail which may not be seen in more macroscopic views. And in counter to that, the more macroscopic views may reveal gross architectural features which may not be seen in more microscopic views. It is to be understood that for each more macroscopic view, there can be many alternate microscopic views and that the illustration herein of a sample microscopic view does not limit the possible embodiments of the macroscopically viewed entity. Similarly, the illustration herein of a sample macroscopic view does not limit the possible embodiments into which a microscopically viewed embodiment might be included.

FPGA device 100 comprises a regular matrix of super structures defined herein as super-VGB's (SVGB's). In the illustrated embodiment, a dashed box(upper left corner) circumscribes one such super-VGB structure which is referenced as 101. There are four super-VGB's shown in each super row of FIG. 1 and also four super-VGB's shown in each super column. Each super row or column contains plural rows or columns of VGB's. One super column is identified as an example by the braces at 111. Larger matrices with more super-VGB's per super column and/or super row are of course contemplated. FIG. 1 is merely an example.

There is a hierarchy of user-configurable resources within each super-VGB. At a next lower level, each super-VGB is seen to contain four VGB's. In the illustrated embodiment, identifier 102 points to one such VGB within SVGB 101.

A VGB is a Variable Grain Block that includes its own hierarchy of user configurable resources. At a next lower level, each VGB is seen to contain four Configurable Building Blocks or CBB's arranged in a L-shaped configuration. In the illustrated embodiment, identifier 103 points to one such CBB within VGB 102.

At a next lower level, each CBB has its own hierarchy of user configurable resources. Some of these (e.g., a CSE) will be shown in later figures. A more detailed description of the hierarchal resources of the super-VGB's, VGB's, CBB's, and so forth, may be found in the above-cited Ser. No. 08/948,306filed Oct. 9, 1997 by Om P. Agrawal et al. and originally entitled, VARIABLE GRAIN ARCHITECTURE FOR FPGA INTEGRATED CIRCUITS, whose disclosure is incorporated herein by reference.

It is sufficient for the present to appreciate that each CBB includes a clocked flip flop and that each CBB is capable of producing at least one bit of result data and/or storing one bit of data in its flip flop and/or of outputting the stored and/or result data to adjacent interconnect lines. Each VGB (102) is in turn, therefore capable of producing and outputting at least 4 such result bits at a time to adjacent interconnect lines. This is referred to as nibble-wide processing. Nibble-wide processing may also be carried out by the four CBB's that line the side of each SVGB (e.g., 101).

With respect to the adjacent interconnect lines (AIL's), each SVGB is bounded by two horizontal and two vertical interconnect channels (HIC's and VIC's). An example of a HIC is shown at 150. A sample VIC is shown at 160. Each such interconnect channel contains a diverse set of interconnect lines as will be seen later.

The combination of each SVGB (e.g., 101) and its surrounding interconnect resources (of which resources, not all are shown in FIG. 1) is referred to as a matrix tile. Matrix tiles are tiled one to the next as seen, with an exception occurring about the vertical sides of the two central, super columns, 115. Columns 114 (LMC) and 116 (RMC) of embedded memory are provided along the vertical sides of the central pair 115 of super columns. These columns 114, 116 will be examined in closer detail shortly.

From a more generalized perspective, the tiling of the plural tiles creates pairs of adjacent interconnect channels within the core of the device 100. An example of a pair of adjacent interconnect channels is seen at HIC's 1 and 2. The peripheral channels (HIC0, HIC7, VIC0, VIC7) are not so paired. Switch matrix boxes (not shown, see FIG. 2) are provided at the intersections of the respective vertical and horizontal interconnect channels. The switch matrix boxes form part of each matrix tile construct that includes a super-VGB at its center. See area 465 of FIG. 3.

The left memory column (LMC) 114 is embedded as shown to the left of central columns pair 115. The right memory column (RMC) 116 is further embedded as shown to the right of the central columns pair 115. It is contemplated to have alternate embodiments with greater numbers of such embedded memory columns symmetrically distributed in the FPGA device and connected in accordance with the teachings provided herein for the illustrative pair of columns, 114 and 116. It is also possible to additionally have embedded rows of such embedded memory extending horizontally.

Within the illustrated LMC 114, a first, special, vertical interconnect channel (SVIC) 164 is provided adjacent to respective, left memory blocks MLO through ML7. Within the illustrated RMC 164, a second, special, vertical interconnect channel (SVIC) 166 is provided adjacent to respective, right memory blocks MRO through MR7.

As seen, the memory blocks, ML0–ML7 and MR0–MR7 are numbered in accordance with the VGB row they sit in (or the HIC they are closest to) and are further designated as left or right (L or R) depending on whether they are respectively situated in LMC 114 or RMC 116. In one embodiment, each of memory blocks, ML0–ML7 and MR0–MR7 is organized to store and retrieve an addressable plurality of nibbles, where a nibble contains 4 data bits. More specifically, in one embodiment, each of memory blocks, ML0–ML7 and MR0–MR7 has an internal SRAM array organized as a group of 32 nibbles (32×4=128 bits) where each nibble is individually addressable by five address bits. The nibble-wise organization of the memory blocks, ML0–ML7 and MR0–MR7 corresponds to the nibble-wise organization of each VGB (102) and/or to the nibble-wise organization of each group of four CBB's that line the side of each SVGB (101). Thus, there is a data-width match between each embedded memory block and each group of four CBB's or VGB. As will be seen a similar kind of data-width matching also occurs within the diversified resources of the general interconnect mesh.

At the periphery of the FPGA device 100, there are three input/output blocks (IOB's) for each row of VGB's and for each column of VGB's. One such IOB is denoted at 140. The IOB's in the illustrated embodiment are shown numbered from 1 to 96. In one embodiment, there are no IOB's directly above and below the LMC 114 and the RMC 116. In an alternate embodiment, special IOB's such as shown in phantom at 113 are provided at the end of each memory column for driving address and control signals into the corresponding memory column.

Each trio of regular IOB's at the left side (1–24) and the right side (49–72) of the illustrated device 100 may be user-configured to couple data signals to the nearest HIC.

Similarly, each trio of regular IOB's on the bottom side (25–48) and top side (73–96) may be user-configured for exchanging input and/or output data signals with lines inside the nearest corresponding VIC. The SIOB's (e.g., 113), if present, may be userconfigured to exchange signals with the nearest SVIC (e.g., 164). Irrespective of whether the SIOB's (e.g., 113) are present, data may be input and/or output from points external of the device 100 to/from the embedded memory columns 114, 116 by way of the left side IOB's (1–24) and the right side IOB's (49–72) using longline coupling, as will be seen below. The longline coupling allows signals to move with essentially same speed and connectivity options from/to either of the left or right side IOB's (1–24, 49–72) respectively to/from either of the left or right side memory columns.

It is sufficient for the present to appreciate that each IOB includes one or more clocked flip flops and that each IOB is capable of receiving at least one bit of external input data from a point outside the FPGA device, and/or outputting at least one bit of external output data to a point outside the FPGA device, and/or storing one bit of input or output data in respective ones of its one or more flip flops, and/or of transferring such external input or output data respectively to or from adjacent interconnect lines. Each set of 24 IOB's that lie adjacent to a corresponding one of the peripheral HIC's and VIC's may therefore transfer in parallel, as many as 24 I/O bits at a time. Such transference may couple to the adjacent one of the peripheral HIC's and VIC's and/or to neighboring VGB's.

Data and/or address and/or control signals may be generated within the FPGA device 100 by its internal VGB's and transmitted to the embedded memory 114, 116 by way of the peripheral and inner HIC's, as will be seen below.

The VGB's are numbered according to their column and row positions. Accordingly, VGB(0,0) is in the top left corner of the device 100, VGB(7,7) is in the bottom right corner of the device 100; and VGB(1,1) is in the bottom right corner of SVGB 101.

Each SVGB (101) may have centrally-shared resources. Such centrally-shared resources are represented in FIG. 1 by the diamond-shaped hollow at the center of each illustrated super-VGB (e.g., 101). Longline driving amplifiers (see FIG. 5) correspond with these diamond-shaped hollows and have their respective outputs coupling vertically and horizontally to the adjacent HIC's and VIC's of their respective superVGB's.

As indicated above, each super-VGB in FIG. 1 has four CBB's along each of its four sides. The four CBB's of each such interconnect-adjacent side of each super-VGB can store a corresponding four bits of result data internally so as to define a nibble of data for output onto the adjacent interconnect lines. At the same time, each VGB contains four CBB's of the L-shaped configuration which can acquire and process a nibble's worth of data. One of these processes is nibble-wide addition within each VGB as will be described below. Another of these processes is implementation of a 4:1 dynamic multiplexer within each CBB. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. Such nibble-wide handling of data also applies to the embedded memory columns 114/116. As will be seen, nibble-wide data may be transferred between one or more groups of four CBB's each to a corresponding one or more blocks of embedded memory (MLx or MRx) by way of set of 4 equally-long lines in a nearby HIC. Each such set of 4 equally-long lines may be constituted by so-called, double-length lines (2xL lines), quad-length lines (4xL lines), octal-length lines (8xL lines) or maximum length longlines (MaxL lines).

In one particular embodiment of the FPGA device, the basic matrix is 10-by-10 SVGB's, with embedded memory columns 114/116 positioned around the central two super columns 115. (See FIG. 2.) In that particular embodiment, the integrated circuit may be formed on a semiconductor die having an area of about 100,000 mils$^2$ or less. The integrated circuit may include four metal layers for forming interconnect. So-called 'direct connect' lines and 'longlines' of the interconnect are preferably implemented entirely by the metal layers so as to provide for low resistance pathways and thus relatively small RC time constants on such interconnect lines. Logic-implementing transistors of the integrated circuit have drawn channel lengths of 0.35 microns or 0.25 microns or less. Amplifier output transistors and transistors used for interfacing the device to external signals may be larger, however.

Figure 2:
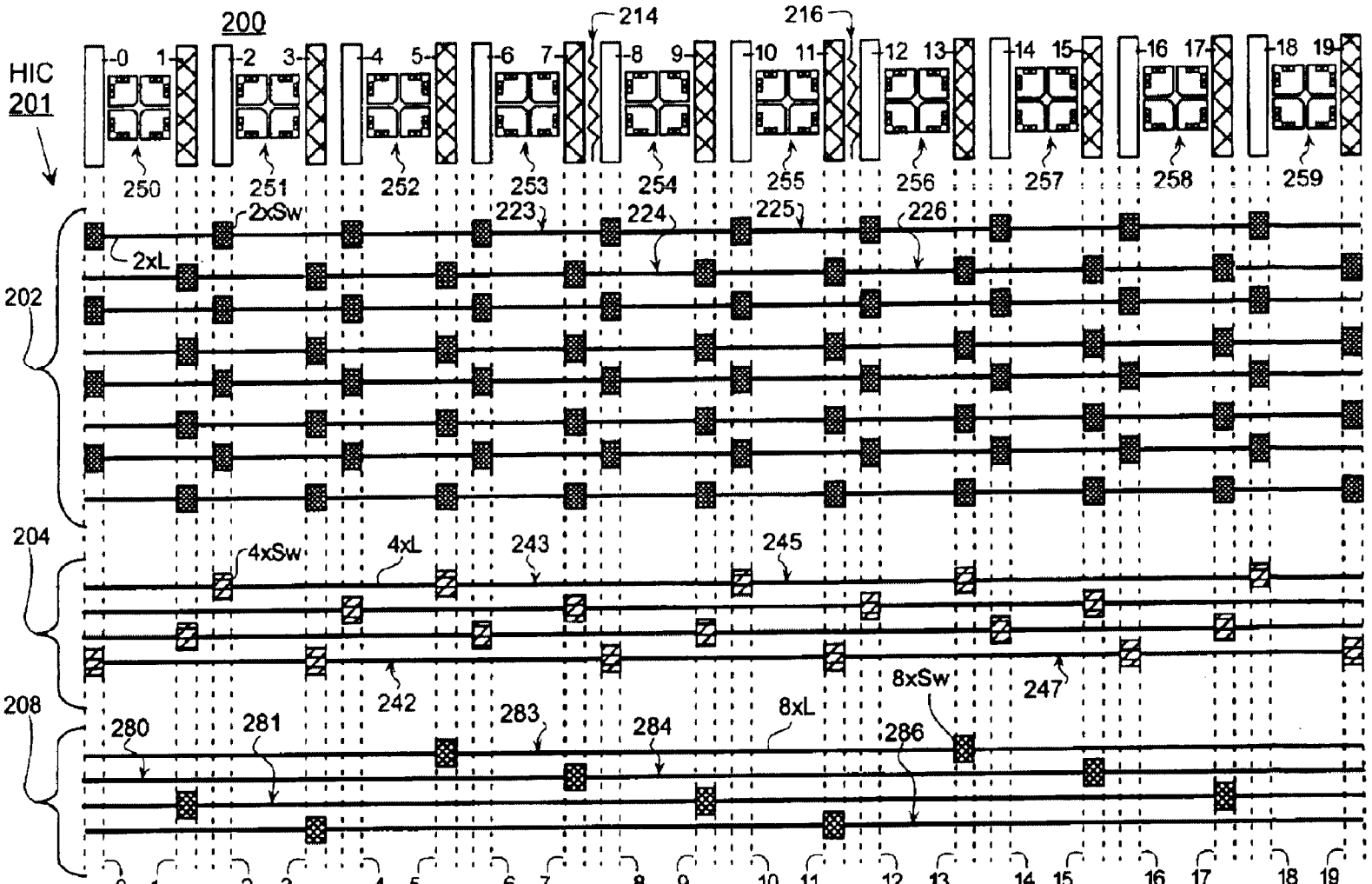
FIG. 2 is a diagram showing the placement of switch boxes along double length, quad length, and octal length lines within normal interconnect channels of another, like FPGA device having a 20×20 matrix of VGB's with embedded LMC and RMC.

As indicated above, the general interconnect channels (e.g., HIC 150, VIC 160 of FIG. 1) contain a diverse set of interconnect lines. FIG. 2 shows a distribution 200 of different-length horizontal interconnect lines (2xL, 4xL, 8xL) and associated switch boxes of a single horizontal interconnect channel (HIC) 201, as aligned relative to vertical interconnect channels in an FPGA of the invention. This particular FPGA has a 10×10 matrix of super-VGB's (or a 20×20 matrix of VGB's). The embedded memory columns (114/116) are not fully shown, but are understood to be respectively embedded in one embodiment, between VIC's 7–8 and 11–12, as indicated by zig-zag symbols 214 and 216.

For an alternate embodiment, symbol 214 may be placed between VIC's 6 and 7 while symbol 216 is placed between VIC's 12 and 13 to indicate the alternate placement of the embedded memory columns 114/116 between said VIC's in the alternate embodiment. For yet another alternate embodiment, zig-zag symbol 214 may be placed between VIC's 8 and 9 while zig-zag symbol 216 is placed between VIC's 10 and 11 to represent corresponding placement of the embedded memory columns 114/116 in the corresponding locations. Of course, asymmetrical placement of the embedded memory columns 114/116 relative to the central pair of SVGB columns (115) is also contemplated. In view of these varying placement possibilities, the below descriptions of which 2xL, 4xL, or 8xL line intersects with corresponding columns 214/216 should, of course, be read as corresponding to the illustrated placement of symbols 214 and 216 respectively between VIC's 7–8 and VIC's 11–12 with corresponding adjustments being made if one of the alternate placements of 214/216 is chosen instead.

By way of a general introduction to the subject of interconnect resources, it should be noted that the interconnect mesh of FPGA 100 includes lines having different lengths. It may be said that, without taking into account any length changes created by the imposition of the embedded memory columns 114/116, the horizontally-extending general interconnect channels (HIC's) and vertically-extending general interconnect channels (VIC's) of the FPGA device 100 are provided with essentially same and symmetrically balanced interconnect resources for their respective horizontal (x) and vertical (y) directions. These interconnect resources include a diversified and granulated assortment of MaxL lines, 2xL lines, 4xL lines and 8xL lines as well as corresponding 2xL switch boxes, 4xL switch boxes, and 8xL boxes.

In one embodiment, each general channel, such as the illustrated example in FIG. 2 of HIC 201 (the horizontal interconnect channel), contains at least the following resources: eight double-length (2xL) lines, four quad-length (4xL) lines, four octal-length (8xL) lines, sixteen full-length (MaxL) lines, sixteen directconnect (DC) lines, eight feedback (FB) lines and two dedicated clock (CLK) lines. Vertical ones of the general interconnect channels (VIC's) may contain an additional global reset (GR) longline. Parts of this total of 58/59 lines may be seen in FIGS. 4 and 5 as having corresponding designations AILO through AIL57/58 for respective interconnect lines that are adjacent to corresponding VGB's. Not all of the different kinds of lines are shown in FIG. 2. Note that each of the 2xL, 4xL, 8xL and MaxL line sets includes at least four lines of its own kind for carrying a corresponding nibble's worth of data or address or control signals.

In FIG. 2, core channels 1 through 18 are laid out as adjacent pairs of odd and even channels. Peripheral channels 0 and 19 run alone along side the IOB's (see FIG. 1). Although not shown in FIG. 2, it should be understood that each switch box has both horizontally-directed and vertically-directed ones of the respective 2xL, 4xL, and 8xL lines entering into that respective switch box. (See region 465 of FIG. 3.) A given switchbox (XxSw) may be user-configured to continue a signal along to the next XxL line (e.g., 2xL line) of a same direction and/or to couple the signal to a corresponding same kind of XxL line of an orthogonal direction. A more detailed description of switchboxes for one embodiment may be found in the above-cited, U.S. Ser. No. 09/008,762, filed Jan. 19, 1998 by inventors Om Agrawal et al whose disclosure is incorporated herein by reference.

Group 202 represents the 2xL lines of HIC 201 and their corresponding switch boxes. For all of the 2xL lines, each such line spans the distance of essentially two adjacent VGB's (or one super-VGB). Most 2xL lines terminate at both ends into corresponding 2x switch boxes (2xSw's). The terminating 2xSw boxes are either both in even-numbered channels or both in odd-numbered channels. Exceptions occur at the periphery where either an odd or even-numbered channel is nonexistent. As seen in the illustrated embodiment 200, interconnections can be made via switch boxes from the 2xL lines of HIC 201 to any of the odd and even-numbered vertical interconnect channels (VIC's) 0–19.

With respect to the illustrated placement 214/216 of embedded memory columns 114/116, note in particular that 2xL line 223 and/or its like (other, similarly oriented 2xL lines) may be used to provide a short-haul, configurable connection from SVGB 253 (the one positioned to the right of VIC #6) to LMC 214. Similarly, line 224 and its like may be used to provide a short-haul connection from SVGB 254 (the one positioned to the right of VIC #8) to LMC 214. Line 225 and/or its like may be used to provide a short-haul connection from SVGB 255 to RMC 216. Line 226 and/or its like may be used to provide a short-haul connection from SVGB 256 to RMC 216. Such short-haul connections may be useful for quickly transmitting speed-critical signals such as address signals and/or data signals between a nearby SVGB (253–256) and the corresponding embedded memory column 114 or 116.

Group 204 represents the 4xL lines of HIC 201 and their corresponding switch boxes. Most 4xL lines each span the distance of essentially four, linearly-adjacent VGB's and terminate at both ends into corresponding 4x switch boxes (4xSw's). The terminating 4xSw boxes are either both in even-numbered channels or both in odd-numbered channels. As seen in the illustrated embodiment 200, interconnections can be made via switch boxes from the 4xL lines of HIC 201 to any of the odd and evennumbered vertical interconnect channels (VIC's) 0–19.

With respect to the illustrated placement 214/216 of embedded memory columns 114/116, note in particular that 4xL line 242 and/or its like (other, similarly oriented 4xL lines that can provide generally similar coupling) may be used to provide a medium-haul configurable connection between LMC 214 and either one or both of SVGB 252 and SVGB 253. Line 243 and/or its like may be used to provide a configurable connection of medium-length between LMC 214 and either one or both of SVGB's 253 and 254. Similarly, line 245 and/or its like may be used to provide medium-length coupling between RMC 216 and either one or both of SVGB's 255 and 256. Moreover, line 247 and/or its like may be used to configurably provide medium-haul interconnection between RMC 216 and either one or both of SVGB's 257 and 256. Such medium-haul interconnections may be useful for quickly propagating address signals and/or data signals in comparatively medium-speed applications.

Group 208 represents the 8xL lines of HIC 201 and their corresponding switch boxes. Most 8xL lines (7 out of 12) each spans the distance of essentially eight, linearly-adjacent VGB's. A fair number of other 8xL lines (5 out of 12) each spans distances less than that of eight, linearly-adjacent VGB's. Each 8xL line terminates at least one end into a corresponding 8x switch box (8xSw). The terminating 8xSw boxes are available in this embodiment only in the core oddnumbered channels (1, 3, 5, 7, 9, 11, 13, 15 and 17). Thus, in embodiment 200, interconnections can be made via switch boxes from the 8xL lines of HIC 201 to any of the nonperipheral, odd-numbered vertical interconnect channels (VIC's). It is within the contemplation of the invention to have the 8xSw boxes distributed symmetrically in other fashions such that even-numbered channels are also covered.

With respect to the illustrated placement 214/216 of embedded memory columns 114/116, note in particular that 8xL line 281 or its like may be used to provide even longer-haul, configurable connection from between LMC 214 and any one or more of SVGB's 251–254. (In one embodiment where 214 places to the left of VIC 7, 8xL line 280 provides configurable interconnection between LMC 214 and any one or more of SVGB's 250–253.) In the illustrated embodiment, 8xL line 282 may be used to provide 8xL coupling between any two or more of: LMC 214 and SVGB's 252–255. Line 283 may be used to provide 8xL coupling between any two or more of: LMC 214, RMC 216, and SVGB's 253–256. Line 284 may be used to provide 8xL coupling between any two or more of: LMC 214, RMC 216, and SVGB's 254–257. Line 285 may be used to provide 8xL coupling between any two or more of: RMC 216 and SVGB's 255–258. Line 286 may be similarly used to provide 8xL coupling between any two or more of: RMC 216 and SVGB's 256–259. Although the largest of the limited-length lines is 8xL in the embodiment of FIG. 2, it is within the contemplation of the invention to further have 16xL lines, 32xL lines and so forth in arrays with larger numbers of VGB's.

In addition to providing configurable coupling between the intersecting memory channel 214 and/or 216, each of the corresponding 2xL, 4xL, 8xL and so forth lines may be additionally used for conveying such signals between their respective switchboxes and corresponding components of the intersecting memory channel.

Referring briefly back to FIG. 1, it should be noted that the two central super columns 115 are ideally situated for generating address and control signals and broadcasting the same by way of short-haul connections to the adjacent memory columns 114 and 116. High-speed data may be similarly conveyed from the memory columns 114/116 to the SVGB's of central columns 115.

Before exploring more details of the architecture of FPGA device 100, it will be useful to briefly define various symbols that may be used within the drawings. Unless otherwise stated, a single line going into a trapezoidal multiplexer symbol is understood to represent an input bus of one or more wires. Each open square box (MIP) along such a bus represents a point for user-configurable acquisition of a signal from a crossing line to the multiplexer input bus. In one embodiment, a PIP (programmable interconnect point) is placed at each MIP occupied intersection of a crossing line and the multiplexer input bus. Each of PIP (which may be represented herein as a hollow circle) is understood to have a single configuration memory bit controlling its state. In the active state the PIP creates a connection between its crossing lines. In the inactive state the PIP leaves an open between the illustrated crossing lines. Each of the crossing lines remains continuous however in its respective direction (e.g., x or y).

PIP's (each of which may be represented herein by a hollow circle covering a crossing of two continuous lines) may be implemented in a variety of manners as is well known in the art. In one embodiment pass transistors such as MOSFET's may be used with their source and drain respectively coupled to the two crossing lines while the transistor gate is controlled by a configuration memory bit. In an alternate embodiment, nonvolatilely-programmable floating gate transistors may be used with their source and drain respectively coupled to the crossing lines. The charge on the floating gate of such transistors may represent the configuration memory bit. A dynamic signal or a static turn-on voltage may be applied to the control gate of such a transistor as desired. In yet another alternate embodiment, nonvolatilely-programmable fuses or anti-fuses may be provided as PIP's with their respective ends being connected to the crossing lines. One may have bidirectional PIP's for which signal flow between the crossing lines (e.g., 0 and 1) can move in either direction. Where desirable, PIP's can also be implemented with unidirectional signal coupling means such as AND gates, tri-state drivers, and so forth.

Figure 10:
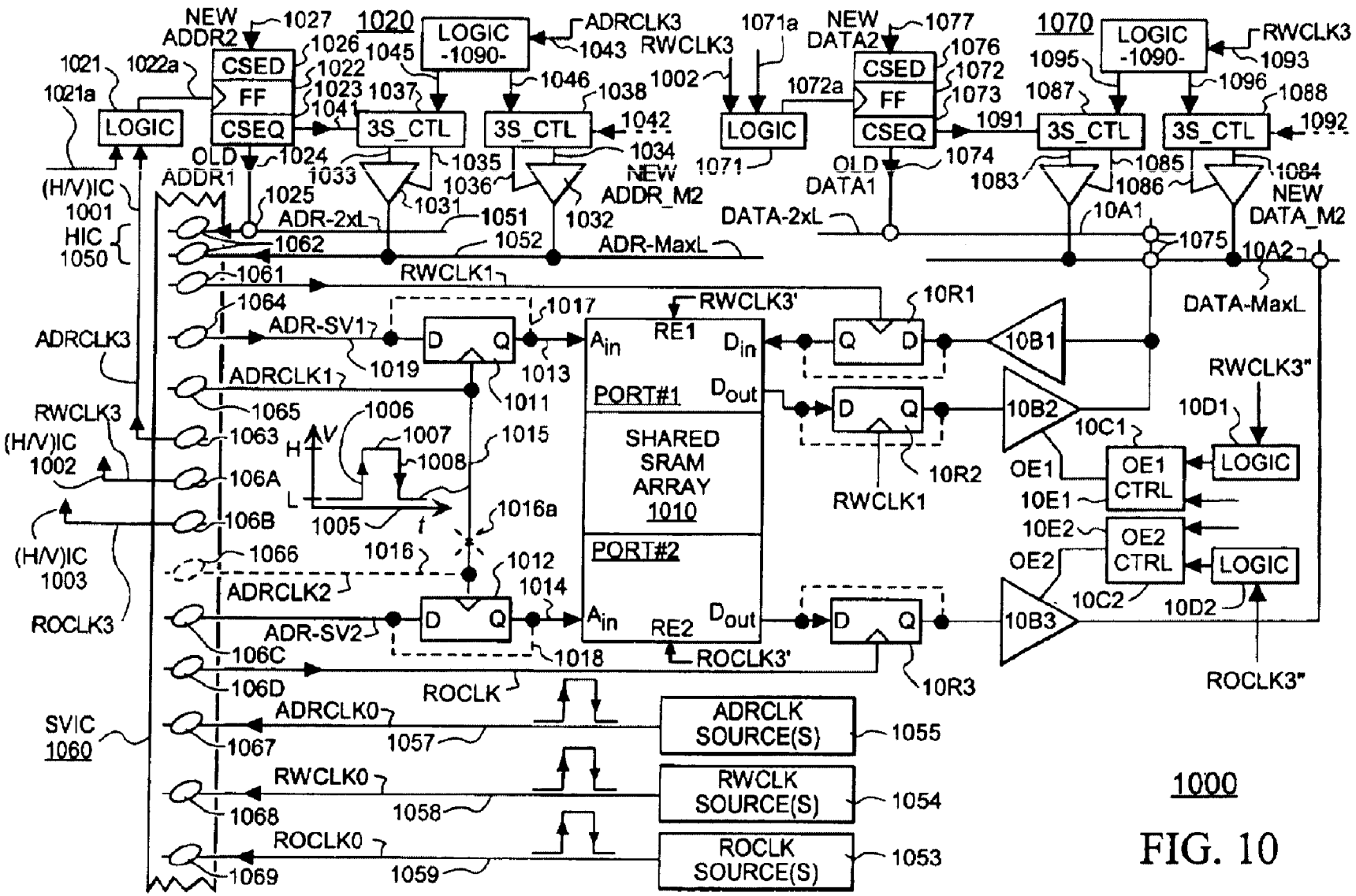
FIG. 10 is a block diagram of embodiments of FPGA devices, including those conform with FIG. 9 as one set of alternatives, wherein respective flows may be seen for respective address signals, address-validating strobe signals, memory data signals, and memory data-validating strobe signals of dual-ported SRAM block; [and]

An alternate symbol for a group of PIP's is constituted herein by a hollow and tilted ellipse covering a bus such as is seen in FIG. 10.

Another symbol that may be used herein is a hollow circle with an 'X' inside. This represents a POP. POP stands for 'Programmable Opening Point'. Unless otherwise stated, each POP is understood to have a single configuration memory bit controlling its state. In the active state the POP creates an opening between the colinear lines entering it from opposing sides. In the inactive state the POP leaves closed an implied connection between the colinear lines entering it. Possible implementations of POP's include pass transistors and tri-state drivers. Many other alternatives will be apparent to those skilled in the art.

Figure 3A:
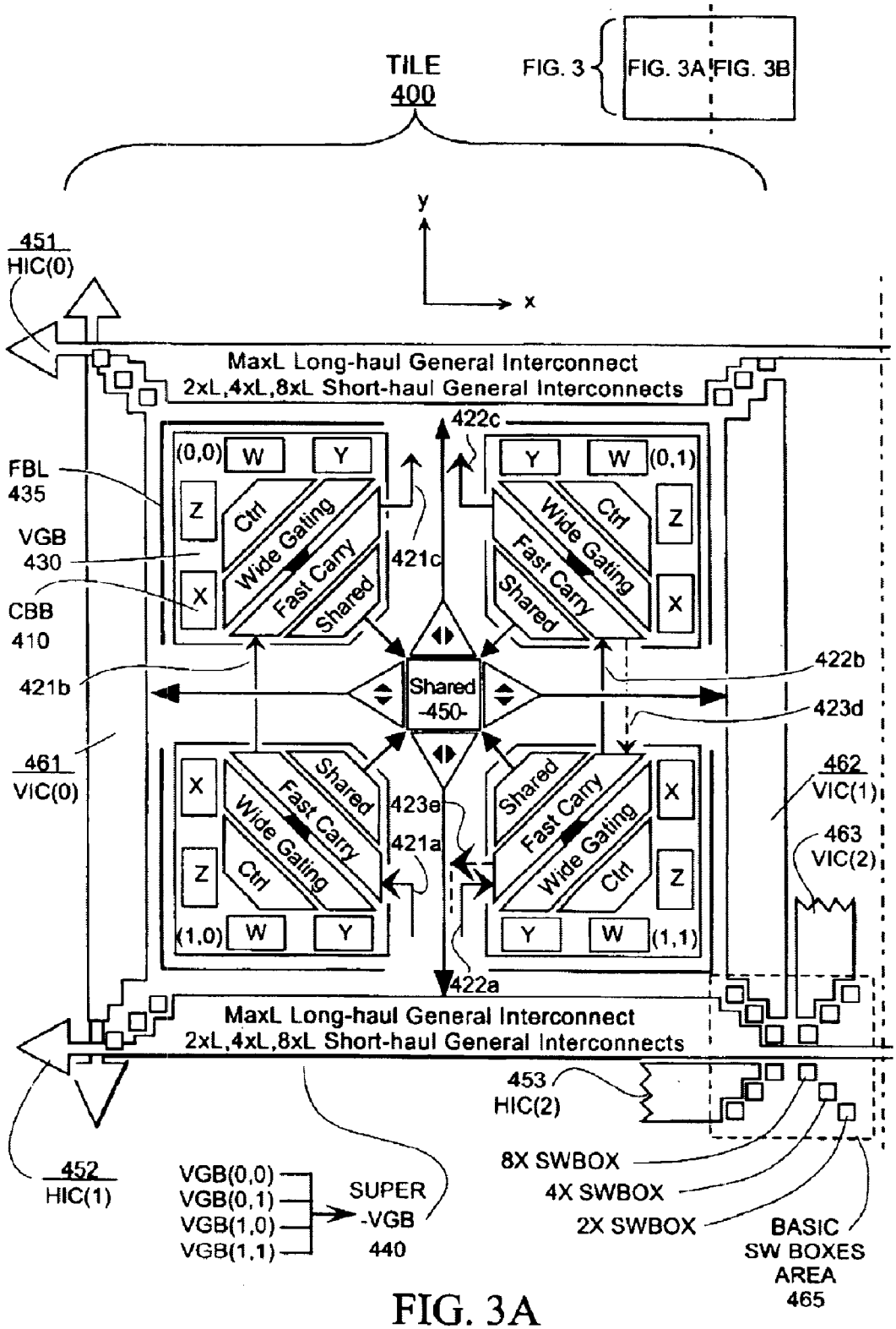
*FIGS. 3A and 3B illustrate* more details of a Right Memory Column (RMC), and in particular of two adjacent memory blocks and of the relation of the memory blocks to an adjacent super-VGB core tile and its horizontal interconnect channels (HIC's)
Figure 3B:
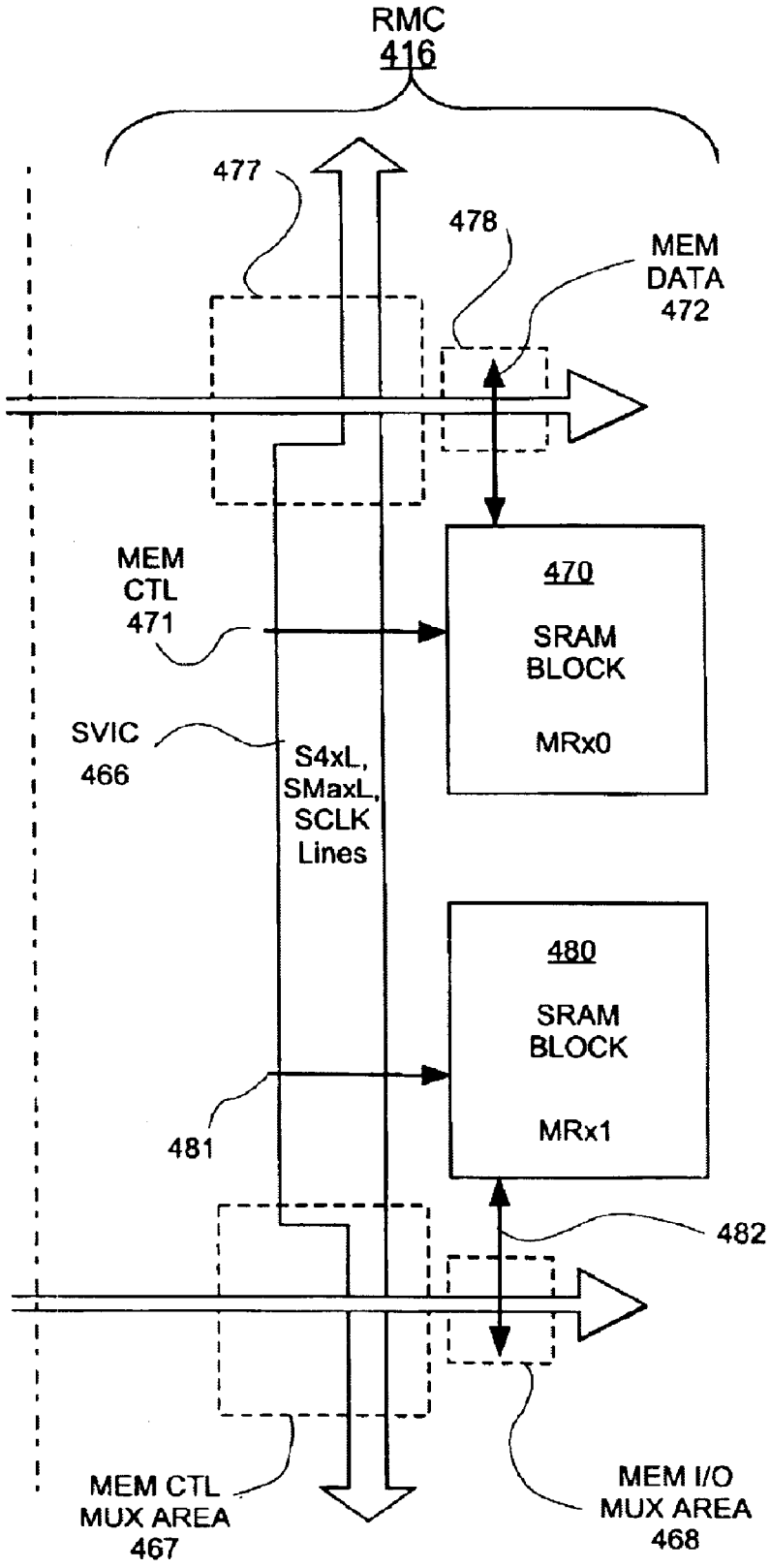

Referring now to FIG. 3, this figure provides a mid-scopic view of some components within an exemplary matrix tile 400 that lays adjacent to embedded memory column, RMC 416. Of course, other implementations are possible for the more macroscopic view of FIG. 1.

The mid-scopic view of FIG. 3 shows four VGB's brought tightly together in mirror opposition to one another. The four, so-wedged together VGB's are respectively designated as (0,0), (0,1), (1,0) and (1,1). The four VGB's are also respectively and alternately designated herein as VGB_A, VGB_B, VGB_C, and VGB_D.

Reference number 430 points to VGB_A which is located at relative VGB row and VGB column position (0,0). Some VGB internal structures such as CBB's Y, W, Z, and X are visible in the mid-scopic view of FIG. 3. An example of a Configurable Building Block (CBB) is indicated by 410. As seen, the CBB's 410 of each VGB 430 are arranged in an L-shaped organization and placed near adjacent interconnect lines. Further VGB internal structures such as each VGB's common controls developing (Ctrl) section, each VGB's wide-gating supporting section, each VGB's carry-chaining (Fast Carry) section, and each VGB's coupling to a shared circuit 450 of a corresponding super-structure (super-VGB) are also visible in the mid-scopic view of FIG. 3. VGB local feedback buses such as the L-shaped structure shown at 435 in FIG. 3 allow for high-speed transmission from one CBB to a next within a same VGB, of result signals produced by each CBB.

The mid-scopic view of FIG. 3 additionally shows four interconnect channels surrounding VGB's (0,0) through (1,1). The top and bottom, horizontally extending, interconnect channels (HIC's) are respectively identified as 451 and 452. The left and right, vertically extending, interconnect channels (VIC's) are respectively identified as 461 and 462.

Two other interconnect channels that belong to other tiles are partially shown at 453 (HIC2) and 463 (VIC2) so as to better illuminate the contents of switch boxes area 465. Switch boxes area 465 contains an assortment of 2xL switch boxes, 4x switch boxes and 8x switch boxes, which may be provided in accordance with FIG. 2.

In addition, a memory-control multiplexer area 467 is provided along each HIC as shown for configurably coupling control signals from the horizontal bus (e.g., HIC 452) to special vertical interconnect channel (SVIC) 466. The illustrated placement of multiplexer area 467 to the right of the switch boxes (SwBoxes) of VIC's 462 and 463 is just one possibility. Multiplexer area 467 may be alternatively placed between or to the left of the respective switch boxes of VIC's 462 and 463.

In one embodiment (see FIG. 8), SVIC 466 has sixteen, special maximum length lines (16 SMaxL lines), thirty-two, special quad length lines (32 S4xL lines), and four special clock lines (SCLK0-3). SVIC 466 carries and couples control signals to respective control input buses such as 471, 481 of corresponding memory blocks such as 470, 480.

A memory-I/O multiplexer area 468 is further provided along each HIC for configurably coupling memory data signals from and to the horizontal bus (e.g., HIC 452) by way of data I/O buses such as 472, 482 of corresponding memory blocks such as 470, 480. Again, the illustrated placement of multiplexer area 468 to the right of the switch boxes (SwBoxes) of VIC's 462 and 463 is just one possibility. Multiplexer area 468 may be alternatively placed between or to the left of the respective switch boxes of VIC's 462 and 463.

Memory control multiplexer area 477 and memory I/O multiplexer area 478 are the counterparts for the upper HIC 451 of areas 467 and 468 of lower HIC 452. Although not specifically shown, it is understood that the counterpart, left memory channel (LMC) is preferably arranged in mirror symmetry to the RMC 416 so as to border the left side of its corresponding matrix tile.

As seen broadly in FIG. 3, the group of four VGB's (0,0) through (1,1) are organized in mirror image relationship to one another relative to corresponding vertical and horizontal centerlines (not shown) of the group and even to some extent relative to diagonals (not shown) of the same group. Vertical and horizontal interconnect channels (VIC's and HIC's) do not cut through this mirror-wise opposed congregation of VGB's. As such, the VGB's may be wedged-together tightly.

Similarly, each pair of embedded memory blocks (e.g., 470 and 480), and their respective memory-control multiplexer areas (477 and 467), and their respective memory-I/O multiplexer areas (478 and 468) are organized in mirror image relationship to one another as shown. Horizontal interconnect channels (HIC's) do not cut through this mirror-wise opposed congregation of embedded memory constructs. As such, the respective embedded memory constructs of blocks MRx0 (in an even row, 470 being an example) and MRx1 (in an odd row, 480 being an example) may be wedged-together tightly. A compact layout may be thereby achieved.

With respect to mirror symmetry among variable grain blocks, VGB (0,1) may be generally formed by flipping a copy of VGB (0,0) horizontally. VGB (1,1) may be similarly formed by flipping a copy of VGB (0,1) vertically. VGB (1,0) may be formed by flipping a copy of VGB (1,1) horizontally, or alternatively, by flipping a copy of VGB (0,0) vertically. The mirror-wise symmetrical packing-together of the four VGB's (0,0 through 1,1) is referred to herein as a 'Super Variable Grain Block' or a super-VGB 440.

In a preferred embodiment, the mirror symmetry about the diagonals of the super-VGB is not perfect. For example, there is a Fast Carry section in each VGB that allows VGB's to be chained together to form multi-nibble adders, subtractors or counters. (A nibble is a group of 4 data bus. A byte is two nibbles or 8 data bits. A counter generally stores and feeds back its result so as to provide cumulative addition or subtraction.) The propagation of rippled-through carry bits for these Fast Carry sections is not mirror wise symmetrical about the diagonals of each super-VGB 440. Instead it is generally unidirectional along columns of VGB's. Thus, CBB's X, Z, W, and Y are not interchangeable for all purposes.

The unidirectional propagation of carry bits is indicated for example by special direct connect lines 421a, 421b and 421c which propagate carry bits upwardly through the Fast Carry portions of VGB's (0,0) and (1,0). The unidirectional propagation is further indicated by special direct connect lines 422a, 422b and 422c which propagate carry bits upwardly through the Fast Carry portions of VGB's (0,1) and (1,1).

Such unidirectional ripple-through of carry bits may continue across the entire FPGA device so as to allow addition, subtraction or count up/down results to form in bit aligned fashion along respective columns of the FPGA device. Bit aligned results from a first set of one or more columns can be submitted to other columns (or even resubmitted to one or more columns of the first set) for further bit aligned processing. In one embodiment, the X CBB generally produces the relatively least significant bit (LSB) of result data within the corresponding VGB, the Z CBB generally produces the relatively next-more significant bit, the W CBB generally produces the relatively next-more significant bit, and the Y CBB generally produces the relatively most significant bit (MSB) of result data within the corresponding VGB.

In an alternate embodiment, propagation of rippledthrough carry bits may be zig-zagged first up and then down through successive columns of VGB's. In such an alternate zig-zagged design, the significance of bits for adder/subtractor circuits would depend on whether the bits are being produced in an odd or even column of VGB's.

The local feedback lines 435 of each VGB may be used to feedback its registered adder outputs to one of the adder inputs and thereby define a counter. The counter outputs can be coupled by way of the adjacent HIC to either an intersecting SVIC (e.g., 466, so as to provide address sequencing) or to an adjacent data port (e.g., 472, 482, so as to store counter results in the embedded memory at designated time points).

FIGS. 4–7D are provided to facilitate the understanding of the coupling that is provided by way of the HIC's (e.g., 451 and 452) between the embedded memory blocks (470) and corresponding inputs and outputs of the super-VGB's (440) and/or IOB's. It is helpful to study the I/O structure of selected components within each super-VGB and IOB to some extent so that the data and control input/output interplay between the embedded memory columns 114/116 and the SVGB's and the IOB's can be appreciated. At the same time, it is to be understood that the description given here for the SVGB's and IOB's may be less extensive than that given in the above-cited Ser. Nos. 08/948,306 and 08/995,615. The description given here for the SVGB's and IOB's are intended to provide no more than a basic understanding of the cooperative structuring of the embedded memory blocks (470/480) and corresponding inputs and outputs of the super-VGB's (440) and IOB's (see FIG. 7A).

Referring to FIG. 6A, each of the X, Z, W, and Y Configurable Building Blocks of each VGB has six 19:1, input-terms acquiring multiplexers (shown as a single set with an x6 wide input bus) for acquiring a corresponding six input term signals of the CBB from adjacent interconnect lines (AIL's). The CBB can process its respectively acquired signals in accordance with user-configuration instructions to produce result signals. The Yz_A signal 548 output by the Y CBB 540 of FIG. 6A is an example of such a result signal.

Figure 6B:
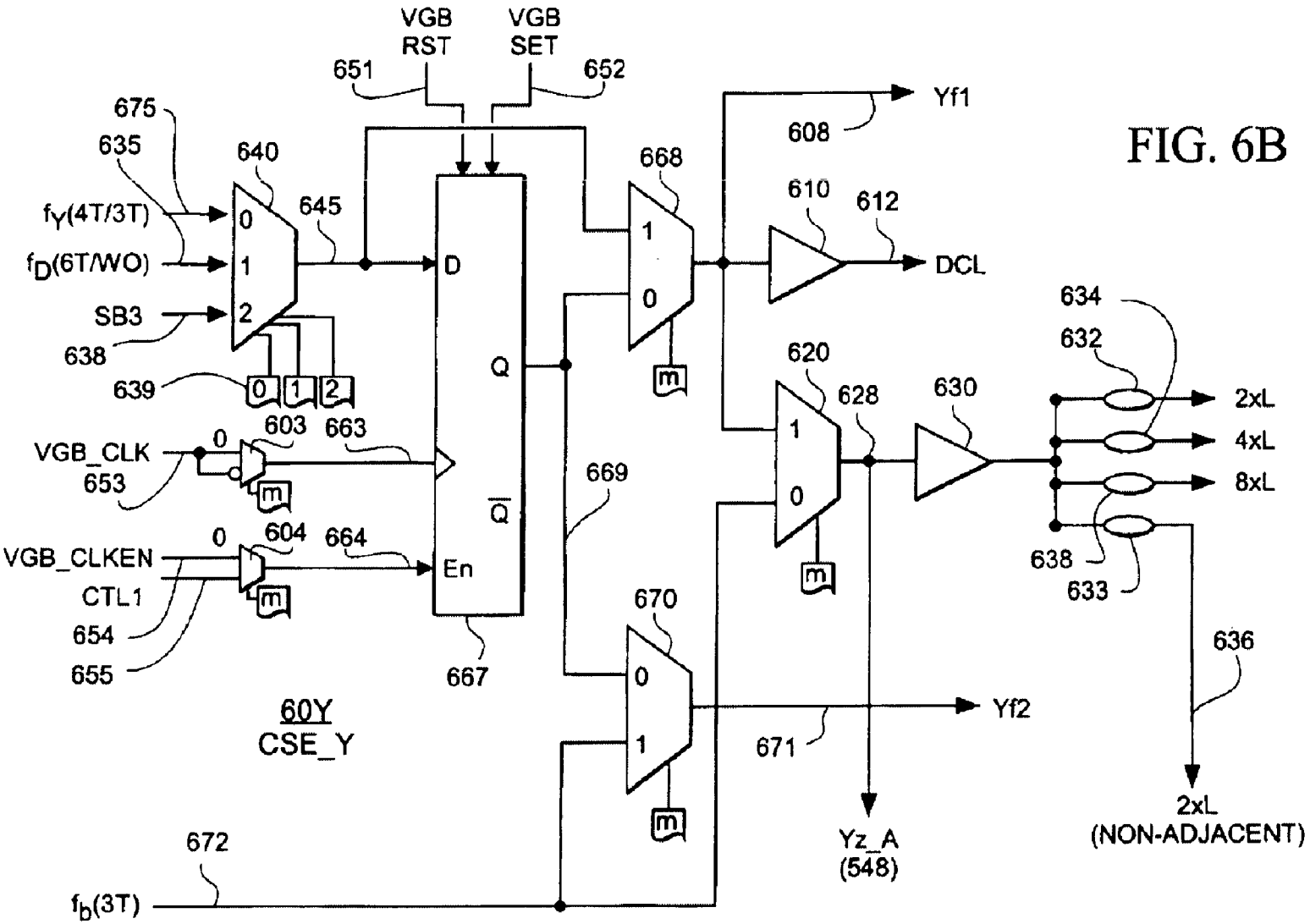
FIG. 6B shows an exemplary CSE (Configurable Sequential Element) having a flip flop that is responsive to a VGB clock signal.

Each of the X, Z, W, and Y CBB's further has a result-signal storing register (e.g., 667 of FIG. 6B) and a 2/4/8xL drive amplifier (e.g., 630 of FIG. 6B). A configurable bypass multiplexer (e.g., 668 of FIG. 6B) allows the CBB to be configured to output either a register-stored version of a CBB result signal or a nonstored (unregistered) result signal of the CBB onto adjacent ones of the 2xL lines, 4xL lines and 8xL lines. Various, dynamic control signals may be used by the CBB for controlling its internal, result-signal storing register (e.g., 667). These control signals are acquired by way of respective, controls input multiplexers (14:1 Ctrl, shown in FIG. 6A) of the respective CBB's X,Z,W,Y. There are two such controls input multiplexers (14:1 Ctrl) provided for each CBB.

In addition to its 2/4/8xL drive amplifier, each of the X, Z, W, and Y CBB's further has a dedicated directconnect (DC) drive amplifier (shown as DC Drive in FIG. 6A and as 610 in FIG. 6B) which can configurably output either a register-stored version of a CBB result signal or an non-stored (unregistered) result signal of the CBB onto adjacent ones of so-called, direct connect lines. Moreover, each CBB has means for outputting its registered or unregistered result-signals onto feedback lines (FBL's 608 and 671) of the VGB. The DCL's (direct connect lines) and FBL's are not immediately pertinent to operation of the embedded memory blocks (470) but are mentioned here for better understanding of next-described FIG. 4.

Figure 4:
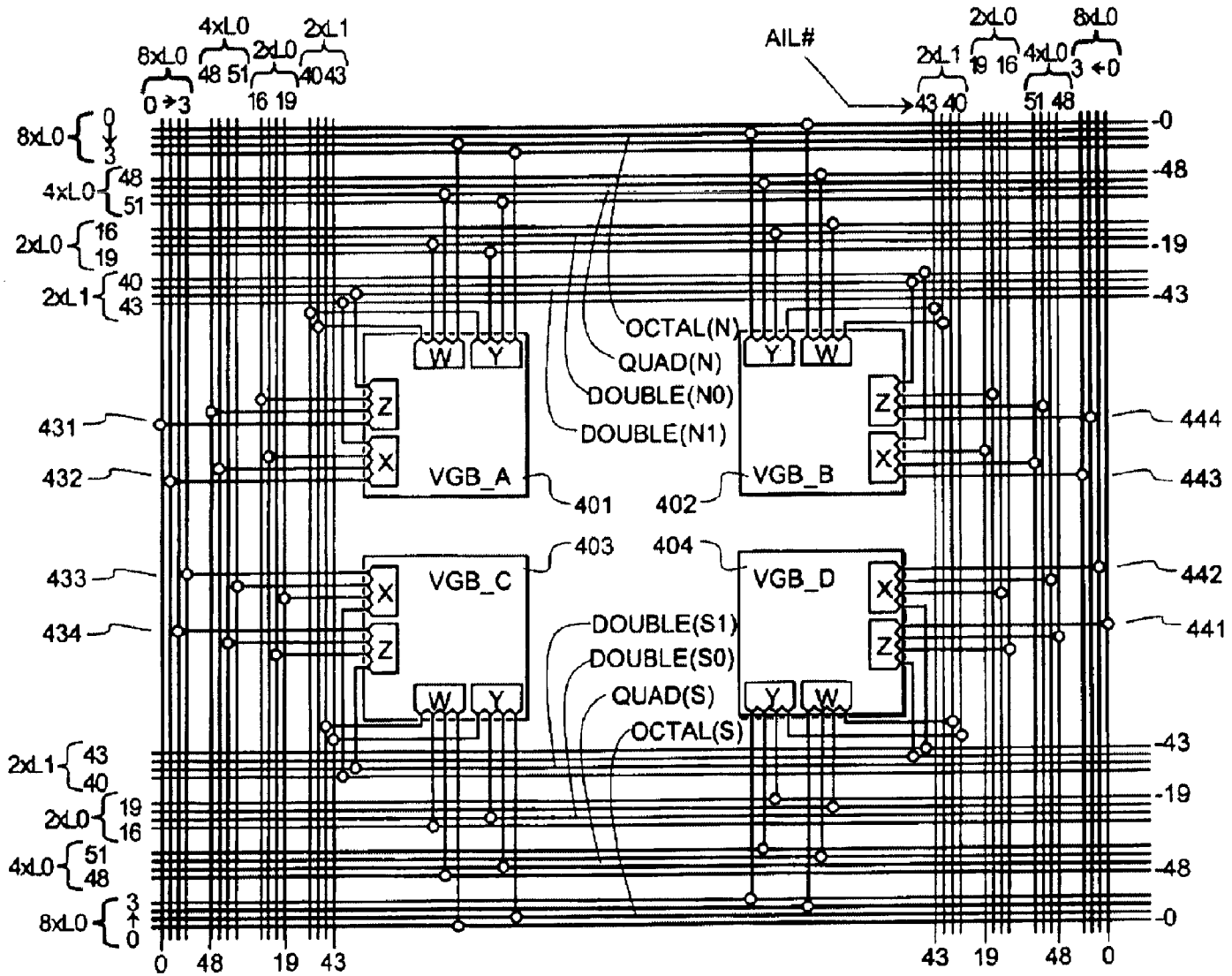
FIG. 4 illustrates how the 2/4/8xL output lines of respective CBB's (X, Z, W, Y) within a SVGB are configurably couplable to surrounding interconnect channels.

FIG. 4 looks at the 2/4/8xL driver output connections for each super-VGB. In FIG. 4, each CBB has four respective output lines for driving nearby 2xL interconnect lines, 4xL interconnect lines and 8xL interconnect lines that surround the encompassing super VGB. The four respective output lines of each CBB may all come form one internal 2/4/8xL line driving amplifier (e.g., 630 of FIG. 6B) or from different drive amplifiers.

The layout of FIG. 4 is essentially symmetrical diagonally as well as horizontally and vertically. The octal length (8xL) lines are positioned in this embodiment further away from the VGB's 401–404 than are the 4xL and 2xL lines of the respective vertical and horizontal interconnect channels. AIL line 0 of each of the illustrated VIC's and HIC's is at the outer periphery and AIL numbers run generally from low to high as one moves inwardly. The quad length (4xL) lines are positioned in this embodiment further away from the VGB's than are the double length (2xL) lines of the respective VIC's and HIC's. It, is within the contemplation of the invention to alternatively position the octal length (8xL) lines closest to VGB's 401–404, the quad length (4xL) lines next closest, and the double length (2xL) lines of the respective VIC's and HIC's furthest away from surrounded VGB's 401–404. The same pattern of course repeats in each super-VGB of the FPGA core matrix.

VGB_A (401) can couple to same AIL's in the northern octals (Octals(N)) as can VGB_D (404) in the southern octals (Octals(S)). A similar, diagonal symmetry relation exists between VGB_B (402) and VGB_C (403). Symmetry for the eastern and western octal connections is indicated by PIP's 431, 432, 433 and 434 moving southwardly along the west side of the tile and by counterposed PIP's 441, 442, 443 and 444 moving northwardly along the east side.

Note that the non-adjacent 2xL connections of this embodiment (e.g., the PIP connection of the Y CBB in VGB 401 to vertical AIL #40) allow for coupling of a full nibble of data from any VGB to the 2xL lines in either or both of the adjacent VIC's and HIC's. Thus, busoriented operation may be efficiently supported by the L-organized CBB's of each VGB in either the horizontal or vertical direction. Each CBB of this embodiment has essentially equivalent access to output result signals to immediately adjacent 2xL, 4xL and 8xL lines as well as to nonadjacent 2xL lines (in the AIL 40–43 sets). Each pair of VGB's of a same row of column can output 4 independent result signals to a corresponding 4 lines in any one of the following 4-line buses, (a) the immediately adjacent 2xL0 group (AIL's 16–19), (b) the immediately adjacent 4xL group (AIL's 48–51), (c) the immediately adjacent 8xL group (AIL's 0–3), and (d) the not immediately adjacent 2xL1 group (AIL's 40–43).

Figure 5:
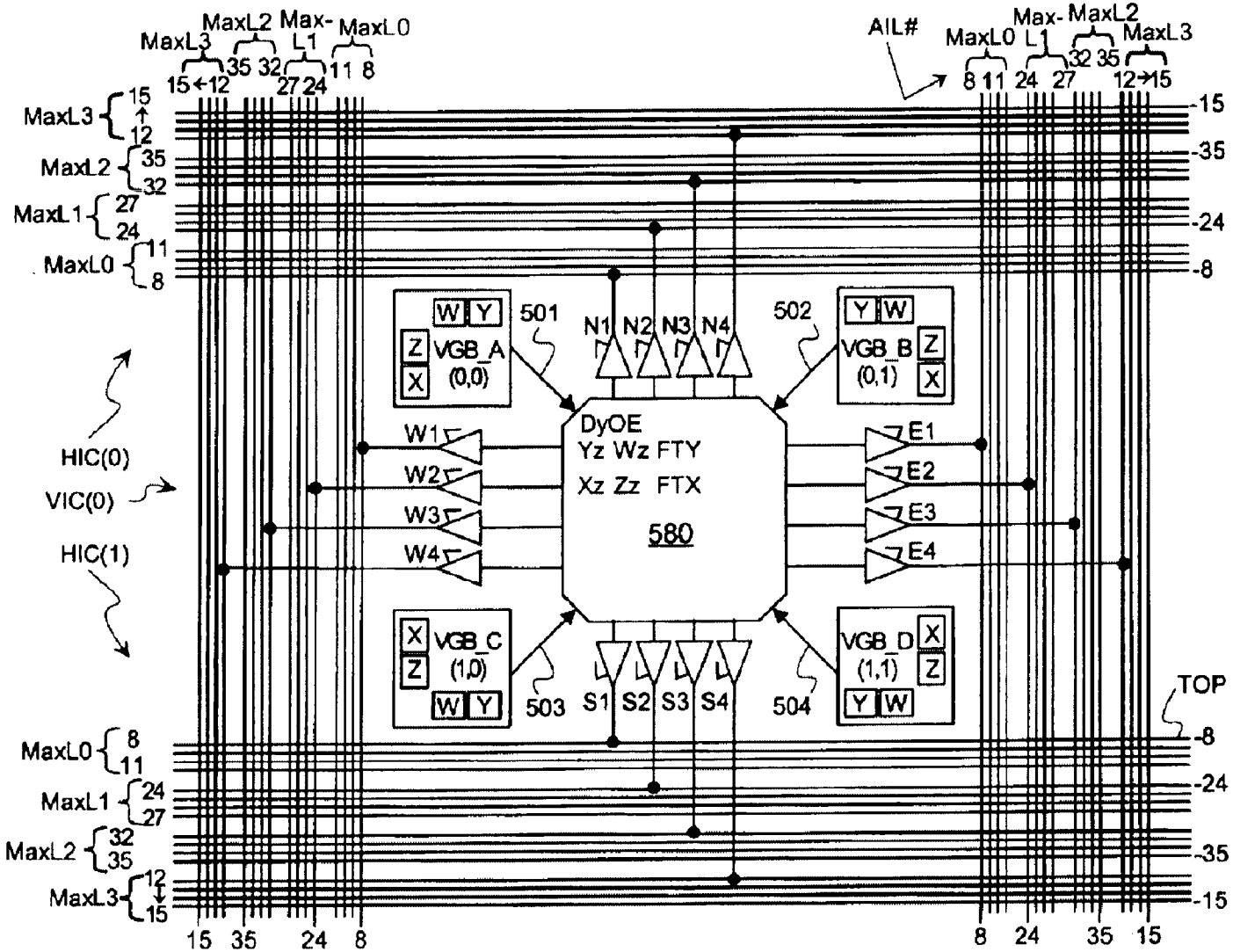
FIG. 5 illustrates how MaxL line drivers of respective SVGB's are coupled to surrounding interconnect channels.

Aside from having dedicated 2/4/8xL drivers in each CBB, there are shared big drivers (tristateable MaxL drivers) at the center of each super-VGB for driving the MaxL lines of the surrounding horizontal and vertical interconnect channels (HIC's and VIC's). Referring to FIG. 5, a scheme for connecting the shared big drivers (MaxL drivers) to the adjacent MaxL interconnect lines is shown for the case of super-VGB (0,0). This super-VGB (also shown as 101 in FIG. 1) is surrounded by horizontal interconnect channels (HIC's) 0 and 1 and by vertical interconnect channels (VIC's) 0 and 1. The encompassed VGB's are enumerated as A=(0,O), B=(0,1), C=(1,0) and D=(1,1). A shared big logic portion of the SVGB is shown at 580. Shared big logic portion 580 receives input/control signals 501, 502, 503, 504 and responsively sends corresponding data and control signals to sixteen, three-state (tristate) longline driving amplifiers that are distributed symmetrically relative to the north, east, south and west sides of the SVGB. The sixteen, tristate drivers are respectfully denoted as: N1 through N4, E1 through E4, S1 through S4, and W1 through W4. Angled line 501 represents the supplying of generically-identified signals: DyOE, Yz, Wz, Xz, Zz, FTY(1,2) and FTX(1,2) to block 580 from VGB_A. DyOE is a dynamic output enable control. Yz, Wz, Xz; Zz are respective result signals from the Y, W, X, Z CBB's of VGB_A. FTY(1,2) and FTX(1,2) are feedthrough signals passed respectively through the Y and X CBB's of VGB_A. Angled lines 502, 503 and 504 similarly and respectively represent the supplying of the above generically-identified signals to block 580 respectively from VGB_B, VGB_C and VGB_D.

Note that the tristate (3-state) nature of the shared big drivers means that signals may be output in time multiplexed fashion onto the MaxL lines at respective time slots from respective, bus-mastering ones of the SVGB's along a given interconnect channel.

The adjacent MaxL interconnect lines are subdivided in each HIC or VIC into four groups of 4 MaxL lines each. These groups are respectively named MaxL0, MaxL1, MaxL2 and MaxL3 as one moves radially out from the core of the super-VGB. MaxL drivers N1 through N4 respectively connect to the closest to the core, lines of respective groups MaxL0, MaxL1, MaxL2 and MaxL3 of the adjacent north HIC.

MaxL drivers E1 through E4 similarly and respectively connect to the closest to the core ones of MaxL lines in respective groups MaxL0–MaxL3 of the adjacent east VIC. MaxL drivers S1 through S4 similarly and respectively connect to the closest to the core ones of MaxL lines in respective groups MaxL0–MaxL3 of the adjacent south HIC. MaxL drivers W1 through W4 similarly and respectively connect to the closest to the core ones of MaxL lines in respective groups MaxL0–MaxL3 of the adjacent west vertical interconnect channel (VIC(0)).

As one steps right to a next super-VGB (not shown), the N1-N4 connections move up by one line in each of the respective groups MaxL0–MaxL3, until the top most line is reached in each group, and then the connections wrap around to the bottom most line for the next super-VGB to the right and the scheme repeats.

A similarly changing pattern applies for the southern drives. As one steps right to a next super-VGB (not shown), the S1–S4 connections move down by one line in each of the respective groups MaxL0–MaxL3, until the bottom most line is reached in each group, and then the connections wrap around to the top most line for the next super-VGB to the right and the scheme repeats.

A similarly changing pattern applies for the eastern and western drives. As one steps down to a next super-VGB (not shown), the E1–E4 and W1–W4 connections move outwardly by one line in each of the respective groups MaxL0–MaxL3, until the outer most line is reached in each group, and then the connections wrap around to the inner most line of each group for the next super-VGB down and the scheme repeats. Thus, on each MaxL line, there are multiple tristate drivers that can inject a signal into that given MaxL line.

The group of MaxL lines in each channel that are driven by tristate drivers of FIG. 5 are referred to herein as the 'TOP' set. This TOP set comprises AIL's #8, #24, #32 and #12 of respective groups MaxL0, MaxL1, MaxL2 and MaxL3. (The designation of this set as being TOP is arbitrary and coincides with the label TOP in the right bottom corner of FIG. 5 as applied to the bottom MaxL0 group.)

In similar fashion, the group of MaxL lines in each channel that are driven by tristate drivers of the next to the right SVGB are referred to herein as the '2ND' set. This 2ND set comprises AIL's #9, #25, #33 and #13. The group of MaxL lines in each channel that are driven by tristate drivers of the twice over to the right SVGB are referred to herein as the '3RD' set. This 3RD set comprises AIL's #10, #26, #34 and #14. The group of MaxL lines in each channel that are driven by tristate drivers of the thrice over to the right SVGB are referred to herein as the 'BOT' set. This BOT set comprises AIL's #11, #27, #35 and #15.

Figure 7A:
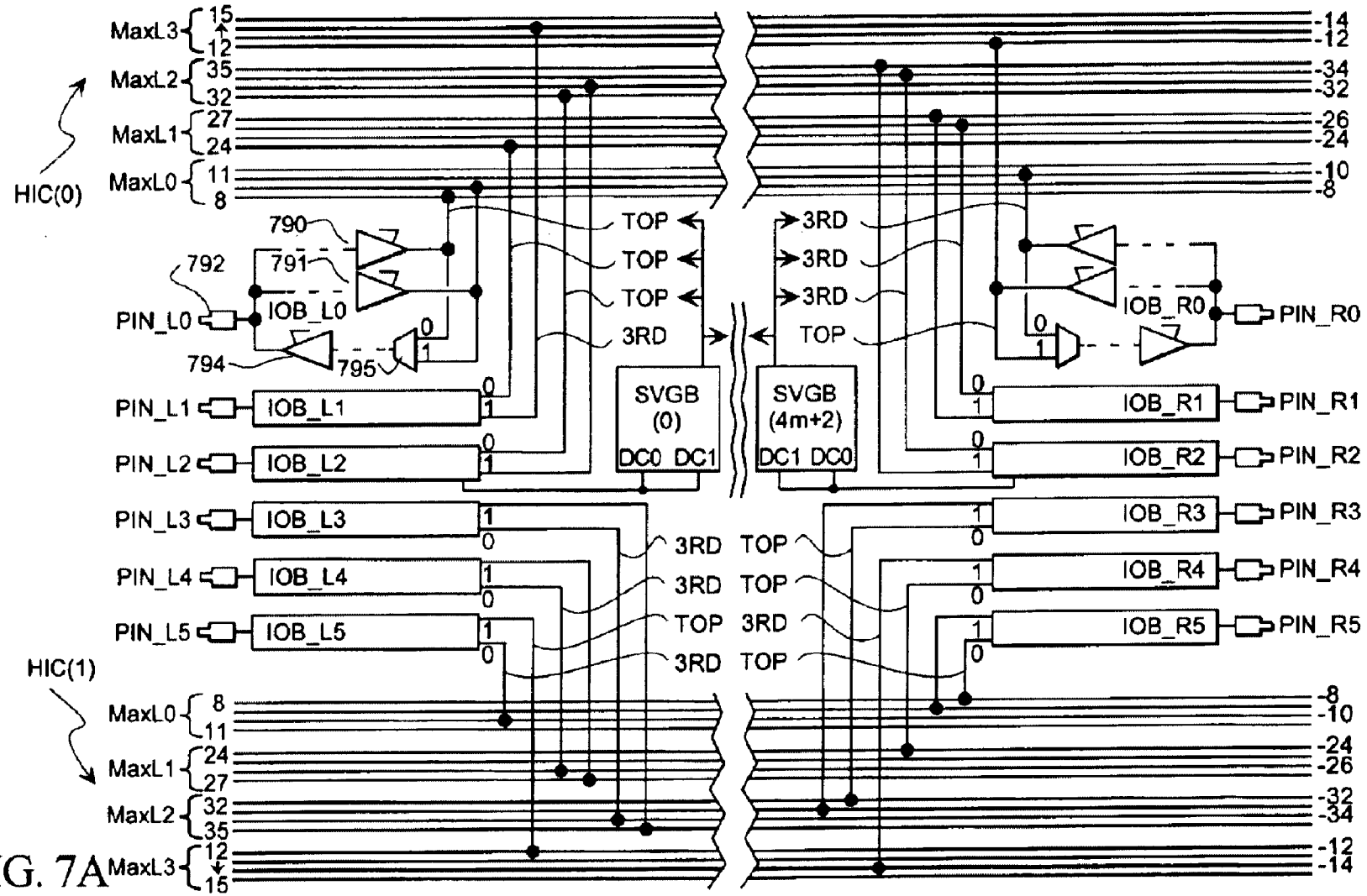
FIG. 7A illustrates how the MaxL line drivers of respective IOB's are coupled to surrounding interconnect channels in one embodiment of the invention.

FIG. 7A illustrates how IOB's interface with the MaxL lines, and in particular the TOP set of AIL's #8, #24, #32 and #12; and the 3RD set of AIL's #10, #26, #34 and #14.

Internal details of each IOB are not germane to the immediate discussion and are thus not fully shown in FIG. 7A. However, as shown in FIG. 7A, each IOB such as IOB_LO (at the top, left) includes two longline driving tristate drivers 790 and 791 for driving a respective pair of MaxL lines. The illustrated tristate drivers 790 and 791 for example, respectively drive TOP AIL #8 and 2ND AIL #9. Input signals of the respective two longline driving tristate drivers, 790 and 791, may be configurably derived from a number of sources including external I/O pin 792 of the corresponding FPGA device (e.g., 100 of FIG. 1). Other sources include one or both of two bypassable and serially-coupled registers within each IOB as will be seen in FIG. 7B.

Each IOB of FIG. 7A, such as IOB_LO; further includes a pin-driving tristate driver (with configurably-variable slew rate) such as shown at 794. Input signals of the pin-driving tristate driver 794 may be configurably derived from a number of sources including from user-configurable multiplexer 795. Two of the selectable inputs of multiplexer 795 are coupled to the same two longlines driven by that same IOB. In the case of IOB_LO for example, that would be TOP AIL #8 and 2ND AIL #9.

The remaining IOB's shown in FIG. 7A have similar internal structures. As seen, at the left side of the FPGA device, between even-numbered HIC(0) and oddnumbered HIC(1), there are provided six IOB's respectively identified as IOB_LO through IOB_L5. At the right side of the FPGA device there are further provided six more IOB's respectively identified as IOB_RO through IOB_R5. The external I/O pins are similarly identified as PIN_RO through PIN_R5 on the right side and as PIN_LO through PIN_L5 on the left side. The same connection pattern repeats between every successive set of even and odd-numbered HIC's. FIG. 7A may be rotated ninety degrees to thereby illustrate the IOB-to-MaxL lines connectivity pattern for the VIC's as well. (References to horizontal lines will of course be changed to vertical and references to left and right IOB's will of course be changed to top and bottom.)

On the left side, IOB_L0, IOB_L1 and IOB_L2 collectively provide bidirectional coupling at least to 3 TOP longlines (AIL's #8, #24, #32) and 1 3RD longline (AIL #14) in the adjacent even-numbered HIC(0). On the right side, IOB_R0, IOB_R1 and IOB_R2 collectively provide bidirectional coupling at least to 3 3RD longlines (AIL's #10, #26, #34) and 1 TOP longline (AIL #12) in the adjacent and same even-numbered HIC(0). The combination of the six IOB's of HIC(0) therefore allow for bidirectional coupling of nibble-wide data either to the TOP set ((AIL's #8, #24, #32 and #12) and/or to the 3RD set (AIL's #10, #26, #34 and #14).

As seen in the bottom half of FIG. 7A, on the left side, IOB_L5, IOB_L4 and IOB_L3 collectively provide bidirectional coupling at least to 3 3RD longlines (AIL's #10, #26, #34) and 1 TOP longline (AIL #12) in the adjacent odd-numbered HIC(1). On the right side, IOB_R5, IOB_R4 and IOB_R3 collectively provide bidirectional coupling at least to 3 TOP longlines (AIL's #8, #24, #32) and 1 3RD longline (AIL #14) in the same odd-numbered HIC(1). The combination of the six IOB's of HIC(1) therefore allow for bidirectional coupling of nibble-wide data either to the TOP set (AIL's #8, #24, #32 and #12) and/or to the 3RD set (AIL's #10, #26, #34 and #14) of the odd-numbered, adjacent HIC.

In addition to the above-described couplings between the IOB's and the MaxL lines of the interconnect mesh, IOB's also couple by way of direct connect wires to peripheral ones of the SVGB's for both input and output. More specifically, there are direct connect wires connecting the left-side IOB's (IOB_L0 through IOB_LS) to adjacent SVGB's of super column number 0. Two such wires are represented as DC1 and DC2 coupling IOB_L2 to the illustrated column-0 SVGB. FIG. 7A indicates that the super column 0 SVGB's can drive the same TOP set of longlines (AIL's #8, #24, #32 and #12) that may be driven by the IOB's, and as will later be seen, by the embedded memory.

There are further direct connect wires connecting the right-side IOB's (IOB_R0 through IOB_R5) to adjacent SVGB's of the rightmost super column. The column number of the rightmost super column is preferably (but not necessarily) equal to an even integer that is not a multiple of four. In other words, it is equal to 4m+2 where m=1, 2, 3, etc. and the leftmost super column is numbered 0. That means there are a total of 4m+3 SVGB's per row. The latter implies that square SVGB matrices will be organized for example as 11×11, 13×13, 19×19, 23×23 SVGB's and so on. (If the same organizations are given in terms of VGB's, they become 22×22, 26×26, 38×38, 46×46 VGB's and so on.) The rightmost SVGB number (4m+2) connects by way of direct connect wires to the right-side IOB's. FIG. 7A indicates that these super column number 4m+2 SVGB's can drive the same 3RD set of longlines (AIL's #10, #26, #34 and #14) that may be driven by the IOB's, and as will later be seen, by the embedded memory.

In alternate embodiments, the extent of direct connect between IOB's to adjacent columns of SVGB's is increased from extending to just the most adjacent super column to extending to at least the first two or three nearest super columns. This allows the right-side IOB's to reach the SVGB's that drive the 3RD longline set with direct connections.

Aside from direct connect wires, IOB's may be further coupled to the SVGB's of the device by 2xL, 4xL, 8xL lines of the adjacent HIC's. Coupling between the IOB's and the 2xL, 4xL, 8xL lines of adjacent HIC's may be provided through a configurable dendrite structure that extends to the multiplexer 795 of each IOB from pairs of adjacent HIC's. The specific structure of such configurable dendrite structures (not shown) is not germane to the present disclosure. It is sufficient to understand that configurable coupling means are provided for providing coupling between the 2xL, 4xL, 8xL of the adjacent HIC's and the corresponding IOB's. A more detailed disclosure of dendrite structures may be found in the above-cited, US application Ser. No. 08/995,615.

Figure 7B:
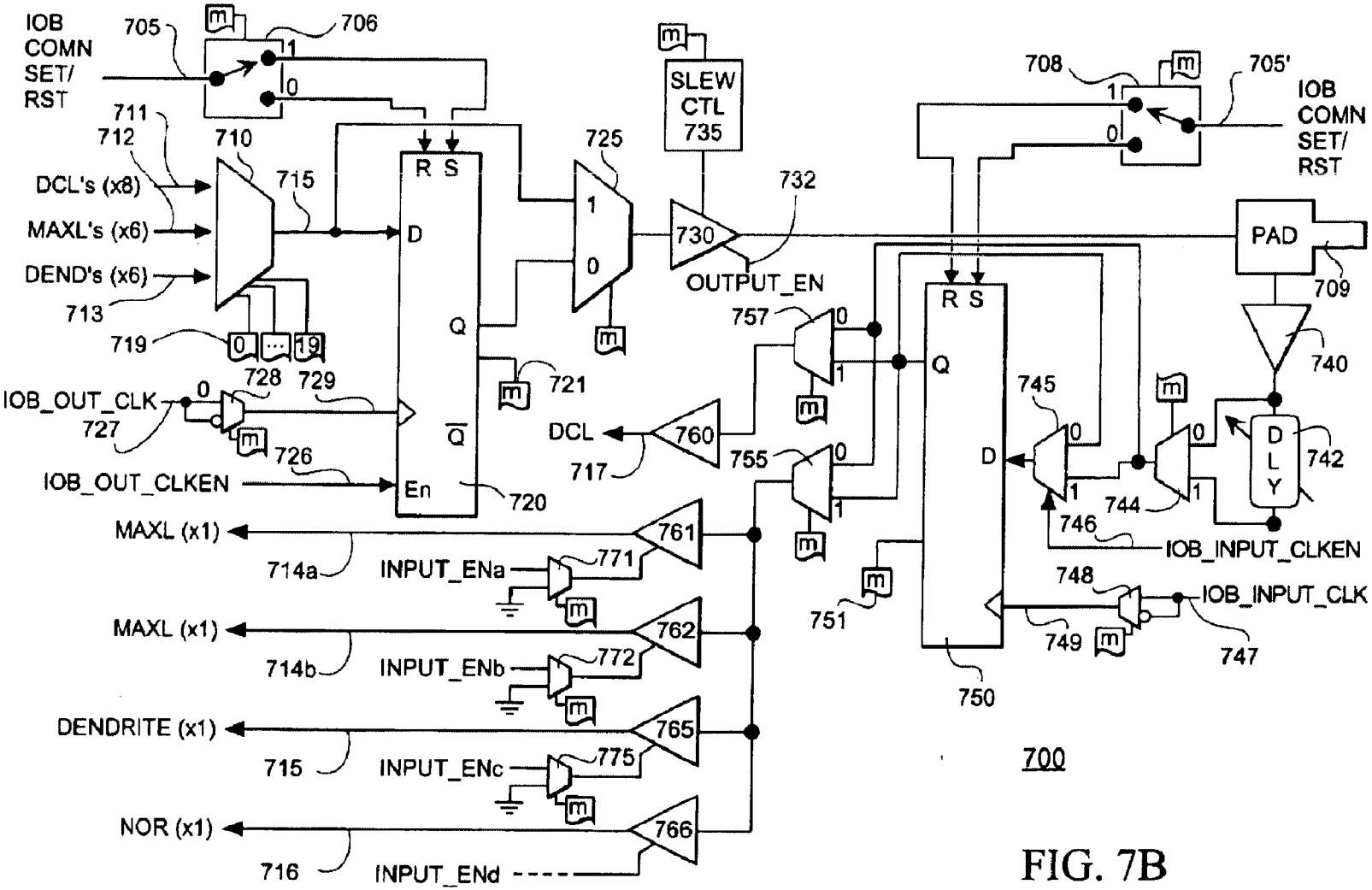
FIG. 7B illustrates internal components of an exemplary IOB (configurable Input/Output Block)having plural flip flops that are respectively responsive to respective IOB input and output clock signals.

FIG. 7B may now be referred to while keeping in mind the input/output structures of the surrounding SVGB's and IOB's as described above for respective FIGS. 1–5 and 7A. In FIG. 7B, control signals for synchronizing various I/O flows are shown in combination with elements that direct the I/O flows.

However, before describing these more complex structures of the IOB's, it will be beneficial to briefly refer to FIG. 6B and to describe data flow structures that can direct various dynamic signals to the D (645), clock (663), clock-enable (664), reset (651) and set (652) input terminals of CSE flip flop 667. It will be beneficial to also briefly describe data flow structures that can direct the Q output (669) of the CSE flip flop and/or register-bypassing alternate signals to various interconnect lines (2xL lines through MaxL lines).

Referring to 6B, an example is shown of a specific CSE 60Y that may be included within each Y CBB of each VGB. CSE 60Y is representative of like CSE's (Configurable Sequential Elements) that may be included in the respective others of the X, W and Z CBB's of each VGB. The signal processing results of the given CBB (e.g., the Y one) may respectively appear on lines 675 and 672 as signals $f_a$ (3T) and $f_b$(3T). Here, the notation $f_m$(nT) indicates any Boolean function of up to n independent input bits as produced by a user-programmable LUT (lookup table, not shown) identified as LUT m. The output of a synthesized 4-input LUT may appear on line 675 as signal $f_Y$(4T). The output of a synthesized 6-input LUT may appear on line 635 as signal $f_D$(6T). Alternatively, line 635 may receive a wide-gated signal denoted as $f_{WO}$(p) which can represent a limited subset of functions having up to p independent input bits. In one embodiment, p is 16. A result signal (SB3) produced by an in-CBB adder/subtractor logic (570 of FIG. 6A) appears on line 638. Configuration memory bits 639 are user-programmable so that multiplexer 640 can be instructed to route the result signal of a selected one of lines 675, 635 and 638 to its output line 645. As such, multiplexer 640 defines an example of a user-programmable, result-signal directing circuit that may be found in each CSE of the VGB 500A shown in FIG. 6A. Other result-signal directing circuits may be used as desired.

Each CSE includes at least one data storing flip-flop such as that illustrated at 667. Flip-flop 667 receives reset (RST) and set control signals 651 and 652 in addition to clock signal 663 and clock enable signal 664. A locally-derived control signal CTL1 is presented at line 655 while a VGB common enable is presented on line 654. Multiplexer 604 is programmably configurable to select one or the other of lines 654, 655 for presentation of the selected input signal onto output line 664. As explained above, lines 672, 675, 635 and 638 carry logic block (CBB) result signals. The control signals of lines 651 through 655 are derived from common controls section 550 of FIG. 6A. The common controls section 550 acquires a subset of neighboring signals from AIL's by way of the 14:1 Ctrl multiplexers and defines a further subset or derivative of these as VGBcommon control signals. The signals of lines 653, 654 and 655 may be used to control the timing of when states change at the outputs of respective line drivers 610 (DCL driver), 620 (to-tristate driver), 630 (2/8xL driver), 668 (FBL driver) and 670 (FBL driver). A more detailed explanation of such CBB-result signals may be found in at least one of the above-cited, copending applications.

With the three bits of configuration memory shown at 639 in FIG. 6B, a user can control multiplexer 640 to select an appropriate data signal 645 for supply to the D input of flip-flop 667. The selected signal may bypass the flipflop by routing through a user-programmable multiplexer 668 to line 608. Multiplexer 668 may be programmed to alternatively apply the Q output of flip-flop 667 to line 608. Buffer 610 drives a direct-connect line 612. Buffer 630 drives one or more of CBB-adjacent 2xL, 4xL or 8xL lines. Connection 636 is to a non-adjacent 2xL line (see FIG. 4). Items 632, 633, 634 and 638' represent PIP-like, programmable connections for progra mably interconnecting their respective co-linear lines. A more detailed explanation of the CSE structure and its other components may be found in at least one of the above-cited, copending applications. For purposes of the present application, it is to be understood that elements 620, 670, 632, 634, 638' and 633 define examples of user-programmable, stored-signal directing circuits that may be found in each CSE of the VGB 500A shown in FIG. 6A and may be used for directing the Q output of flip flop 667 to one or more interconnect resources such adjacent 2xL-8xL lines or MaxL lines. Other stored-signal directing circuits may be used as desired.

Referring to the IOB structure 700 shown in FIG. 7B, this IOB 700 may be used to provide a configurable interconnection between the input/output pin/pad 709 and neighboring, internal interconnect resources. The chip-internal interconnect resources may supply signals for output by IOB 700 to external circuits, where the external circuits (not shown) connect to I/O pin or pad 709. In particular, the internal interconnect resources that can supply such signals to an IOB first multiplexer 710 include a first plurality 711 of 8 direct connect lines (DCL's), a second plurality 712 of 6 MaxL lines, and a third plurality 713 of 6 dendrite lines (Dend's). The signal selected for output on line 715 of the multiplexer may be transmitted by way of register-bypass multiplexer 725 and pad-driving amplifier 730 for output through I/O pin/pad 709.

External signals may also be brought in by way of I/O pin/pad 709 for transfer by the IOB 700 to one or more of a fourth plurality 714a,b of two MaxL lines, and to one dendrite line 715, and NOR line 716, and one direct connect line 717. Lines 714a and 714b are each connected to a respective MaxL line. Line 716 operates in open-collector mode such that it can be resistively urged to a normally-high state and can be pulled low by one or more open-collector drivers such as driver 766. The illustrated INPUT_ENd line couples to a gate of one of plural, in series pull-down MOSFET transistors (not shown) in 766 that can sink current from the NOR line 716.

IOB 700 includes a first register/latch 720 for storing a respective first output signal. This first output signal is supplied to a D input of unit 720 by line 715. A plurality 719 of 20 configuration memory cells determines which interconnect resource will supply the signal to line 715. In an alternate embodiment, a combination (not shown) of a decoder and a fewer number of configuration memory cells may be used to select a signal on one of lines 711–713 for output on line 715.

IOB 700 includes a second register/latch 750 for storing an input signal supplied to a D input thereof by a dynamic multiplexer 745. Input signals may flow from pad 709, through input buffer 740, through user-programmable delay 742 and/or through delay-bypass multiplexer 744 to one input terminal of dynamic multiplexer 745. A second input terminal of dynamic multiplexer 745 couples to the Q output of the second register/latch 750. The selection made by multiplexer 745 is dynamically controlled by an IOB INPUT_CLKEN signal supplied on line 746.

A plurality of control signals may be input to IOB 700 for controlling its internal operations. These include input enable signals, INPUT_ENa, INPUT_ENb, INPUT_ENc, and INPUT_ENd. Input enable signals, INPUT_ENa, INPUT_ENb, and INPUT_ENC respectively drive the output enable terminals of respective tristate drivers 761, 762 and 765. The INPUT_ENd signal selectively enables the pull-down function of open-collector (open-drain) driver 766 as explained above. A respective plurality of four deactivating multiplexers 771, 772, 775 and one more (not shown) for 766 are provided for user-programmable deactivation of one or more of the respective tristate drivers 761, 762 and 765, and of driver 766. In one embodiment, all of input enable signals, INPUT_ENa, INPUT_ENb, INPUT_ENc, and INPUT_ENd are tied together and designated simply as a common INPUT_EN signal. In an alternate embodiment, just the INPUT_ENa and INPUT_ENb enable signals are tied together and designated as a common and dynamically changeable, INPUT_EN signal while each of the INPUT_ENc and INPUT_ENd lines are tied to Vcc (set to logic '1').

Further control signals that may be supplied to IOB 700 include an INPUT CLOCK signal (INPUT_CLK) on line 747, the INPUT_CLKEN signal on line 746, an OUTPUT_EN signal that couples to the QE terminal 732 of tristate driver 730, an OUTPUT_CLOCK signal on line 727, an OUTPUT_CLKEN signal on line 726, and a COMMON SET/RST signal on lines 705 and 705'. These control signals may be acquired from adjacent interconnect lines by one or more IOB control multiplexers such as the one illustrated in FIG. 7C.

As illustrated in FIG. 7B, programmable memory bits in the FPGA configuration memory may be used to control static multiplexers such as 728, 748, etc. to provide programmable polarity selection and other respective functions. Static single-pole double-throw electronic switches 706 and 708 are further controlled by respective configuration memory bits (m) so that the COMMON SET/RST signal of lines 705, 705' can be used to simultaneously reset both of register/latches 720 and 750, or simultaneously set both of them, or set one while resetting the other.

An output of register by-pass multiplexer 725 is coupled to pad driving amplifier 730. The amplifier 730 is controllable by a user-programmable, slew rate control circuit 735. The slew rate control circuit 735 allows the output of pad driving amplifier 730 to either have a predefined, relatively fast or comparatively slow rise time subject to the state of the memory bit (m) controlling that function. The OUTPUT_EN signal supplied to terminal 732 of the pad driving amplifier 730 may be used switch the output of amplifier 730 into a high-impedance state so that other tristate drivers (external to the FPGA chip) can drive pad 709 without contention from driver 730.

External signals may be input to IOB 700 as explained above via pin 709 and input buffer 740. In one embodiment, the user-programmable delay element 742 comprises a chain of inverters each having pull-down transistors with relatively large channel lengths as compared to logic inverters of the same chip. The longer channel lengths provide a higher resistance for current sinking and thus increase the RC response time of the inverter. A plurality of user-programmable, internal multiplexers (not shown) of delay unit 742 define the number of inverters that a delayed signal passes through. The user-programmable delay element 742 may be used to delay incoming signals for the purpose of deskewing data signals or providing a near-zero hold time for register/latch 750. A global clock signal (GK) of the FPGA array may be used for example as a source for the INPUT_CLOCK signal of line 746. Due to clock skew, the global clock signal may not reach register/latch 750 before a data signal is provided to the D input of register/latch 750. In such a situation, the variable delay function of element 742 may be used to delay incoming data signals acquired by buffer 740 so they can align more closely with clock edges provided on clock input terminal 749 of register 742.

Each of configurable input register/latches 720 and 750 can be configured to operate either as a latch or as a register, in response to a respective memory bit setting (721, 751) in the configuration memory. When the respective register/latch (720 or 740) operates as a register, data at its D input terminal is captured for storage and transferred to the its Q output terminal on the rising edge of the register's CLOCK signal (729 or 749). When the register/latch operates as a latch, any data change at D is captured and seen at Q while the signal on the corresponding CLOCK line (729 or 749) is at logic '1' (high). When the signal on the CLOCK line returns to the logic '0' state (e.g., low), the output state of Q is frozen in the present state, and any further change on D will not affect the condition of Q while CLOCK remains at logic '0'.

A COMMON SET/RST signal may be generated from a VGB to all IOBs or to a subset of IOBs in order to set or reset the respective latches (720, 750) in the affected IOB's. The COMMON SET/RST signal may also be generated by peripheral device that is coupled to the FPGA array by way of a particular IOB.

The Q output of register/latch 750 couples to respective first input terminals of a plurality of user-programmable, register-bypassing multiplexers 755 and 757. Multiplexer 757 drives direct connect amplifier 760 while multiplexer 755 drives amplifiers 761, 762, 765 and 766. Respective second input terminals of register-bypassing multiplexers 755 and 757 receive a register-bypassing signal from the output of delay-enabling multiplexer 744.

Referring to briefly back to FIG. 7A, for one subspecies of this embodiment, element 790 and 791 respectively correspond to elements 761 and 762 of FIG. 7B while element 794 corresponds to element 730 and element 795 corresponds to element 710. While the specific embodiment of FIG. 7B uses plural flip flops respectively for storing input and output signals, it is also within the contemplation of the invention to use a single flip flop for at different times storing either an input or output signal and for directing respective clock and clock enable control signals to that one flip flop in accordance with its usage at those different times.

Figure 7C:
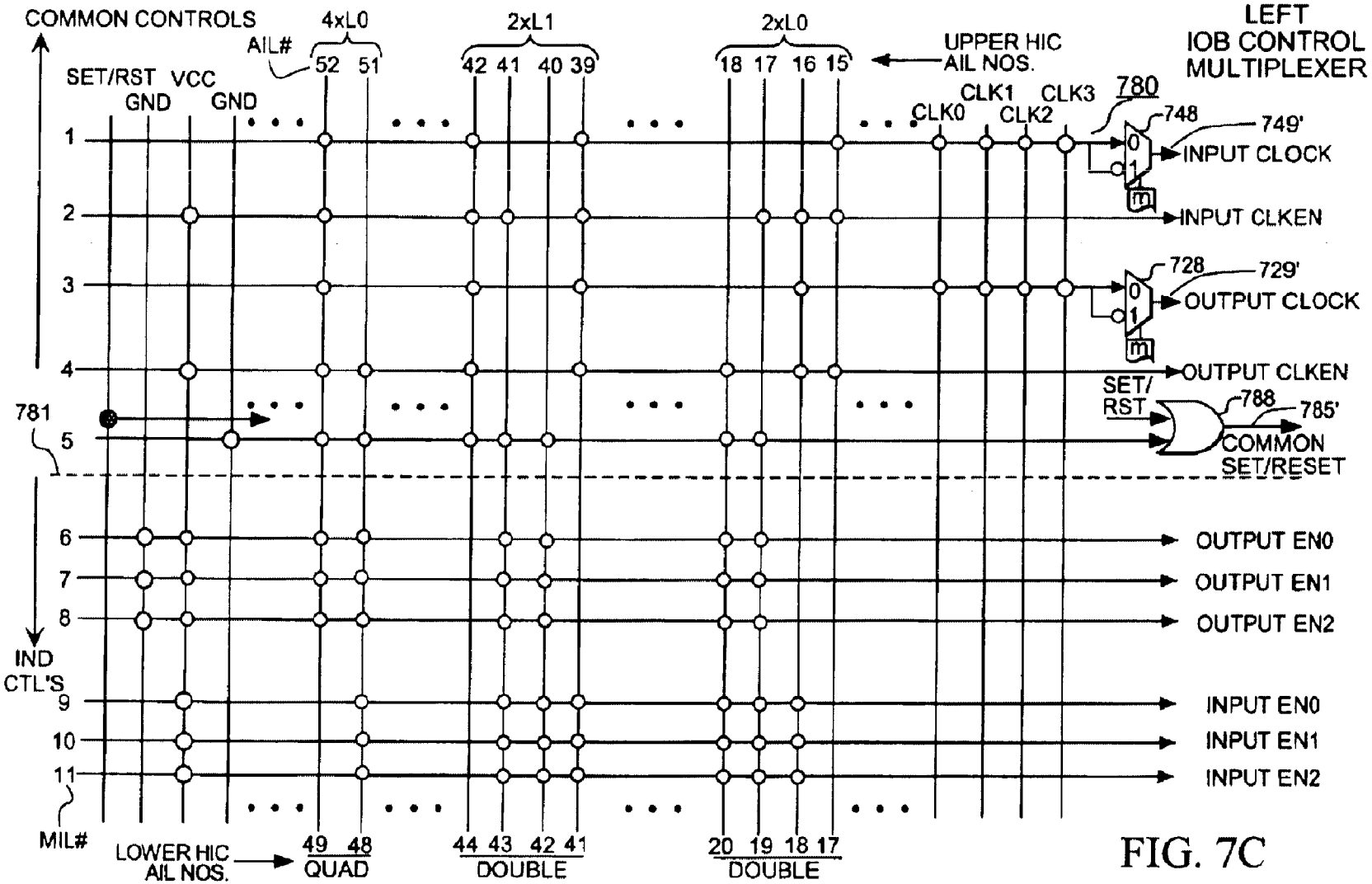
FIG. 7C illustrates an exemplary IOB controls-acquiring multiplexer that may be used for acquiring respective IOB input and output clock signals from neighboring interconnect lines.

Referring to FIG. 7C, the control signals that are used for a plurality of neighboring IOB's (which plurality is at least equal to 3 in one embodiment) may be derived from interconnect channels that extend perpendicular to the array edge on which the corresponding IOB's reside. In the example of FIG. 7C, a plurality of 6 co-controlled IOB's reside on a left edge and are neighbored by an immediately above or upper HIC and by an immediately below or lower HIC. The 6 co-controlled IOB's are divided into two nonoverlapping subsets of 3 immediately adjacent IOB's. Each subset of 3 immediately adjacent IOB's has its own 'common' control signals which are shown above dashed line 781 and 'individual' controls which are shown below dashed line 781. For each such subset of 3 immediately adjacent IOB's there is a first stage multiplexer (not shown) which selects whether the immediately upper or immediately lower channel will supply the control signals. The successive second stage multiplexer is illustrated as 780 in FIG. 7C. This second stage multiplexer 780 determines which specific signals from the elected channel will be used.

The illustrated, 'left side', IOB control multiplexer 780 comprises a plurality of eleven multiplexer input lines designated as MILs #1–11. A partially-populating set of PIP's is distributed as shown over the crosspoints of MILs #1–11 and illustrated lines of the elected HIC (upper or lower) for transferring a signal from a desired HIC line to the respective MIL line. Each AIL has 8 PIP's along it for the embodiment of FIG. 7C while each MIL also has 8 PIP's along it. This allows for symmetric loading of lines.

MIL #1 for example, may be used to transfer to multiplexer 748 a control signal from AIL numbers 15, 39, 42 and 52 of the upper HIC when the upper HIC is elected or from AIL numbers 17, 41, 44 and 49 of the lower HIC when the lower HIC is elected. The other four PIP's of MIL #1 are coupled to the four global clock lines, CLK0–CLK3 of the FPGA array. Polarity-selecting multiplexer 748 is essentially the same as that shown in FIG. 7A except that for embodiments that follow FIG. 7C, clock line 749' connects directly to the clock inputs of each corresponding register 750 of the 3 IOB's in the controls-sharing group.

Similarly, for MIL #3, polarity-selecting multiplexer 728 is essentially the same as that shown in FIG. 7A except that for embodiments that follow FIG. 7C, clock line 729' connects directly to the clock inputs of each corresponding register 720 of the 3 IOB's in the controls-sharing group.

MIL #5 can provide a local set or reset signal which is logically ORred in OR gate 788 with the FPGA array's global SET/RST signal. Output 785' of the OR gate connects directly to the common SET/RST lines 705, 705' of each corresponding IOB in the controls-sharing group of IOB's. If a local set or reset signal is not being used, MIL #5 should be programmably coupled to ground by the PIP crossing with the GND line.

MIL #6, 7, and 8 may be used to define individual IOB control signals OUTPUT ENO, OUTPUT ENI, OUTPUT EN2 respectively to the OUTPUT EN terminal of each of a first, second, third IOB of the control-sharing group. MILs #9, 10, 11 may be used to define individual IOB control signals INPUT EN0, INPUT EN1, INPUT EN2 respectively to the INPUT EN terminal of each of the first, second, and third IOB of the control-sharing group. Other means are of course possible for acquiring a subset of signals from the AIL's of each IOB and defining therefrom the control signals of the IOB. The connection between these aspects of the IOB's and the control signals that are used for controlling the embedded memory blocks of the same FPGA array will become apparent below.

Figure 8:
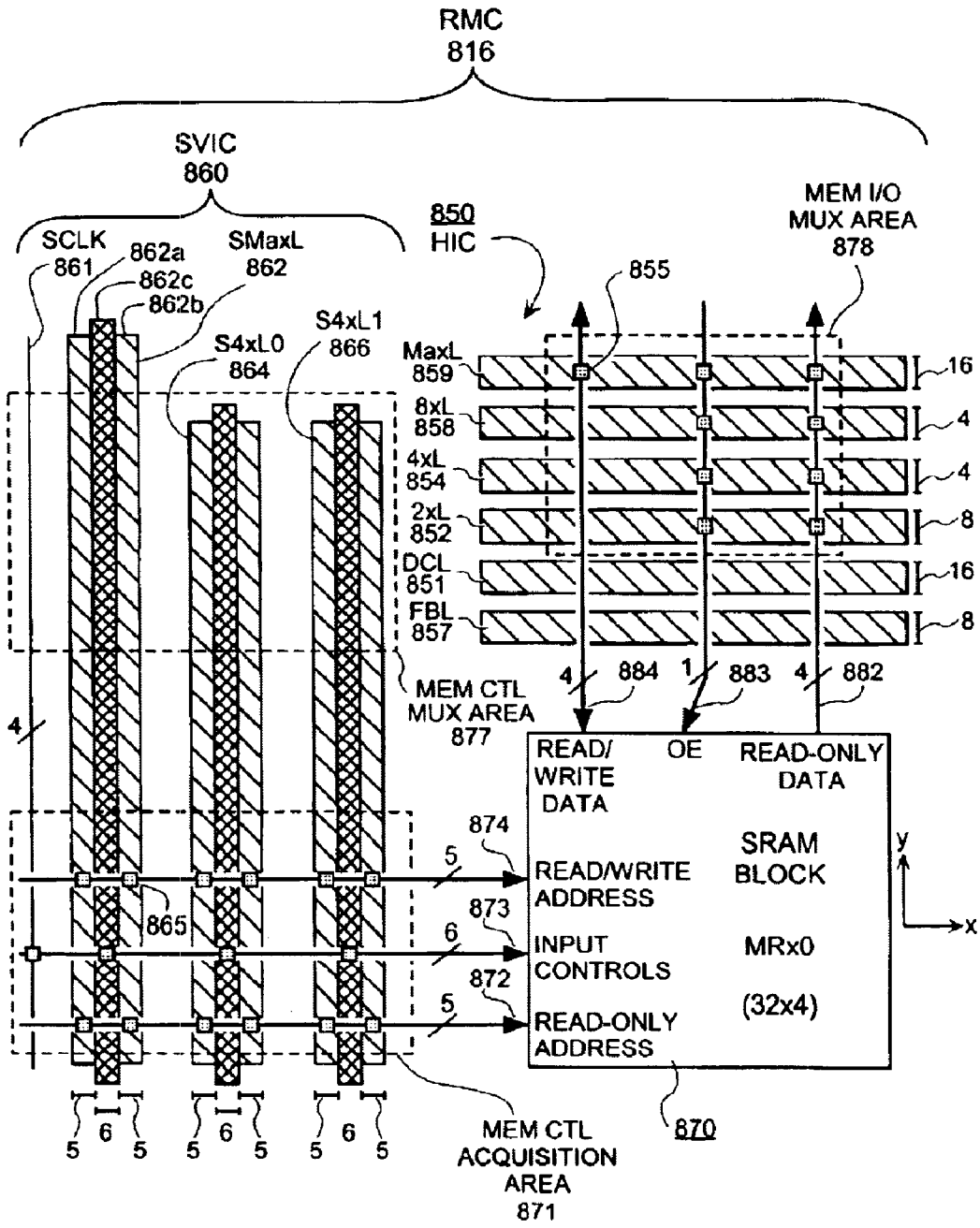
FIG. 8 is a further magnified illustration of one embodiment of FIG. 3, showing further details of a Right Memory Column (RMC), and in particular of a given SRAM block in accordance with the invention and its neighboring interconnect channels.

Referring now to FIG. 8, a right memory channel (RMC) is broadly shown at 816. The RMC 816 includes a special vertical interconnect channel (SVIC) as shown under the braces of 860 and a memory block as shown at 870.

A horizontal interconnect channel (HIC) that belongs to the general interconnect of the FPGA array is shown passing through at 850. Darkened squares such as at 855 are used to indicate general areas of possible interconnection (e.g., PIP connections) to various portions of the passing-through HIC. Memory I/O multiplexer area 878 (first dashed box) corresponds to area 478 of FIG. 3. Memory control multiplexer area 877 (second dashed box) corresponds to area 477 of FIG. 3. Memory control acquisition area 871 (third dashed box) corresponds to symbol 471 of FIG. 3.

Memory block 870 contains a multi-ported SRAM array organized as 32-by-4 bits (for a total of 128 bits). One of the ports is of a read-only type as indicated at 882. Another port is bidirectional and provides for both reading of nibble-wide data out of memory block 870 and for writing of nibble-wide data into memory block 870 as indicated at 884. Output enable terminal 883 cooperates with the read/write data port 884, as will be explained shortly. For sake of convenience, the read/write port 884 is also be referred to herein as the first port, or Port_1. The read-only data port 882 is referred to as the second port, or Port_2.

Two different address signals may be simultaneously applied to memory block 870 for respectively defining the target nibble (4 data bits) that are to pass through each of first and second data ports, 884 and 882. As such, a 5-bit wide first address-receiving port 874 is provided in block 870 for receiving address signals for the read/write data port 884 (Port_1). A second 5-bit wide address-input port 872 is provided for receiving independent address signals for association with the read-only data port 882 (Port_2). Additionally, a 6-bit wide controls-input port 873 is provided in block 870 for receiving various control signals from the adjacent SVIC 860 as will be detailed shortly. The respective combination of 5, 6, and 5 (address, control, address) lines adds up to a total of 16 such lines.

SVIC 860 contains a diversified set of special-function interconnect lines. A first set of four longlines are dedicated to carrying the CLK0–CLK3 clock signals of the FPGA array. This set of four clock lines is denoted as SCLK bus 861.

Another set of sixteen longlines is illustrated at 862 and identified as special maximum length lines (SMaxL). Like the other longlines of integrated circuit 100, the SMaxL lines 862 extend continuously and fully over a corresponding working dimension of the FPGA matrix. The SMaxL lines 862 are subdivided into respective groups of 5, 6 and 5 lines each as denoted by identifiers 862a, 862c and 862b. Configurable interconnections of these respective components 862a–c with crossing buses 872–874 are denoted by darkened squares such as at 865. It is seen from the darkened square icons of FIG. 8 that either of the 5-bit wide longline components 862a or 862b can supply a 5-bit wide address signal to either one or both of address-input ports 874 and 872. Similarly, the 6-bit wide vertical longline component 862c may be used for supplying all six of the control signals supplied to 6-bit wide port 873.

SVIC 860 further includes two sets of special, quad-length lines respectively denoted as S4×L0 and S4×L1. These sets of quad-lines are respectively illustrated at 864 and 866 as being each sixteen lines wide. In each set of quad lines, the set is further subdivided into respective components of five, six and five lines (5/6/5) in the same manner that wires-group 862 was. Again, darkened squares are used to indicate the provision of configurable interconnections to the respective ports 872, 873 and 874 of memory block 870. Unlike the staggered organization of the general quad-length lines (4×L lines) shown in FIG. 2, in one embodiment of the FPGA device 100 the special, quad-length lines in the two sets, S4×L0 (864) and S4×L1 (866) are not staggered and are not joined one to the next by switch boxes. This non-staggered organization allows for simultaneous broadcast to a group of as many as 4 adjacent SRAM blocks (4×4×32 bits of memory) of five bits of address signals for each respective address port (874, 872) and/or six bits of control signals for each respective control port (873). Omission of switch boxes in the two special quad-length sets, S4×L0 (864) and S4×L1 (866), helps to reduce capacitive loading and thereby helps to speed the transmission of address and/or control signals to ports 872, 873, 874 by way of S4×L0 (864) and S4×L1 (866).

Memory control acquisition area 871 (dashed box) is defined by the darkened square connections of SVIC 860 to ports 872, 873, 874 of block 870. The memory control acquisition area 871 may be configured by the FPGA user such that the five bits of the read-only address input port 872 may be acquired from the five-bit wide components of any one of line sets 862, 864 and 866. Similarly, the five-bit address signal of the read/write input port 874 may be acquired from any one of these vertical line subsets. The six control signals of input controls port 873 may be acquired partially from the SCLK bus 861 and/or fully from any one of the six-bit wide components of vertical line sets 862, 864 and 866.

FPGA-wide address or control signals that are common to a given embedded memory column 114/116 may be broadcast as such over longlines such as that of SVIC components 861 and 862. More localized address or control signals that are common to a given section of an embedded memory column 114/116 may be broadcast as such over S4×L components 864 and 866 of the SVIC.

HIC 850 crosses with SVIC 860 in the region of memory control multiplexer area 877. As seen in FIG. 8, HIC 850 also has a set of subcomponents. More specifically, there are sixteen longlines denoted at 859 as the MaxL set. There are four octal-length lines denoted at 858 as the 8×L set. There are four quad-length lines denoted at 854 as the 4×L set. There are eight double-length lines denoted at 852 as the 2×L set. Furthermore, there are sixteen direct-connect lines denoted at 851 as the DCL set. Moreover, there are eight feedback lines denoted at 857 as the FBL set. Nibble-wide data transmission is facilitated by the presentation of each of these diversified interconnect resources (851, 852, 854, 857–859) as a number of wires, where the number is an integer multiple of 4.

Within the dashed box of FIG. 8 that is designated as memory I/O multiplexer area 878, darkened sources are provided to show the general interconnections that may be formed (in accordance with one embodiment) between HIC 850 and the buses extending from ports 882, 883 and 884 of the memory block 870. As seen, in this embodiment, the read/write data port 884 (Port_1) is restricted to configurable connections only with the MaxL set 859. This restriction allows for run-time switching between read and write modes. It should be recalled from FIGS. 7A–7B that the longlines of the MaxL set 859 can be driven by tristate drivers of the adjacent SVGB's and/or IOB's. As will be seen in FIG. 9, the read/write data port 884 (Port_1) also has tristate drive capability. Data can thus be output onto the tristateable MaxL set 859 by a given bus master (SVGB or IOB) that wants to write data into the read/write data port 884 (Port_1) or output onto the tristateable MaxL set 859 by Port_1 itself when Port_1 (884) is in a read mode.

The read-only data port 882 (Port_2) can output data signals, in accordance with the illustrated interconnect possibilities, to any one or more of the MaxL set 859, the 8×L set 858, the 4×L set 854 and the 2×L set 852.

Output enable signals may be acquired by port 883 in accordance with the illustrated interconnect possibilities, from one of sets 859, 858, 854 and 852.

It is within the contemplation of the invention to have other patterns of interconnect coupling possibilities in multiplexer area 878. However, for one embodiment of SRAM block 870, the particular intercoupling possibilities shown in 878 is preferred for the following reasons. The read-only data port 882 (Port_2) tends to output read data at a faster rate than does the read/write data port 884 (Port_1). As such, it is particularly useful to be able to output this more-quickly accessed data (from Port_2) by way of the shorter-length (and thus faster) 2×L lines 852. A user-configurable multiplexer coupling is therefore provided from the read-only data port 882 to the 2×L lines set 852. Additional user-configurable multiplexer couplings are further provided to line sets 854, 858 and 859.

The writing of data into port 884 or the reading of data from port 884 tends to be a relatively slower process as compared to the reading of data from port 882. At the same time, it is desirable to be able to source data into port 884 from any column of the FPGA device 100 (FIG. 1) and/or from any column of IOB's (1–24, 49–72). User-configurable multiplexer connections 855 are therefore provided for bi-directional and tristateable transfer of data between the read/write data port 884 and the MaxL lines set 859. However, it is not desirable to have further user-configurable interconnections between read/write data port 884 and the other, not-tristateable line sets 858, 854, 852, 851 and 857 of HIC 850. Converting the other line sets 858, 854, 852, 851 and 857 of HIC 850 into tristateable lines would consume additional space in the integrated circuit 100 because the 2/4/8×L outputs (FIG. 4) of the CBB's would have to be converted into tristate drivers for this one purpose without providing substantial improvement in speed and performance. As such, in a preferred embodiment, the read/write data port 884 (Port_1) is couplable only to the adjacent MaxL lines set 859.

It will be seen later (in the embodiment of FIG. 9), that the OE port 883 may be used to time the outputting of time-multiplexed data from port 884. The output data may be pre-stored in a Port_1 read-register (not shown in FIG. 8). As such, high-speed coupling of control signals to port 883 may be desirable even if the Port_1 data portion 884 couples only to longlines 859. Data may be time-multiplexed onto longlines 859 at relatively high switching speed by using the high-speed enabling function of the OE port 883. Accordingly, as seen in FIG. 8, user-configurable multiplexer options are provided for coupling control signals to OE port 883 from the shorter (faster) line sets 852, 854 and 858 as well as from longer line set 859.

Figure 9:
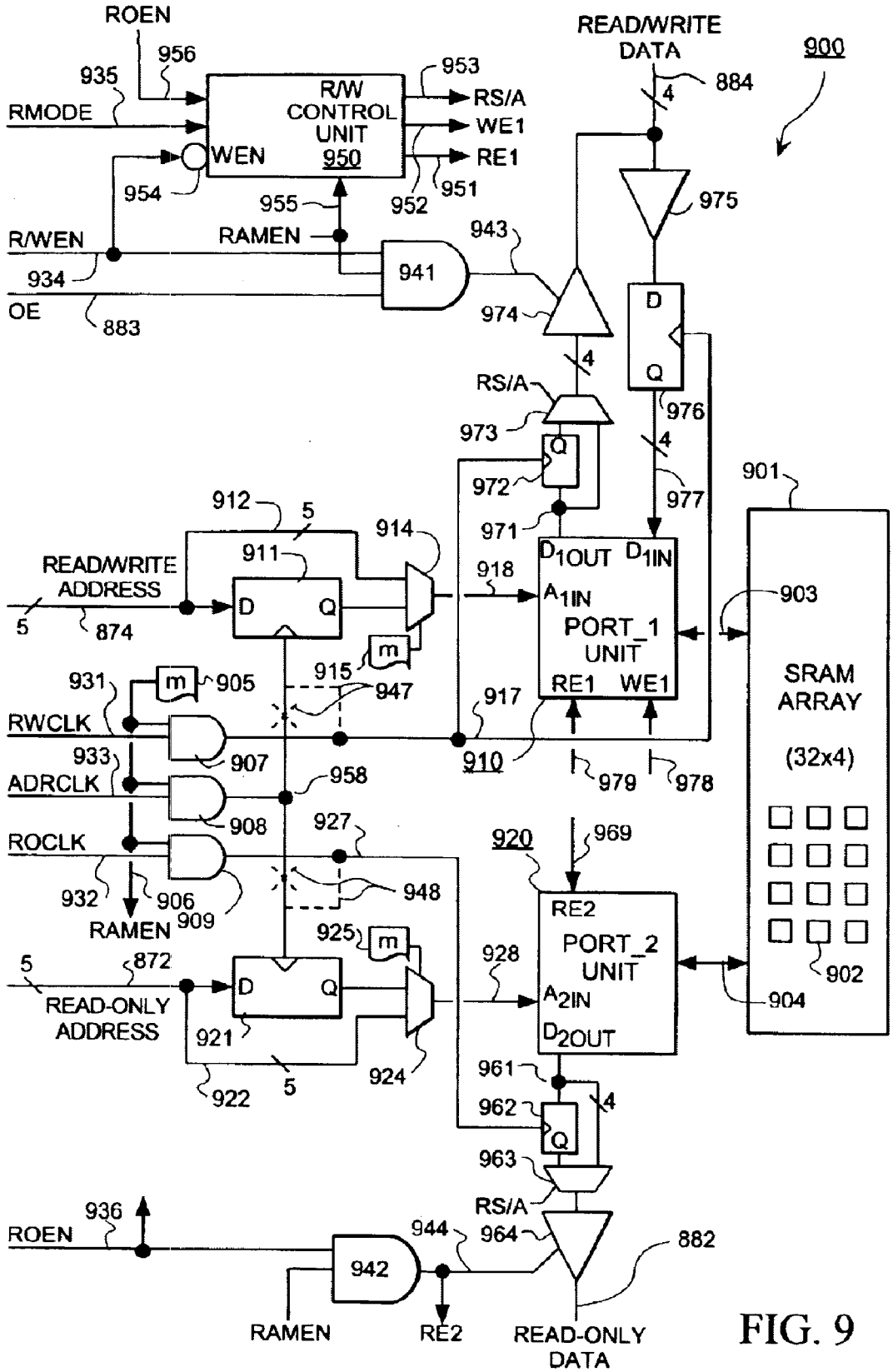
FIG. 9 is a further magnified illustration of one embodiment of FIG. 8, showing further details inside of a given SRAM block.

FIG. 9 shows a next level of details within an SRAM block such as 870 of FIG. 8. The internal structure of such an SRAM block is generally designated as 900 and includes a shared SRAM array 901. Repeated, dual-port memory cells are provided within array 901. Each such dual-port memory cell is referenced as 902.

In one embodiment of FPGA device 100 (FIG. 1), there are 128 dual-ported memory cells 902 within SRAM array 901. The data of these cells 902 may be simultaneously accessed by way of respective, bidirectional couplings 903 and 904. Couplings 903 and 904 carry both address and data signals for the correspondingly accessed cells.

A first configuration memory bit 905 of the FPGA device 100 is dedicated to a respective SRAM block 900 for allowing users to disable transition-sensitive inputs of block 900 in cases where block 900 is not being used. A logic '0' is stored in configuration memory bit 905 when block 900 is not used. A logic '1' signal in configuration memory bit 905 becomes an active RAM enabling signal 906 (RAMEN) that permits block 900 to be used.

A first port control unit 910 (Port_1 Unit) is provided for controlling operations of the read/write data port 884 and its corresponding address input port 874.

The supplied five-bit address signal 874 for Port_1 may be stored within a first address-holding register 911 of block 900 and/or it may be transmitted through bypass path 912 to a first data input of address multiplexer 914. A second data input of multiplexer 914 receives the Q output of the first address-storing register 911. Configuration memory bit 915 controls multiplexer 914 to select as the current address signal ($A_{1in}$) of Port_1, either the signal present at the first input (912) or at the second input (Q) of address-selecting multiplexer 914. The selected address signal 918 is then applied to the address input $A_{1in}$ of the Port_1 unit 910.

An address-strobing signal 958 may be applied to a clock input of address-storing register 911 for causing register 911 to latch onto the signal presented on line 874. The address-strobing signal 958 is produced by passing a rising edge of an address-validating clock signal (ADRCLK) through control-input terminal 933 and through an address-strobe enabling AND gate 908. The second input of AND gate 908 is connected to the RAMEN signal 906 so that the output of gate 908 is pulled low (to logic '0') when RAMEN is at logic '0'.

In addition to address-input port 918, the Port_1 unit 910 has a $D_{1out}$ port (971) from which data may be read out and a $D_{1in}$ port (977) into which data may be written Port_1 unit 910 further includes a write-enable terminal 978 (WE1) onto which a logic '1' signal must be placed in order to move write data from the $D_{1in}$ port 977 into SRAM array 901 by way of coupling 903. Unit 910 further has a read-enable terminal 979 (RE1) onto which a logic '1' signal must be placed in order to move read data from array 901 to the $D_{1out}$ port 971 by way of coupling 903.

The $D_{1out}$ port 971 is 4-bits wide and is coupled to the D input port of a 4-bit wide, read-register 972. The Q output of register 972 couples to one selectable input of a synch controlling multiplexer 973. The $D_{1out}$ port 971 additionally couples to a second 4-bit wide selectable input of multiplexer 973. An RS/A control signal (Read Synch or Asynch control) is applied to the selection control terminal of the synch controlling multiplexer 973 for selecting one of its inputs as a signal to be output to tri-state output driver 974. The RS/A signal comes from a control output 953 of an R/W control unit 950. Another output terminal 952 of the R/W control unit produces the WE1 signal which couples to terminal 978. Yet another output terminal 951 produces the RE1 signal which couples to terminal 979.

The output enabling terminal of tri-state driver 974 is coupled to output 943 of a Port_1 read-enabling AND gate 941. AND gate 941 includes three input terminals respectively coupled to receive the RAMEN signal 906, the OE signal from line 883, and an R/WEN signal as provided on line 934.

Line 934 (R/WEN) is one of the six lines that form control port 873 (FIG. 8). The other five lines are respectively 931 for receiving an RWCLK (read/write clock) signal, 932 for receiving the already-mentioned ADRCLK signal, 935 for receiving an RMODE signal, and 936 for receiving an ROEN (read-only enable) signal.

The RWCLK (read/write clock) signal on line 931 passes through AND gate 907 when RAMEN is true to provide access-enabling strobes on line 917 for Port_1. Line 917 couples to a rising-edge sensitive, clock input of the read register 972 of Port_1. Register 972 acquires the $D_{1out}$ signal at its D input for storage upon the rising edge of each pulse presented on line 917.

The Port_1 access-enabling line 917 also connects to a rising-edge sensitive, clock input of a write-data storing register 976. Register 976 receives four bits of write-data at its D input port from write buffer (high input impedance amplifier) 975. The input of buffer 975 connects to the 4-bit wide read/write data port 884. The output (Q) of register 976 couples to the 4-bit wide $D_{1in}$ input of the Port_1 unit 910.

It is seen, therefore, that acquisition of memory write data through port 884 occurs in synchronism with the RWCLK signal 931. For writing to occur, an active write-enable signal WEN must further be applied to terminal 954 of the read/write control unit 950. WEN 954 is the binary inverse of the R/WEN signal on control line 934. The combination of R/WEN control line 934 and OE control line 883 is provided so that the read/write port (Port_1) may have at least three separate states, namely, high-impedance output (Hi-Z), active bistable output (reading), and data inputting (writing).

In an alternate embodiment, the dashed, alternate connection and dashed line cut indicated by 947 is made and the responsiveness of registers 911 and 972 is modified such that one of these registers (e.g., 911) latches on the rising edge of passed-through RWCLK pulses and the other of these registers (e.g., 972) latches on the opposed falling edge of passed-through RWCLK pulses. The pulse width of the passed-through RWCLK pulses (917) would be adjusted in such an alternate embodiment to be at least equal to or greater than the address-strobe to read-valid latency of Port_1. Register 976 may latch on either edge of the passed-through RWCLK pulses (917). If write-register 976 is made to latch on the pulse edge opposite to that of read-register 972, write and read-back operations may be carried out in close time proximity to one another.

In yet another alternate embodiment, the dashed, alternate connection and dashed line cut indicated by 948 is made and the responsiveness of register 921 is modified such that register 921 latches on a predetermined one of the rising and falling edges of passed-through ROCLK pulses (927). If both of modifications 947 and 948 are made, then the ADRCLK control signal 933 and its associated hardware (e.g., 908 of FIG. 9) may be eliminated to thereby provide a more compact device.

In yet another alternate embodiment, line 933, gate 907 and line 958 are replicated so as to define two separate, RAMEN-enabled, address-validating strobes where one is dedicated to the address-storing register 911 and the other is dedicated to the address-storing register 921. Such an alternative embodiment is represented in next-described, FIG. 10 by a dashed line denoted as carrying an ADRCLK2 signal.

FIG. 10 provides a view of a combined, monolithic system 1000 in accordance with the invention which shows both a multi-ported SRAM array 1010 and logic circuitry, generally designated as 1020 for supplying address signals to SRAM array 1010.

More specifically, SRAM array 1010 includes a respective first access port (PORT#1) and a second access port (PORT#2) having respective address inputs 1013 and 1014. PORT#1 address signals may be received at the first address input 1013 either from a respective PORT#1 address-capturing register 1011 or by way of a programmably-activatable register-bypass path 1017. PORT#2 address signals may be received at the second address input 1014 either from a respective PORT#2 address-capturing register 1012 or by way of a programmably-activatable register-bypass path 1018.

In one embodiment, clock line 1015 supplies address-strobing signal ADRCLK1 to the clock inputs of both of registers 1011 and 1012. In an alternate embodiment, clock line 1015 supplies the address-strobing signal ADRCLK1 only to the clock input of first register 1011 while a separate clock line 1016 supplies an independent address-strobing signal ADRCLK2 to the clock input of second register 1012. In the latter embodiment, break 1016a is made. The former embodiment where break 1016a is not made and clock line 1015 services both of registers 1011 and 1012 is preferred for cases where it is desirable to minimize consumption of interconnect resources.

Tilted-ellipse symbol 1065 represents a user-programmable, selective coupling of line 1015 to one of the vertical lines of special vertical interconnect channel (SVIC) 1060. In one embodiment, SVIC 1060 corresponds to 860 of FIG. 8 and 1065 corresponds to a controls-acquisition coupling made by bus 873 to SVIC 860. If line 1016 is used, then dashed symbol 1066 similarly represents a user-programmable, selective coupling of line 1016 to one of the vertical lines of SVIC 1060. If line 1016 is not present and used, the internal PIP elements (not shown) of symbol 1066 are similarly not present and used.

SVIC 1060 can supply the ADRCLK1 address-strobing signal to selection element 1065 from a plurality of source points located along SVIC 1060. Tilted-ellipse symbol 1067 is representative of such user-identified and user-programmable, source points. In one embodiment, element 1067 corresponds to a controls-transfer coupling such as would be made in FIG. 8 within the Mem Ct1 Mux Control Area 877, wherein control signals are selectively transferred from a given HIC 850 to SVIC 860. Line 1057 is representative of a HIC line that transmits a respective ADRCLK0 signal to control-transfer coupling 1067. When picked up at control-acquisition coupling 1065 and transferred onto line 1015, the signal is renamed as ADRCLK1. When picked up at yet another control-acquisition coupling 1063 and transferred onto a corresponding HIC line of a general routing path identified as (H/V)IC 1001, the signal is renamed as ADRCLK3. The ADRCLK3 control-acquisition coupling 1062 can overlap with the ADRCLK0 control-transfer coupling 1067 or it can be located elsewhere along SVIC 1060. FPGA configuration by the user can create either scenario. In one variation, line 1057 is a global clock line (CLK0–CLK3) that extends throughout the FPGA array for selective acquisition by generally all CBB's and IOB's and which further extend into each SVIC 1060 (see 861 of FIG. 8) for selective acquisition by generally all SRAM blocks of that SVIC. Under this one variation, line 1057 effectively merges with lines 1015 and 1001 while control-transfer coupling 1067 effectively merges with 1065 and 1063.

The ADRCLK0 signal on HIC line 1057 originates from one or more ADRCLK sourcing circuits 1055. These ADRCLK sourcing circuits 1055 can be in the form of VGB's or IOB's and can link to HIC line 1057 either directly or by way of VGB-implemented, dynamic multiplexers (whose creation is described in at least one of the above-cited and incorporated, U.S. applications) and/or general interconnect. In the case where independent control-acquisition coupling 1066 is present with optional line 1016, control-transfer coupling 1067 may be seen as providing the respective ADRCLK source signals from a bus designated as 1057 instead of a single line 1057. In the same case, ADRCLK sourcing circuits 1055 would provide the one or more signals that eventually become ADRCLK1 and ADRCLK2.

Referring to the time versus signal amplitude plot at 1005 in FIG. 10, one or both of the rising edge 1006 and falling edge 1008 of a register-strobing pulse may be used to latch onto data presented at the D input of the register so that the same can be stored in the register and maintained at the Q output of the register until a next register-strobing event. The register may alternatively operate in a 'latch mode' where the Q output of the register can change while the clock pulse is at the high level 1007. The present disclosure contemplates the use of any combinations of these possibilities, including having registers that are either user-programmable or fixed to operate in one or more of the latch mode, the single-edge responsive mode (rising or falling) and the dual-edge responsive mode (where Q changes on each of rising and falling edges). For purpose of simplicity, each event that causes a register to store and maintain a given output state is referred to herein as a register-strobing event.

Accordingly, when one of ADRCLK sourcing circuits 1055 produces a register-strobing event, the event is presented in the ADRCLK0 signal HIC line 1057, transferred onto SVIC 1060 by way of control-transfer coupling 1067, and then further transferred by way of control-acquisition coupling 1065 onto line 1015 for presentation to a clock input of the first address-capturing register 1011 as the ADRCLK1 signal. In response, the first address-capturing register 1011 captures a respective ADR_SV1 signal that is presented on line 1019 to its D input. The ADR_SV1 signal is acquired from the SVIC 1060 by a respective control-acquisition coupling 1064.

Reference numeral 1062 points to two control-transfer couplings from which the ADR_SV1 signal may be derived. A first of these control-transfer couplings is situated for selectively acquiring (or not) an ADR_2×L signal from a HIC line identified as 1051 and transferring the ADR_2×L signal to a programmably-selectable one of lines in SVIC 1060. HIC line 1051 corresponds in one embodiment to a horizontal line found in one of the respective 2×L, 4×L, 8×L buses 852, 854 and 858 of FIG. 8. The HIC of line 1051 does not need to be immediately adjacent to SRAM array 1010. It can be any HIC that crosses operatively with SVIC 1060.

A second of control-transfer couplings 1062 is situated for selectively acquiring (or not) an ADR_MaxL signal from a HIC line identified as 1052 and transferring the ADR_MaxL signal to a programmably-selectable one of lines in SVIC 1060. HIC line 1052 corresponds in one embodiment to a horizontal line found in the MaxL bus 859 of FIG. 8. The HIC of line 1052 does not need to be immediately adjacent to SRAM array 1010 or the same as that of line 1051. It can be any HIC that crosses operatively with SVIC 1060. For purpose of convenient illustration however, both of lines 1051 and 1052 are shown as residing in a single HIC that is identified as 1050.

For a first example, it is assumed that the ADR_SV1 signal (1019) is derived from the ADR_2×L signal (1051). In its turn, the ADR_2×L signal (1051) is obtained from a Q output of a register 1022 within a CSE of logic circuitry 1020. The CSE register 1022 corresponds in one embodiment to 667 of FIG. 6B. CSE register 1022 has a clock input 1022a that is clocked by logic circuit portion 1021, where the latter portion 1021 typically includes a VGB common controls section such as 550 of FIG. 6A and a polarity-selecting multiplexer such as 603 of FIG. 6B. Logic circuit portion 1021 is responsive to the ADRCLK3 signal that is routed to it by (H/V)IC interconnect resources 1001. Logic circuit portion 1021 may be further responsive to one or more other input signals represented by input path 1021a such that the ADRCLK3 signal is blocked from evoking a register-strobing event on line 1022a until an enabling signal is supplied on input path 1021a. The logic circuit portion 1021 may include variable grain, configurable logic corresponding to one or more of the CBB's 510, 520, 530 and 540 of FIG. 6A. The input path 1021a may correspond to parts 664, 604 of FIG. 6B as well as common controls section 550 of FIG. 6A.

CSE register 1022 maintains its old Q output state until logic circuit portion 1021 provides a new register-strobing event to clock input 1022a. The Q output state of CSE register 1022 is passed by way of a CSEQ portion 1023 to CSE output line 1024 so as to define a current or OLD ADDR1 signal. In one embodiment, CSEQ portion 1023 corresponds to multiplexers 668, 620 and driver 630 of FIG.

6B. PIP 1025 is representative of any user-programmable routing means that may be used to couple the signal of line 1024 onto HIC line 1051. In one embodiment, PIP 1025 includes at least one of the programmable coupling elements 632, 633, 634 and 638 of FIG. 6B.

CSED portion 1026 of FIG. 10 presents a next or NEW ADDR1 signal (1027) to the D input of CSE register 1022. In one embodiment, CSED portion 1026 corresponds to multiplexer 640 of FIG. 6B. The NEW ADDR1 signal 1027 may be generated by configurable logic that feeds into CSED portion 1026 and may correspond for example to one inputs 675, 635 and 638 of FIG. 6B. By way of example, such a NEW ADDR1 feeding logic may comprise an address counter (not shown) that is implemented by a plurality of CBB's. In such a case, the carry-propagating logic section 570 of FIG. 6A may cooperate with its respective in-VGB Configurable Building Blocks 510–540 to produce each successive NEW ADDR1 signal. The NEW ADDR1 signal may be alternatively computed by other logic means such as for example that which utilizes the wide-gating logic section 560 of FIG. 6A. As yet another alternative, the NEW ADDR1 signal may be generated outside the FPGA array and may be brought into the FPGA array by way of one or more IOB's.

When logic circuit portion 1021 provides a new register-strobing event to clock input 1022a, the CSE register 1022 captures the NEW ADDR1 signal 1027 then presented to it and CSEQ 1023 forwards this newly stored signal 1027 onto CSE output line 1024. The new address signal then flows through routing means 1025, line 1051, the upper of control-transfer couplings 1062, the SVIC 1060 and control-acquisition coupling 1064 to define the ADR_SV1 signal (1019) at the D input of first address-capturing register 1011. When the ADR_SV1 signal (1019) stabilizes into a valid state at the D input of 1011, the ADRCLK1 signal (1015) may present a strobing-event to first address-capturing register 1011 for causing register 1011 to capture the stabilized ADR_SV1 signal (1019).

The flow of the ADRCLK1 signal (1015) follows the path already described above, namely, from one of the ADRCLK sourcing circuits 1055, to HIC line 1057, to control-transfer coupling 1067, through SVIC 1060, then through control-acquisition coupling 1065 to line 1015. The CSE register-strobing signal of line 1022a may follow an overlapping and similar path at the same time. More specifically, the address-strobing signal that travels on line 1057 for strobing first address-capturing register 1011 may also continue from control-transfer coupling 1067, and through SVIC 1060 to exit from control-transfer coupling 1063 onto the (H/V)IC interconnect resources as the ADRCLK3 signal. If or when further enabled by enabling signal 1021a (if such further enabling is needed), the so-produced ADRCLK3 signal can invoke logic circuit portion 1021 to strobe CSE register 1022 and thereby create a new (next) address signal on CSE output line 1024. The enabling signal 1021a, if used may be used to indicate when the NEW ADDR1 signal 1027 is valid.

The signal propagation delay from the ADRCLK0 line 1057 to the ADRCLK1 line 1015 should be at least approximately equal to and more preferably shorter than the signal propagation delay from the same ADRCLKO line 1057 to the clock input 1022a of CSE register 1022. This helps to assure that the first address-capturing register 1011 has safely captured and stored the old address signal previously presented on CSE output line 1024 before the new state change of CSE register 1022 propagates to the D input 1019 of the first address-capturing register and presents itself as a new ADR_SV1 signal.

Given that the first address-capturing register 1011 can safely capture and maintain the OLD ADDR1 value for subsequent processing by SRPM array 1010, the memory cell addressing operations and the responsive data fetching operations of SRAM array 1010 can overlap in time with the production by logic circuitry 1020 of a next or NEW ADDR1 signal (1027) and the forwarding of this NEW ADDR1 signal to the D input 1019 of the first address-capturing register 1011. System response time may be advantageously minimized by such temporal overlapping of operations. Moreover, the interconnect resources of the SVIC 1060 may be advantageously used to serve the double-duty of transferring a register-strobing event (ADRCLK0) simultaneously to the clock input 1015 of the first address-capturing register 1011 and to the clock input 1022a of the CSE register 1022. Such double-duty use of interconnect resources within the FPGA array helps to improve resource utilization efficiency and frees other parts of the finite interconnect resources within the FPGA array for other uses.

There is more than one way to transfer a new address signal into the first address-capturing register 1011. For purposes of a second example, it is assumed that the ADR_SV1 signal (1019) is instead derived from the ADRrMaxL signal (1052). The signal flow for this second example is from MaxL line 1052, through the lower of the control-transfer couplings 1062, then through control-acquisition coupling 1064 onto line 1019.

For its part, the ADR_MaxL signal (1052) is obtained from a tristate output of a line-mastering one of plural tristate drivers such as 1031 and 1032. MaxL tristate driver 1031 has an input terminal 1033, an output terminal coupled to HIC line 1052, and output enabling terminal 1035 for switching the state of the driver's output terminal between a high-impedance (Hi-z) state and an active state. Similarly, MaxL tristate driver 1032 has an input terminal 1034, an output terminal coupled to HIC line 1052, and output enabling (OE) terminal 1036 for switching the state of the driver's output terminal between a Hi-z state and an active state. The input and OE terminals, 1033 and 1035 of first MaxL driver 1031 are driven by a 'shared', tristate-drivers controlling block (3S_CTL) 1037. In one embodiment, the 3S_CTL block 1037 corresponds to shared block 580 of FIG. 6A. Controlling block 1037 can however take other forms such as ones where it is not shared by plural VGB's and/or plural CBB's.

A to-tristate signal 1041 may be fed from CSEQ 1023 to the 3S_CTL block 1037 for presentation onto input terminal 1033 of first MaxL driver 1031. The to-tristate signal 1041 may be one that is also stored in CSE register 1022 or not. In one embodiment, the line of signal 1041 corresponds to line 548 of FIGS. 6A and/or 6B. If OE terminal 1035 is set for the active output mode, the signal presented on input terminal 1033 will be output to MaxL line 1052. If OE terminal 1035 is instead reset for effecting Hi-z output mode, the signal presented on input terminal 1033 will not be output to MaxL line 1052 and another MaxL driver (e.g., 1032) may instead drive line 1052. The state of OE terminal 1035 may be controlled by dynamically-variable signal 1045. In one embodiment, the line of signal 1045 corresponds to line 558 (DYOE) of FIG. 6A.

The input and OE terminals, 1034 and 1036 of second MaxL driver 1032 are driven by a respective second 'shared', tristate-drivers controlling block (3S_CTL) 1038. In one embodiment, the second 3S_CTL block 1038 corresponds to shared block 580 (FIG. 6A) of an SVGB other than the SVGB that contains the first 3S_CTL block 1037. Second controlling block 1038 can however take other forms such as ones where it is not shared by plural VGB's and/or plural CBB's.

A second to-tristate signal 1042 may be fed from an appropriate source (e.g., a counterpart of CSEQ 1023) to the second 3S_CTL block 1038 for presentation onto input terminal 1034 of second MaxL driver 1032. The second to-tristate signal 1042 may be one that is also stored in a CSE register or not. If OE terminal 1036 is set for the active output mode, the signal (NEW_ADDR_M2) presented on input terminal 1034 will be output to MaxL line 1052. If OE terminal 1036 is instead reset for effecting Hi-z output mode, the signal presented on input terminal 1034 will not be output to MaxL line 1052 and another MaxL driver (e.g., 1031) may instead drive line 1052. The state of OE terminal 1036 may be controlled by dynamically-variable signal 1046. In one embodiment, the line of signal 1046 corresponds to a DyOE line (558) of an SVGB other than the SVGB that contains the first 3S_CTL block 1037.

Configurable logic block 1040 may be used to coordinate the switching of mastery over MaxL line 1052 as between tristate drivers 1031, 1032 and others if applicable. A change-over to a new address bit on MaxL line 1052 may be carried out by switching the mastery over MaxL line 1052 between tristate drivers such as 1031 and 1032. The full address word that is presented to first address input 1013 will of course be defined on a plurality of parallel lines, which lines can be comprised of one or both of MaxL lines and 2×L, 4×L, and/or 8×L lines. FIG. 5 for example illustrates how a nibble's-worth of data may be transferred from any side of block 580 to adjacent MaxL lines. As such, the change-over to a new address that is discussed here for tristate drivers 1031 and 1032 may apply in parallel to a bus wide group of such tristate drivers. Alternatively, if the bit on line 1052 represents a significant address bit, the changeover of such a single bit can have uses.

The ADRCLK3 signal may be used to coordinate switchover of mastery over MaxL line 1052 as follows. Instead of, or in addition to being routed to logic circuit portion 1021, the ADRCLK3 signal may be routed via (H/V)IC resources 1001 to terminal 1043 of configurable logic block 1040. Block 1040 (which block can be a CBB, or VGB or other variable grain component) will respond by cycling the mastery over MaxL line 1052 through tristate drivers 1031, 1032 and others if applicable. The changed state on line 1052 then propagates to define the ADR_SV1 signal (1019) as explained above. In other words, the signal on terminal 1043 may be used as an address-changing control signal that deactivates the output enabling terminal 1035 of tristate driver 1031 and thereby allows another tristate drive (e.g., 1032 or that of an IOB) to take over mastery of line 1052.

Alternatively, while first MaxL driver 1031 has mastery over MaxL line 1052, changes in the to-tristate signal 1041 may be propagated through elements 1037, 1031 and line 1052 to thereby define the ADR_SV1 signal (1019) as explained above. The change of state of the to-tristate signal 1041 may be made to occur in response to a change of state of the ADRCLK3 signal. In view of the above, it is seen that a variety of mechanisms can be made to respond to the ADRCLK0 and/or the ADRCLK3 signals or derivations thereof such that the first address-capturing register 1011 safely captures a first address value for presentation to first address input 1013 while at approximately the same time or shortly thereafter, a new second address value can begin to propagate towards the D input (1019) of the first address-capturing register.

The above descriptions for how a first address value is safely captured in address-capturing register 1011 while at approximately the same time or shortly thereafter, a new second address value can begin to propagate towards the D input of that address-capturing register can equally apply to the second or PORT#2 address-capturing register 1012 with the exception that the signal presented to the D input of the latter register 1012 is denoted in the illustration as ADR_SV2 and its control-acquisition coupling is denoted as 106C. In the embodiment wherein line 1015 services the clock inputs of both of registers 1011 and 1012, both address-capturing operations will of course occur in response to the ADRCLK1 signal. In the embodiment wherein line 1015 services the clock input of register 1011 while separate line 1016 and control-acquisition coupling 1066 services the clock input of register 1012, each respective address-capturing operation will of course occur in response to the respective ADRCLK1 or ADRCLK2 signal. Separate sources 1055 may then be used respectively for each of the ADRCLK1 and ADRCLK2 signals and separate versions of the ADRCLK3 and its associated circuits may also then be used respectively for each of the first and second address-capturing registers, 1011 and 1012.

On the data transfer side of SRAM array 1010, data-capturing registers such as the illustrated 10R1, 10R2 and 10R3 may be similarly used to synchronize the transfer of data from and/or to the SRAM array 1010 during respective read and write operations.

More specifically, during write operations to Port#1, data may pass through respective ones of user-programmable interconnect points 1075 to write buffer 10B1 from either horizontal MaxL lines such as the one designated as 10A2 in FIG. 10, and/or from further lines that are horizontal 2×L, 4×L, and/or 8×L lines and are represented by the one designated as 10A1 in FIG. 10. Actuation of read/write clock signal, RWCLK1 causes data-capturing register 10R1 to capture and store the data then presented to its D input. The captured data is then presented by the Q output of register 10R1 to the $D_{in}$ data-input section of Port#1 for writing into a correspondingly addressed part of the SRAM array 1010.

With the write data safely captured in data-capturing register 10R1, the logic circuitry 1070 which supplies the write data may begin to generate next write data even while SRAM array 1010 is busy receiving the data stored in data-capturing register 10R1. It should be apparent from FIG. 10 that the various parts of logic circuitry 1070 are referenced with numbers that are 50 greater than counterpart elements of circuitry 1020 and therefore a detailed repetition of their operations will not be repeated here. Configurable logic 1071 may be made responsive to the signal designated as RWCLK3 and which is transmitted by the configurable interconnect resources designated as (H/V)IC 1002. The RWCLK3 signal may originate as a RWCLK0 signal that is placed on HIC line 1058 and is sourced by one or more of RWCLK sourcing circuits 1054. Control-transfer coupling 1068 selectively transfers the RWCLK0 signal onto a line of SVIC 1060. Control-acquisition coupling 1061 selectively transfers the there-received version of the RWCLK0 signal to the clock input of data-capturing register 10R1. The there-received version is referenced as the RWCLK1 signal. Control-transfer coupling 106A selectively transfers the there-received version of the RWCLK0 signal to (H/V)IC resources 1002. The latter there-received version is referenced as the RWCLK3 signal. Due to inherent time delays, CSE register 1072 will not cause a new write-data signal to be output onto CSE output line 1074 until the previous write data signal is safely captured in data-capturing register 10R1. Similarly, configurable logic block 1090 will not cause a switching of mastery over Max line 10A2, if that mechanism is being used, until the previous write data signal is safely captured in data-capturing register 10R1.

Synchronization for the transfer of read data from SRAM array 1010 to other parts of the FPGA array may follow a similar scheme. The RE1 section of SRAM array 1010 corresponds to line 979 of FIG. 9. The RE2 section of SRAM array 1010 corresponds to line 969 of FIG. 9. The RWCLK1 signal strobes the read-data capturing register 10R2 first before a RWCLK3' signal enables RE1 to allow a next read operation by Port#1.

The RWCLK3' signal can be either the same as the RWCLK3 signal or a further delayed version thereof.

For the Port#2 side, the corresponding The ROCLK1 signal strobes the read-data capturing register 10R3 first before a ROCLK3' signal enables RE2 to allow a next read operation by Port#2. The ROCLK3' signal can be either the same as the ROCLK3 signal obtained by control-transfer coupling 106B or a further delayed version thereof.

The respective tristate output drivers, 10B2 and 10B3 of Port#1 and Port#2 should not be enabled until after the respective RWCLK1 and ROCLK1 signal strobes the respective read-data capturing register, 10R2 and 10R3, and the respective Q output of that register stabilizes into a valid state. As such, the respective RWCLK3" and ROCLK3" signals are accordingly timed to provide such a delayed action as they pass through optional logic sections 10D1, 10D2 into respective OE control sections 10E1, 10E2. The respective RWCLK3" and ROCLK3" signals may the same as the RWCLK3 and ROCLK3 signals or may be other derivatives of the RWCLK0 and ROCLK0 signals that originate from circuits 1054, 1053 and pass through control-transfer couplings 1068 and 1069 for distribution by SVIC 1060 to control-acquisition couplings such as 106A and 106B.

Although FIG. 10 shows various couplings for transferring address and data signals between CSE's (e.g., 1022, 1072) and SRAM array 1010, it should now be apparent that similar types of synchronizing arrangements may be made for transferring one or both of address and data signals between IOB's and the SRAM array 1010. More specifically, in FIG. 7B it was shown that clocked registers 720 and 750 are provided for sending data out of and into the FPGA array. In FIG. 7C it will shown that the count signals for registers 720 and 750 may be acquired from adjacent interconnect lines and that the output of register 750 and input of register 720 may be programmably coupled to further interconnect lines of the FPGA array. Accordingly, IOB registers 720 and 750 may be used in the essentially the same ways as the CSE registers 1022 and 1072 in FIG. 10 for synchronizing transfer of address and data between the SRAM array 1010 and the IOB's. Also, because the IOB's of FIG. 7B have tristate drivers such as 761 and 762, the latter tristate drivers may be used in the essentially the same ways as are drivers 1031, 1032, etc. in FIG. 10 for synchronizing transfer of address and data between the SRAM array 1010 and the IOB's.

Figure 11A:
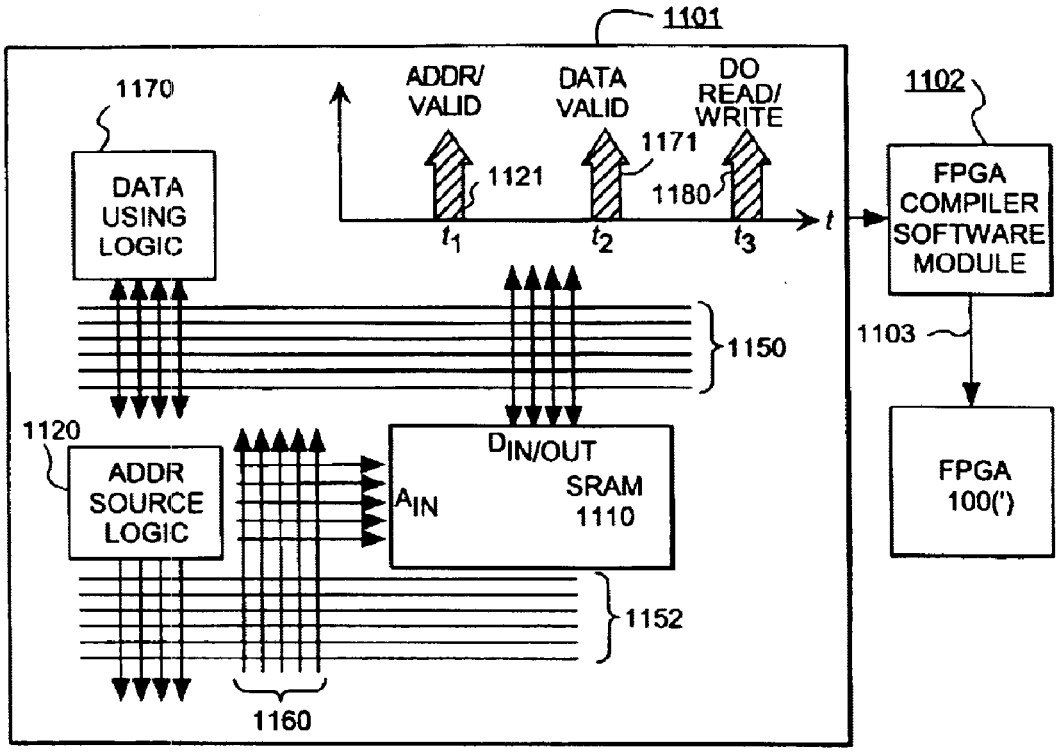
*FIG. 11A is a schematic diagram of an FPGA configuring process wherein a predefined design definition is supplied to an FPGA compiling software module; and*
Figure 11B:
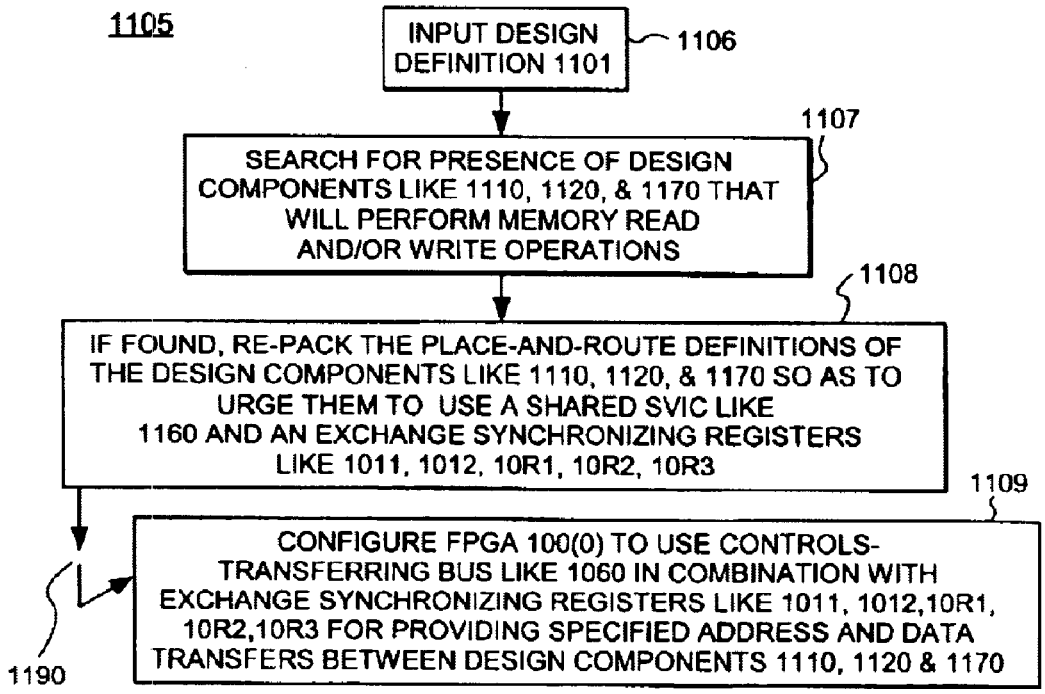
FIG. 11*B* is a flow chart of FPGA-configuration software that takes advantage of the ability to configurably route respective address-validating strobe signals and data-validating strobe signals in FPGA devices that conform to the present invention.

Referring in FIGS. 11A–11B, shown there are an FPGA configuring process and a flow chart of a software process for causing one or more of the operations of FIG. 10 to occur when a Variable Grain Architecture FPGA array of the invention is configured.

More specifically, FIG. 11A is a schematic diagram of an FPGA configuring process 1100 wherein a predefined design definition 1101 is supplied to an FPGA compiling software module 1102. Module 1102 processes the supplied information 1101 and produces an FPGA-configuring bitstream 1103. Bitstream 1103 is supplied to an FPGA such as 100 or 1000 of respective FIGS. 1 and 11 for accordingly configuring the FPGA.

The design definition 1101 may include a SRAM module 1110, an address-source module 1120 and a data-I/O module 1170.

Although it may appear from the drawing that modules 1110, 1120 and 1170 are pre-ordained to respectively correspond to elements 1010, 1020 and 1070 of FIG. 10, that is not inherently true. The design definition 1101 may be expressed in a variety of ways which do not pre-ordain such an outcome. Modern circuit designs typically start with a Very High-level Descriptor Language (VHDL) or the like for defining the behavior of a to-be-implemented design at a level that is significantly higher than a gate-level or transistor level description. High level design definitions are often entered by designers into computer-implemented program that are commonly referred to by names such as VHDL synthesis tools. The output of the VHDL synthesis tools may be in the form of one or more computer files that constitute VHDL descriptions of the to-be-implemented design. VHDL description files may include one or more different kinds of constructs including VHDL Boolean constructs that define part or all of the design. The complexity of the Boolean functions can span a spectrum having very simple ones (e.g., those having 1–3 input terms) at one end to very complex ones at the other end. The high level definitions generally do not specify implementational details. That job, if an FPGA is to be used for implementation, is left to the FPGA compiler software module 1102.

In the illustrated design definition 1101, there is a specification for the address-source module 1120 to supply a valid address signal to an address input section ($A_{in}$) of the SRAM module 1110 at some general first time point $t_1$. This presentation of a valid address is symbolically represented in FIG. 11A by presentation step symbol 1121.

Further in the illustrated design definition 1101, there is a specification for the data I/O module 1170 to supply or receive a valid data signal respectively to or from a data input/output ($D_{in/out}$) part of the SRAM module 1110 at some second general time point, $t_2$. This presentation of valid data is symbolically represented in FIG. 11A by data presentation step symbol 1171. The second time point, $t_2$ can be before, after or coincident with the first time point, $t_1$. FIG. 11A shows $t_2$ following $t_1$ merely for sake of example.

Yet further in the illustrated design definition 1101, there is a specification for a memory read or memory write operation to occur at some third general time point, $t_3$ based on the presentation of valid address and data signals in respective steps 1121 and 1171. This execution of a memory read or memory write operation is symbolically represented in FIG. 11A by execution step symbol 1180.

It should be apparent from the way the elements in area 1101 were drawn that, ultimately, the address-source module 1120 will present address signals onto HIC bus 1152 and that these will then be transferred onto SVIC bus 1160 for presentation to the address input section ($A_{in}$) of the SRAM module 1110 at a first time point corresponding to $t_1$. Also, when the design 1101 is ultimately implemented, the data I/O module 1170 will exchange data signals with the data input/output ($D_{in/out}$) part of the SRAM module 1110 by way of HIC bus 1150 at time points corresponding to $t_2$ and $t_3$. However the road to this ultimate goal is not embarked upon until the FPGA compiling software module 1102 inputs the design definition 1101 and processes it as will now be described.

FIG. 11B illustrates a flow chart 1105 of a process that attempts to realize the above-described efficiencies of FIG. 10. A design definition such as 1101 is input at step 1107 into the FPGA compiler software module 1102. Numerous processing steps may take place within software module 1102.

Step 1107 is one of those steps in which the software module 1102 searches through the input design definition (e.g., 1101) for the presence of design components like 1110, 1120 & 1170 that will perform memory read and/or write operations. The search criteria may optionally require the searched-for design components to operate in a nibble-wide or word-wide parallel mode so that they may share one synchronizing clock for plural address or data bits.

At step 1108, if two or more design components like 1110, 1120 & 1170 are found to satisfy the search criteria, the place-and-route definitions of those design components are repacked so as to urge those definitions toward ultimately ending up using an SRAM array like 1010 of FIG. 10 in combination with a controls-transferring bus like 1060 of FIG. 10 and in further combination with exchange synchronizing registers like 1011, 1012, 10R1, 10R2, 10R3 of FIG. 10.

It is understood by those skilled in the art of FPGA configuration that many design factors may pull the design components like 1110, 1120 & 1170 away from or into operative placement next to shared buses corresponding with HIC's 1150 and 1152, where HIC 1150 is operatively adjacent to the data input/output ($D_{in/out}$) part of the SRAM module 1110. Some overriding design considerations may push them apart from such an optimal arrangement. The urging factor produced in step 1108 may therefore be just one of numerous place and route weighting factors that pull one way or another to position the placed components in such cooperative alignment.

Dashed path 1190 represents many other processes within the software module 1102 wherein the original design definition 1101 is transformed by steps such as design-partitioning, partition-placements and inter-placement routings to create a configuration file for the target FPGA 100 or 1000. Step 1109 assumes that at least one set of design components like 1110, 1120 & 1170 were found and were ultimately partitioned and placed together with minimal-time routing resources such as 1150 and 1152 so as to allow for the optimized use of a controls-transferring bus like 1060 of FIG. 10 in further combination with one or more exchange synchronizing registers like 1011, 1012, 10R1, 10R2, 10R3 of FIG. 10. In that case, at step 1109 the target FPGA 100(0) is configured to use a controls-transferring bus like 1060 of FIG. 10 in further combination with one or more exchange synchronizing registers like 1011, 1012, 10R1, 10R2, 10R3 of FIG. 10 for providing the specified address and data transfers that take place between design components like 1110, 1120 & 1170.

The above disclosure is to be taken as illustrative of the invention, not as limiting its scope or spirit. Numerous modifications and variations will become apparent to those skilled in the art after studying the above disclosure.

By way of example, instead of having only two columns of embedded memory respectively designated for the TOP longline set and the 3RD longline set, it is also within the contemplation of the invention to provide four columns of embedded memory respectively designated for the TOP through 3RD longline sets. Different numbers of columns of embedded memory may also be provided.

Given the above disclosure of general concepts, principles and specific embodiments, the scope of protection sought is to be defined by the claims appended hereto.

What is claimed is:

1. A field programmable gate array (FPGA) device comprising:

(a) a first plurality, P1 of repeated logic units wherein:

(a.1) each said logic unit is user-configurable to acquire and process at least a second plurality, P2 of input logic bits and to responsively produce result data having at least a third plurality, P3 of output logic bits, (a.2) said logic units are distributed among a plurality of horizontal rows, with each row of the plurality of rows having a fourth plurality, P4 of said logic units;

(b) a fifth plurality, P5 of horizontal interconnect channels (HIC's) correspondingly distributed adjacent to said horizontal rows of logic units, wherein:

(b.1) each said horizontal interconnect channel (HIC) includes at least P3 interconnect lines, and (b.2) each said horizontal row of P4 logic units is configurably couplable to at least a corresponding one of the P5 HIC's at least for acquiring input logic its from the corresponding HIC and for outputting result data to the corresponding HIC;

(a.3) wherein each of said logic unit can internally process its respective second plurality of input logic bits without using said horizontal interconnect channels or other general interconnect for such internal processing: and (c) an embedded memory subsystem, wherein said embedded memory subsystem includes:

(c.1) a sixth plurality, P6 of independently-useable memory blocks, and wherein:

(c.1a) each said independently-useable memory block is embedded within one of said rows of logic units and is configurably couplable to the corresponding HIC of said row for transferring storage data by way of the corresponding HIC of that row of P4 logic units; and (c.1b) each of said memory blocks includes at least a first address-capturing register that is programmably couplable to at least one of said HIC's for receiving and capturing in synchronism with a supplied address-strobing signal, an address signal supplied on said at least one HIC;

(c.1c) each of said memory blocks includes at least a first data-capturing register for capturing said storage data in synchronism with a supplied first data-strobing signal; and (c.1d) each first address-capturing register is clockable by a first address-strobing signal that is independent of the first data-strobing signal.

2. A FPGA device according to claim 1 wherein:

(a.3) said logic units are further distributed among a plurality of vertical columns, with each column of the plurality of columns having a seventh plurality, P7 of said logic units; and (c.1b1) plural ones of said memory blocks are arranged to define one or more columns of embedded memory within said FPGA device with each such column having an eighth plurality, P8 of said memory blocks.

3. A field programmable gate array device according to claim 2 wherein:

(c.1c1) each said memory block is organized as a ninth plurality, P9 of addressable sets of storage data bits, where each addressable set of storage data bits includes at least P3 bits that are transferable by way of the corresponding HIC of its corresponding row of P4 logic units, said P3 plurality of bits corresponding to the P3 plurality of output logic bits producible by each said logic unit.

4. A field programmable gate array device according to claim 3 wherein:

(c. 1c2) each of P2 and P3 is an integer equal to or greater than 4.

5. A field programmable gate array device according to claim 1 wherein:

(a.3) groups of said logic units are further wedged together such that no HIC's pass between the wedged together logic units, and such that each group of logic units defines a logic superstructure; and (c.1c2) groups of said memory blocks are also wedged together such that no HIC's pass between the wedged together memory blocks, and such that each group of memory blocks defines a memory superstructure that is configurably-couplable to a corresponding logic superstructure.

6. A field programmable gate array device according to claim 1 wherein said embedded memory subsystem includes:

(c.2) at least one special interconnect channel for supplying address signals to the first address-capturing registers of a respective set of said memory blocks.

7. A field programmable gate array device according to claim 6 wherein:

(c.1b1) there are at least two of said columns of embedded memory; and (c.2a) there are at least two of said special interconnect channels, and each respective special interconnect channel is for supplying address signals to a respective one of the at least two columns of embedded memory.

8. A field programmable gate array device according to claim 6 wherein:

(c.1c3) each said memory block has at least first and second data ports each for outputting storage data;

(c.1d) each said memory block has at least first and second address ports each for receiving address signals identifying the storage data to be output by a corresponding one of the at least first and second data ports;

(c.1e) each said memory block has in addition to said respective first address-capturing register, a second address-capturing register that is programmably couplable to at least one of said HIC's for receiving and capturing an address signal supplied on said at least one HIC, and said first and second address-capturing registers respectively service the first and second address ports; and (c.2a) the at least one special interconnect channel includes first and second address-carrying components along which independent address signals may be respectively carried for application to respective ones of the first and second address ports of at least two memory blocks.

9. A field programmable gate array device according to claim 6 wherein:

(c.1d) each said memory block has a controls-receiving port for programmably acquiring from said at least one special interconnect channel, control signals that control operations of said memory block; and (c.1e) said first address-strobing signal is acquired by said controls-receiving port.

10. In a field programmable gate array device (FPGA) having a user-configurable interconnect network that includes a plurality of horizontal interconnect channels each with a diversified set of long-haul interconnect lines and shorter-haul interconnect lines, an embedded memory subsystem comprising:

(a) a plurality of multi-ported memory blocks each arranged adjacent to a horizontal interconnect channel (HIC) of the interconnect network;

wherein:

(a.1) each multi-ported memory block includes a first, independently-addressable data port and a second, independently-addressable data port;

(a.2) each of said first and second, independently-addressable data ports includes a respective address-capturing register that is connectable by user-configurable intercouplings to one or both of the long-haul interconnect lines and the shorter-haul interconnect lines for capturing a respective address signal in synchronism with a supplied, address-strobing signal; and (a.3) each of said first and second, independently-addressable data ports includes a respective, read data-capturing resister that is connectable by user-configurable intercouplings to at least the long-haul interconnect lines for capturing respective read data of the port independently of the address-strobing signal and for outputting the captured read data to the long-haul interconnect lines.

11. In an FPGA device having a plurality of variable grain, configurable logic blocks (VGB's) and VGB interconnect resources including lines of diversified continuous lengths for interconnecting said VGB's, an embedded memory subsystem comprising:

a special interconnect channel, programmably couplable to said VGB interconnect resources: and a plurality of memory blocks wherein each memory block includes:

(a) at least a first address-capturing register that is programmably couplable to said VGB interconnect resources by way of said special interconnect channel for receiving and capturing a respective first address signal supplied by way of said VGB interconnect resources and said special interconnect channel; and (a.1) address-strobing means for strobing the first address-capturing register by way of said VGB interconnect resources and said special interconnect channel, where said address-strobing can occur independently of data-capture strobing for corresponding data.

12. The embedded memory subsystem of claim 11 wherein each memory block further includes:

(b) a second address-capturing register that is programmably couplable to said interconnect resources for receiving and capturing a respective second address signal supplied by way of said VGB interconnect resources.

13. The embedded memory subsystem of claim 11 wherein:

(a.1) said first address-capturing register is further programmably couplable to said VGB interconnect resources by way the special interconnect channel for receiving a respective first address clock signal to which the first address-capturing register is responsive.

14. A method for use in an FPGA device having plural variable grain blocks (VGB's), configurable interconnect resources with continuous conductors of diversified lengths, and an embedded memory subsystem comprising a plurality of memory blocks situated for configurable coupling to the diversified interconnect resources, where the memory blocks each have at least one address input port and at least one data port, the address input port having a respective address-capturing register, said method comprising the steps of:

(a) outputting a first address signal for conveyance by at least part of said interconnect resources to a respective first address-capturing register of an address input port of a given memory block;

(b) outputting a first address-strobing signal for conveyance by at least part of said interconnect resources to the respective first address-capturing register to thereby capture the conveyed first address signal in the respective first address-capturing register of the given memory block; and (d) coupling the first address-strobing signal through delaying logic for thereby invoking a delay in outputting of a next address signal for conveyance by at least part of said interconnect resources to the respective first address-capturing register of the address input port of the given memory block, said invoked delay assuring that the first address signal is captured by the respective first address-capturing register before the outputting of said next address signal.

15. The method of claim 14 wherein at least one of said step (a) of outputting the first address signal and said step (d) of coupling the first address-strobing signal through delaying logic includes the substep of:

(a/d.1) transmitting the first address signal through a configurable sequential output element of a first of said VGB's.

16. The method of claim 15 wherein at least one of said step (a) of outputting the first address signal and said step (d) of coupling the first address-strobing signal through delaying logic includes the further substep of:

(a/d.2) sourcing the first address signal from a storage register within a configurable sequential element of said first of said VGB's.

17. The method of claim 16 wherein at least one of said step (a) of outputting the first address signal and said step (d) of coupling the first address-strobing signal through delaying logic includes the further substep of:

(a/d.3) applying an address-changing clock signal to the storage register that sources the first address signal, where said address-changing clock signal is derived from the first address-strobing signal.

18. The method of claim 14 wherein said step (a) of outputting the first address signal includes the substeps of:

(a.1) transmitting the first address signal through a first of plural tristate drivers, where each of the tristate drivers has an output enabling terminal;

(a.2) providing an address-changing control signal that deactivates the output enabling terminal of the first tristate driver, where said address-changing control signal is derived from the first address-strobing signal.

19. A method for configuring an FPGA device having plural variable grain blocks (VGB's), configurable interconnect resources, and an embedded memory subsystem comprising one or more memory blocks situated for configurable coupling via the configurable interconnect resources to the VGB's, where the memory blocks each have at least one registered address input port for receiving and storing supplied address bits, and where the memory blocks each further have at least one registered data output port for storing and outputting retrieved read-data, said method comprising the steps of:

(a) defining a first route through and interconnect resources from an address signal sourcing circuit of the FPGA device to the at least one registered address input port;

(b) defining a second route through said interconnect resources from an address clock sourcing circuit of the FPGA device to the at least one registered address input port;

(c) defining a third route through said interconnect resources from the address clock sourcing circuit to an address-changing circuit of the FPGA device, the third route being configured such that a new address signal can be produced by action of said address-changing circuit substantially at the same time or shortly after an address clock signal of the address clock sourcing circuit clocks the at least one registered address input port, said new address signal being produced so as to not interfere with a current address signal captured by the registered address input port; and (d) defining a fourth route through said interconnect resources from a read clock sourcing circuit of the FPGA device to the at least one registered data output port.

20. A method for producing configuration signals for configuring an FPGA device having plural variable grain blocks (VGB's) configurable interconnect resources, and an embedded memory subsystem comprising one or more memory blocks situated for configurable coupling via the configurable interconnect resources to the VGB's, where the memory blocks each have at least one registered address input port for receiving and storing supplied address bits in response to a supplied address-strobing signal, and where the memory blocks each have at least one registered data output port for storing and outputting retrieved read-data, the storing of the retrieved read-data being in response to a supplied data-strobing signal, said method comprising the steps of:

(a) inputting a design definition;

(b) searching the input design definition for the presence of one or more memory modules, address-sourcing modules, and data-using modules that will cooperate to perform a memory read or memory write operation; and (c) encouraging the creation in the configured FPGA of a shared signal route that transmits an address-strobing clock signal to the registered address input port and that transmits an address-change allowing signal to one or more of the address-sourcing modules and that transmits a data-strobing signal to one or more of the registered data output ports.

21. A field programmable gate array (FPGA) device comprising:

(a) a plurality of configurable logic blocks (CLB's);

(b) configurable CLB interconnect resources for configurably interconnecting said CLB's;

(c) a memory subsystem comprising:

(c.1) a plurality of independently-usable memory blocks each having:

(c.1a) a shared array of memory cells;

(c.1b) a first port unit coupled to the shared array and including a respective first data output port and a first address input port;

(c.1c) a second port unit coupled to the shared array and including a respective second data output port and a second address input port, wherein the first and second port units can simultaneously access the shared array of memory cells;

(c.1d) first and second address-capturing registers respectively coupled to the first and second address input ports, each address-capturing register having address and clock inputs and an address output;

(c.1e) first and second read-data capturing registers respectively coupled to the first and second data output ports, each data capturing register having data and clock inputs and a data output;

(c.2) a configurable, first special interconnect channel that is programmably couplable to said CLB interconnect resources, (c.2a) said first special interconnect channel extending adjacent to a respective first group of said memory blocks;

(c.2b) said first special interconnect channel being further programmably couplable to the respective clock inputs of the first and second address-capturing registers of said first group of memory blocks such that the respective clock inputs of the first and second address-capturing registers of one or more memory blocks in the first group can be respectively driven by at least a first address-strobing signal which is transmitted by way of the first special interconnect channel; and (c.2c) said first special interconnect channel being further programmably couplable to the respective clock inputs of the first and second read-data capturing registers of said first group of memory blocks such that the respective clock inputs of the first and second read-data capturing registers of one or more memory blocks in the first group can be respectively driven by independent first and second data-strobing signals which are transmitted by way of the first special interconnect channel.

22. The FPGA device of claim 21 wherein:

(c.2a1) said first special interconnect channel is programmably couplable to the respective clock inputs of the first and second address-capturing registers of said first group of memory blocks such that the clock input of the first address-capturing register of one or more memory blocks of the first group can be respectively driven by the first address-strobing signal and such that the clock input of the second address-capturing register of one or more memory blocks of the first group can be respectively driven by a second address-strobing signal which is independent of the first address-strobing signal and which is also transmitted by way of the first special interconnect channel.

23. The FPGA device of claim 21 wherein:

(c.2c) the configurable, first special interconnect channel is further programmably couplable to the respective address inputs of the first and second address-capturing registers of said first group of memory blocks such that the respective address inputs of the first and second address capturing registers of one or more memory blocks of the first group can be respectively driven by independent first and second address signals which are transmitted by way of the first special interconnect channel.

24. The FPGA device of claim 21 wherein:

(b.1) the configurable CLB interconnect resources include lines of diversified continuous lengths for configurably interconnecting said CLB's.

25. The FPGA device of claim 21 wherein:

(a.1) at least a plurality of said CLB's are constituted by variable grain blocks (VGB's) where each said VGB is comprised of at least four Configurable Building Blocks (CBB's) and each CBB can output to adjacent parts of the CLB interconnect resources at least one bit of processed result data, the processed result data bit being a configuration-defined function of at least three input term signals that are acquirable by the CBB from adjacent parts of the CLB interconnect resources.

26. The FPGA device of claim 25 wherein:

(a.1a) each said processed result data bit of a given CBB can be programmably defined to be a configuration-defined function of at least six input term signals that are acquirable by the CBB from adjacent parts of the CLB interconnect resources.

27. The FPGA device of claim 25 wherein:

(a.1a) each said processed result data bit of a given CBB can be programmably defined to be a configuration-defined function of at least sixteen input term signals that are obtainable from parts of the CLB interconnect resources that neighbor the given CLB.

28. The FPGA device of claim 25 wherein:

(a.1a) each said processed result data bit of a given CBB can be programmably defined to be a result of an addition or subtraction operation carried out at least partially within the given CBB.

29. The FPGA device of claim 25 wherein:

(b.1) said configurable CLB interconnect resources include continuous lines of diversified length including lines of a first continuous length extending adjacent to at least two VGB's and lines of a second continuous length extending adjacent to at least eight VGB's, the second continuous length being at least twice the first continuous length.

30. The FPGA device of claim 29 wherein:

(c.1c1) the second read-data capturing register of each memory block is programmably couplable to at least an adjacent one of the first continuous length lines.

31. The FPGA device of claim 30 wherein:

(c.1c2) the second port unit of each memory block is a read-only port unit.

32. The FPGA device of claim 27 wherein:

(a.1a) said VGB's are disposed to define vertical columns of VGB's and horizontal rows of VGB's; and (b.1) said configurable CLB interconnect resources include continuous lines of diversified length including lines of a first continuous length extending adjacent to at least two VGB's and lines of a second continuous length extending adjacent to a respective full row or a full column of VGB's, the second continuous length being at least ten times the first continuous length.

33. The FPGA device of claim 32 wherein:

(c.1c1) the first and second read-data capturing registers of each memory block are each programmably couplable to a respective at least one adjacent one of the second continuous length lines.

34. The FPGA device of claim 33 wherein:

(c.1c2) the second port unit of each memory block is a read-only port unit while the first port unit of each memory block is a read-write port unit.

35. The FPGA device of claim 21 wherein:

(c.1b1) said first port unit includes a respective first data input port for receiving write data for writing into said shared array of memory cells;

(c.1f) each given one of said memory blocks further includes a respective first write-data capturing register respectively coupled to the first data input port of the given memory block, each write-data capturing register having data and clock inputs and a data output;

(c.1f1) the respective clock input of each write-data capturing register in a given one of said memory blocks can be respectively driven by the corresponding first data-strobing signal of the given memory block.

36. The FPGA device of claim 21 wherein:

(c.2c) said first special interconnect channel includes a plurality of continuous conductors of respectively diversified lengths including maximum length conductors for broadcasting to the first group of memory blocks common address bits, and including shorter length conductors for conveying other address bits to respective subsets the first group of memory blocks.

37. The FPGA device of claim 21 wherein:

(c.2c) said first special interconnect channel includes a plurality of continuous conductors of respectively diversified lengths including maximum length conductors for broadcasting to the first group of memory blocks common control bits, and including shorter length conductors for conveying other control bits to respective subsets the first group of memory blocks.

38. The FPGA device of claim 37 wherein:

(c.2c1) said first special interconnect channel has global clock lines passing therethrough for broadcasting to the first group of memory blocks programmably acquirable global clock signals.

39. The FPGA device of claim 21 and further comprising:

(c.3) a configurable, second special interconnect channel that is programmably couplable to said CLB interconnect resources, (c.3a) said second special interconnect channel extending adjacent to a respective second group of said memory blocks;

(c.3b) said second special interconnect channel being further programmably couplable to the respective clock inputs of the first and second address-capturing registers of said second group of memory blocks such that the respective clock inputs of the first and second address-capturing registers of one or more memory blocks in the second group can be respectively driven by at least a second address-strobing signal which is transmitted by way of the second special interconnect channel; and (c.3c) said second special interconnect channel being further programmably couplable to the respective clock inputs of the first and second read-data capturing registers of said second group of memory blocks such that the respective clock inputs of the first and second read-data capturing registers of one or more memory blocks in the second group can be respectively driven by independent third and fourth data-strobing signals which are transmitted by way of the second special interconnect channel.

40. A method of configuring a field programmable gate array (FPGA) device where the FPGA device comprises:

(0.1) a plurality of configurable logic blocks (CLB's);

(0.2) configurable CLB interconnect resources for configurably interconnecting said CLB's;

(0.3) a memory subsystem comprising:

(0.31) a plurality of independently-usable memory blocks each having:

(0.31a) a shared array of memory cells;

(0.31b) a first port unit coupled to the shared array and including a respective first data output port and a first address input port;

(0.31c) a second port unit coupled to the shared array and including a respective second data output port and a second address input port;

(0.31d) at least one address-capturing registers respectively coupled to one of the first and second address input ports, the at least one address-capturing register having address and clock inputs and an address output;

(0.31e) at least one read-data capturing register respectively coupled to one of the first and second data output ports, the at least one data capturing register having data and clock inputs and a data output;

(0.32) a configurable, special interconnect channel that is programmably couplable to said CLB interconnect resources, (0.32a) said special interconnect channel extending adjacent to said memory blocks;

(0.32b) said special interconnect channel being further programmably couplable to the respective clock inputs of the at least one address-capturing registers of said memory blocks such that the respective clock inputs of the at least one address-capturing registers of one or more of the memory blocks can be respectively driven by at least a first address-strobing signal which is transmittable by way of the special interconnect channel; and (0.32c) said special interconnect channel being further programmably couplable to the respective clock inputs of the at least one read-data capturing registers of said memory blocks such that the respective clock inputs of the at least one read-data capturing registers of one or more of the memory blocks can be respectively driven by a data-strobing signals which is transmittable by way of the special interconnect channel;

said FPGA configuring method comprising:

(a) configuring the special interconnect channel to supply an address-strobing signal to the clock input of an address-capturing register of a given one of said memory blocks; and (b) configuring the special interconnect channel to supply a data-strobing signal to the clock input of a read-data capturing register of the given one of said memory blocks such that the supplied address-strobing and data-strobing signals can be independent of one another.

41. The FPGA configuring method of claim 40 and further comprising:

(c) configuring the special interconnect channel to supply an address signal to the data input of an address-capturing register of the given one of said memory blocks.

42. The FPGA configuring method of claim 41 and further comprising:

(c) configuring a given one of said CLB's to be responsive to the supplied address-strobing signal and to produce a next and later address signal for the given memory block after said supplied address-strobing signal causes the address-capturing register of the given memory block the capture the earlier-supplied address signal.

43. The FPGA configuring method of claim 41 and further comprising:

(d) configuring a given one of said CLB's to be responsive to the supplied address-strobing signal and to produce an output enabling signal that enables memory data to be output onto said CLB interconnect after the supplied data-strobing signal causes a read-data capturing register of the given one of said memory blocks to capture resource memory read data.

44. A field programmable gate array (FPGA) device comprising:

(a) a plurality of configurable logic blocks (CLB's);

(b) configurable CLB interconnect resources for configurably interconnecting said CLB's;

(c) a memory subsystem comprising:

(c.1) a plurality of independently-usable memory blocks each having:

(c.1a) a shared array of memory cells;

(c.1b) a first port unit coupled to the shared array and including a respective first data output port and a first address input port;

(c.1c) a second port unit coupled to the shared array and including a respective second data output port and a second address input port, wherein the first and second port units can access respectively addressed part of the shared array of memory cells;

(c.1d) first and second address-capturing registers respectively coupled to the first and second address input ports, each address-capturing register having address and clock inputs and an address output;

(c.1e) first and second read-data capturing registers respectively coupled to the first and second data output ports, each data capturing register having data and clock inputs and a data output;

(c.2) a configurable, first special interconnect channel that is programmably couplable to said CLB interconnect resources, (c.2a) said first special interconnect channel extending adjacent to a respective first group of said memory blocks;

(c.2b) said first special interconnect channel being further programmably couplable to the respective clock inputs of the first and second address-capturing registers of said first group of memory blocks such that the respective clock inputs of the first and second address-capturing registers of one or more memory blocks in the first group can be respectively driven by at least a first address-strobing signal which is transmitted by way of the first special interconnect channel; and (c.2c) said first special interconnect channel being further programmably couplable to the respective clock inputs of the first and second read-data capturing registers of said first group of memory blocks such that the respective clock inputs of the first and second read-data capturing registers of one or more memory blocks in the first group can be respectively driven by one or more data-strobing signals which are independent of the first address-strobing signal thereby allowing read-data-capture and address-capture operations by respective ones of the read-data capturing registers and address-capturing registers to occur at different times, and wherein said one or more data-strobing signals are transmitted by way of the first special interconnect channel.

45. The FPGA device of claim 44 wherein:

(c.2a1) said first special interconnect channel is programmably couplable to the respective clock inputs of the first and second address-capturing registers of said first group of memory blocks such that the clock input of the first address-capturing register of one or more memory blocks of the first group can be respectively driven by the first address-strobing signal and such that the clock input of the second address-capturing register of one or more memory blocks of the first group can be respectively driven by a second address-strobing signal which is independent of the first address-strobing signal and which is also transmitted by way of the first special interconnect channel.

46. The FPGA device of claim 44 wherein:

(c.2d) the configurable, first special interconnect channel is further programmably couplable to the respective address inputs of the first and second address-capturing registers of said first group of memory blocks such that the respective address inputs of the first and second address capturing registers of one or more memory blocks of the first group can be respectively driven by independent first and second address signals which are transmitted by way of the first special interconnect channel.

47. The FPGA device of claim 44 wherein:

(b.1) the configurable CLB interconnect resources include lines of diversified continuous lengths for configurably interconnecting said CLB's; and (c.2d) the configurable, first special interconnect channel is programmably couplable to at least two different length conductors of said CLB interconnect resources.

48. The FPGA device of claim 44 wherein:

(a.1) at least a plurality of said CLB's are constituted by variable grain blocks (VGB's) where each said VGB is comprised of at least four Configurable Building Blocks (CBB's) and each CBB can output to adjacent parts of the CLB interconnect resources at least one bit of processed result data, the processed result data bit being a configuration-defined function of at least three input term signals that are acquirable by the CBB from adjacent parts of the CLB interconnect resources.

49. The FPGA device of claim 48 wherein:

(a.1a) each said processed result data bit of a given CBB can be programmably defined to be a configuration-defined function of at least six input term signals that are acquirable by the CBB from adjacent parts of the CLB interconnect resources.

50. The FPGA device of claim 48 wherein:

(a.1a) each said processed result data bit of a given CBB can be programmably defined to be a configuration-defined function of at least sixteen input term signals that are obtainable from parts of the CLB interconnect resources that neighbor the given CLB.

51. The FPGA device of claim 48 wherein:

(a.1a) each said processed result data bit of a given CBB can be programmably defined to be a result of an addition or subtraction operation carried out at least partially within the given CBB.

52. The FPGA device of claim 48 wherein:

(b.1) said configurable CLB interconnect resources include continuous lines of diversified length including lines of a first continuous length extending adjacent to at least two VGB's and lines of a second continuous length extending adjacent to at least eight VGB's, the second continuous length being at least twice the first continuous length; and (c.2d) the configurable, first special interconnect channel is programmably couplable to at least two different length conductors of said CLB interconnect resources.

53. The FPGA device of claim 52 wherein:

(c.1c1) the second read-data capturing register of each memory block is programmably couplable to at least an adjacent one of the first continuous length lines.

54. The FPGA device of claim 44 wherein:

(c.1c1) the second port unit of each memory block is a read-only port unit.

55. The FPGA device of claim 48 wherein:

(a.1a) said VGB's are disposed to define vertical columns of VGB's and horizontal rows of VGB's; and (b.1) said configurable CLB interconnect resources include continuous lines of diversified length including lines of a first continuous length extending adjacent to at least two VGB's and lines of a second continuous length extending adjacent to a respective full row or a full column of VGB's, the second continuous length being at least ten times the first continuous length.

56. The FPGA device of claim 55 wherein:

(c.1c1) the first and second read-data capturing registers of each memory block are each programmably couplable to a respective at least one adjacent one of the second continuous length lines.

57. The FPGA device of claim 56 wherein:

(c.1c2) the second port unit of each memory block is a read-only port unit while the first port unit of each memory block is a read-write port unit.

58. The FPGA device of claim 44 wherein:

(c.1b1) said first port unit includes a respective first data input port for receiving write data for writing into a portion of said shared array of memory cells that is addressed by the first address input port;

(c.1f) each given one of said memory blocks further includes a respective first write-data capturing register respectively coupled to the first data input port of the given memory block, each write-data capturing register having data and clock inputs and a data output;

(c.1f1) the respective clock input of each write-data capturing register in a given one of said memory blocks can be respectively driven by the corresponding first data-strobing signal of the given memory block.

59. The FPGA device of claim 44 wherein:

(c.2d) said first special interconnect channel includes a plurality of continuous conductors of respectively diversified lengths including maximum length conductors for broadcasting to the first group of memory blocks common address bits, and including shorter length conductors for conveying other address bits to respective subsets the first group of memory blocks.

60. The FPGA device of claim 44 wherein:

(c.2d) said first special interconnect channel includes a plurality of continuous conductors of respectively diversified lengths including maximum length conductors for broadcasting to the first group of memory blocks common control bits, and including shorter length conductors for conveying other control bits to respective subsets the first group of memory blocks.

61. The FPGA device of claim 60 wherein:

(c.2d1) said first special interconnect channel has global clock lines passing therethrough for broadcasting to the first group of memory block programmably acquirable global clock signals, where the global clock signals are also programmably acquirable by said CLB's for synchronizing operations of the CLB's.

62. The FPGA device of claim 44 and further comprising:

(c.3) a configurable, second special interconnect channel that is programmably couplable to said CLB interconnect resources, (c.3a) said second special interconnect channel extending adjacent to a respective second group of said memory blocks;

(c.3b) said second special interconnect channel being further programmably couplable to the respective clock inputs of the first and second address-capturing registers of said second group of memory blocks such that the respective clock inputs of the first and second address-capturing registers of one or more memory blocks in the second group can be respectively driven by at least a second address-strobing signal which is transmitted by way of the second special interconnect channel; and (c.3c) said second special interconnect channel being further programmably couplable to the respective clock inputs of the first and second read-data capturing registers of said second group of memory blocks such that the respective clock inputs of the first and second read-data capturing registers of one or more memory blocks in the second group can be respectively driven by independent third and fourth data-strobing signals which are transmitted by way of the second special interconnect channel;

(c.3d) wherein said first and second special interconnect channels can programmably acquire same or different control signals from the CLB interconnect resources.

63. The FPGA device of claim 44 wherein:

(a.1) each of said plurality of CLB's is programmably couplable to the first special interconnect channel by way of at least one tristateable line drive such that different address signals can be injected in time multiplexed fashion from the CLB's to the first special interconnect channel by enabling outputs of different tristateable line drivers at different times; and (a.2) output enable terminals of said tristateable line drivers can be programmably made responsive to said at least first address-strobing signal such that injection of a new and replacing address signal into the first special interconnect channel can be blocked until a previous address signal has been captured by a corresponding one of the address-capturing registers in response to said at least first address-strobing signal.

64. The FPGA device of claim 44 wherein:

(c.1f) the data output ports of said first and second read-data capturing registers can respectively couple to the CLB interconnect resources by way of first and second tristateable line drivers, where each tristateable line driver has a respective output enable terminal;

(c.1g) the output enable terminals of said tristateable line drivers can be programmably made responsive to said one or more data-strobing signals such that injection of new and replacing data signals through the tristateable line drivers and into corresponding parts of the CLB interconnect resources can be blocked until said replacing data signals have been captured by corresponding ones of the data-capturing registers in response to said one or more data-strobing signals.

65. The FPGA device of claim 44 and further comprising:

(d) a plurality of programmably configurable input/output blocks (IOB's) coupled to the CLB interconnect resources and having configurable I/O storage means which can configured to operate in synchronism with at least the first address-strobing signal.

66. The FPGA device of claim 44 and further comprising:

(d) a plurality of programmably configurable input/output blocks (IOB's) coupled to the CLB interconnect resources and having configurable I/O storage means which can configured to operate in synchronism with said one or more data-strobing signals.

*67. A field programmable gate array (FPGA) device comprising:*

*a plurality of configurable logic blocks (CLBs);*

*a memory subsystem comprising a plurality of independently-usable memory blocks each having:*

*an array of memory cells;*

*a first address-capturing register coupled to a first address port of the array, the first address-capturing register having address and clock inputs and an address output;*

*a second address-capturing register coupled to a second address port of the array, the second address-capturing register having address and clock inputs and an address output;*

*a first read-data capturing register coupled to a first data port of the array, the first read-data capturing register having data and clock inputs and a data output; and*

*a second read-data capturing register coupled to a second data port of the array, the second read-data capturing register having data and clock inputs and a data output; and*

*interconnect resources configurable to interconnect the CLBs and the memory subsystem.*

*68. The FPGA device of claim 67, wherein the first address port and first data port comprise a first port unit and the second address port and second data port comprise a second port unit, and wherein the first and second port units are operable to simultaneously access the array of memory cells.*

*69. The FPGA device of claim 67, wherein the interconnect resources include a first special interconnect channel programmable to interconnect the CLBs and the memory subsystem.*

*70. A method of configuring an FPGA device comprising:*

*providing a memory subsystem comprising a plurality of independently-usable memory blocks each having an address-capturing register and a read-data capturing register;*

*configuring interconnect resources to supply an address-strobing signal to the address-capturing register of a memory block; and*

*configuring interconnect resources to supply a data-strobing signal to the read-data capturing register of the memory block,*

*wherein the address-strobing and data-strobing signals can be supplied independent of one another.*

*71. A field programmable gate array (FPGA) device comprising:*

*a plurality of configurable logic blocks (CLBs);*

*a memory subsystem comprising a plurality of independently-usable memory blocks each having:*

*an array of memory cells;*

*a first address-capturing register coupled to a first address port of the array, the first address-capturing register having address and clock inputs and an address output; and*

*a read-data capturing register coupled to a first data port of the array, the first read-data capturing register having data and clock inputs and a data output; and*

*interconnect resources configurable to interconnect the CLBs and the memory subsystem and configurable to supply an address-strobing signal to the address-capturing register and a data-strobing signal to the read-data capturing register, wherein the address-strobing and data-strobing signals can be supplied independent of one another.*

* * * * *